US008798875B2

(12) United States Patent
Yanagisawa et al.

(10) Patent No.: US 8,798,875 B2
(45) Date of Patent: Aug. 5, 2014

(54) WORKING MACHINE

(75) Inventors: Makoto Yanagisawa, Yokosuka (JP); Hideaki Kanbayashi, Yokosuka (JP)

(73) Assignees: Sumitomo Heavy Industries, Ltd., Tokyo (JP); Sumitomo (S.H.I.) Construction Machinery Co., Ltd., Tokyo (JP)

( * ) Notice: Subject to any disclaimer, the term of this patent is extended or adjusted under 35 U.S.C. 154(b) by 163 days.

(21) Appl. No.: 12/937,051

(22) PCT Filed: Apr. 10, 2009

(86) PCT No.: PCT/JP2009/057334
§ 371 (c)(1),
(2), (4) Date: Dec. 28, 2010

(87) PCT Pub. No.: WO2009/125833
PCT Pub. Date: Oct. 15, 2009

(65) Prior Publication Data
US 2011/0093150 A1 Apr. 21, 2011

(30) Foreign Application Priority Data

Apr. 11, 2008 (JP) .................................. 2008-103950
Feb. 10, 2009 (JP) .................................. 2009-028612

(51) Int. Cl.
*G06F 7/70* (2006.01)
*B60L 9/00* (2006.01)
*E02F 3/04* (2006.01)

(52) U.S. Cl.
USPC .................................. 701/50; 701/22; 37/411

(58) Field of Classification Search
USPC .......................... 180/53.8; 701/22, 50; 37/411
See application file for complete search history.

(56) References Cited

U.S. PATENT DOCUMENTS 5,974,796 A * 11/1999 Ishikawa et al. ................. 60/399
6,048,289 A * 4/2000 Hattori et al. .................... 477/15
(Continued)

FOREIGN PATENT DOCUMENTS

| JP | H8-182112 A | 7/1996 |
|---|---|---|
| JP | 10-224902 A | 8/1998 |

(Continued)

OTHER PUBLICATIONS

International Search Report application no. PCT/JP2009/057334 dated Jul. 14, 2009.

(Continued)

*Primary Examiner* — Calvin Cheung
*Assistant Examiner* — Basil T Jos
(74) *Attorney, Agent, or Firm* — Squire Patton Boggs (US) LLP

(57) ABSTRACT

A working machine includes: a first electric motor used for work; a second electric motor used for applications other than work; a first inverter circuit connected to the first electric motor; a second inverter circuit connected to the second electric motor; a battery connected to the first and second inverter circuits; and a control unit that drives the first and second inverter circuits. The control unit has a discharge mode to discharge electric power stored in the battery, and discharges the battery by stopping the first inverter circuit while driving the second inverter circuit in order to make the second electric motor perform electric operation in the discharge mode. Accordingly, since the state of charge is reduced, the life of a capacitor can be increased.

20 Claims, 30 Drawing Sheets

(56) References Cited

U.S. PATENT DOCUMENTS

| | | | |
|---|---|---|---|
| 6,380,640 B1 * | 4/2002 | Kanamori et al. | 290/40 C |
| 2002/0125052 A1 * | 9/2002 | Naruse et al. | 180/53.8 |
| 2005/0103007 A1 * | 5/2005 | Yoshino | 60/414 |
| 2005/0237771 A1 * | 10/2005 | Franck et al. | 363/84 |
| 2005/0246082 A1 * | 11/2005 | Miki et al. | 701/50 |
| 2007/0007939 A1 * | 1/2007 | Miller et al. | 323/299 |
| 2007/0080006 A1 * | 4/2007 | Yamaguchi | 180/65.3 |
| 2008/0068870 A1 * | 3/2008 | Eguchi et al. | 363/37 |
| 2010/0014338 A1 * | 1/2010 | Jacobson et al. | 363/141 |

FOREIGN PATENT DOCUMENTS

| | | |
|---|---|---|
| JP | 11-081384 A | 3/1999 |
| JP | 2001-003397 A | 1/2001 |
| JP | 2001-011899 A | 1/2001 |
| JP | 2001-043902 A | 2/2001 |
| JP | 2005-155251 A | 6/2005 |
| JP | 2005-207383 A | 8/2005 |
| JP | 2005-218285 A | 8/2005 |
| JP | 2005-307483 A | 11/2005 |
| JP | 2006-273517 A | 10/2006 |
| JP | 2007056857 A * | 3/2007 |
| WO | 2008/111649 A1 | 9/2008 |

OTHER PUBLICATIONS

International Preliminary Report on Patentability application No. PCT/JP2009/057334 dated Nov. 30, 2010.

Japanese Office Action dated Jun. 18, 2013.

* cited by examiner

WORKING MACHINE

TECHNICAL FIELD

The present invention relates to a working machine.

BACKGROUND ART

In the related art, a working machine with a motor generator for assisting an engine includes a storage battery, such as a capacitor, for supplying electric power to the motor generator and charging regenerative power. Since such a capacitor is used in an environment where charging and discharging are repeatedly performed, various studies for increasing the life of the capacitor are in progress.

For example, taking into consideration that a capacitor deteriorates if the voltage value of the capacitor is increased too much, it is proposed that a discharge setting value is set for the voltage value of the capacitor and discharging is performed to lower the voltage value of the capacitor to the discharge setting value or lower if the charge voltage of the capacitor exceeds the discharge setting value when the working machine stops working, so that the life of the capacitor can be increased. Discharged electric power is stored in an auxiliary battery (for example, see Patent Document 1).

CITATION LIST

[PTL 1] Japanese Unexamined Patent Publication No. 2005-218285

SUMMARY OF INVENTION

Technical Problem

Generally, if a high state of charge continues, deterioration of the battery accelerates.

It is an object of the present invention to provide a working machine in which the life of a battery is increased by reducing the state of charge.

Solution to Problem

A working machine related to the present invention includes: a first electric motor used for work; a second electric motor used for applications other than work; a first inverter circuit connected to the first electric motor; a second inverter circuit connected to the second electric motor; a battery connected to the first and second inverter circuits; and a control unit that drives the first and second inverter circuits. The control unit has a discharge mode to discharge electric power stored in the battery, and discharges the battery by stopping the first inverter circuit while driving the second inverter circuit in order to make the second electric motor perform electric operation in the discharge mode.

Preferably, the first electric motor is an electric motor for operation driven by an operation of an operator. One end of the first inverter circuit is connected to a terminal of the electric motor for operation. The battery is connected to the other end of the first inverter circuit through a DC voltage converter. A coolant circulation system, which is provided to cool the first inverter circuit and the DC voltage converter and which includes a pump to circulate coolant and an electric motor to cool as the second electric motor that drives the pump, is further provided. The second inverter circuit is connected between the electric motor to cool and the DC voltage converter. The control unit drives the first and second inverter circuits and the DC voltage converter. The control unit discharges the battery by stopping the first inverter circuit while driving the second inverter circuit in order to make the electric motor to cool consume electric power in the discharge mode.

Preferably, the DC voltage converter has a step-up and step-down type switching control system including switching elements for step-up and step-down and a diode connected in parallel to each of the switching elements. The control unit does not drive the switching elements in the discharge mode.

Preferably, an internal combustion engine, a motor generator which is connected to the internal combustion engine and which generates electric power with the driving force of the internal combustion engine and assists the driving force of the internal combustion engine with its own driving force, and a third inverter circuit connected between the motor generator and the DC voltage converter are further provided. The control unit stops the third inverter circuit in the discharge mode.

The coolant circulation system may further cool the electric motor for operation.

Preferably, the second electric motor is a motor generator to assist an engine. The battery performs supplying of electric power to the motor generator or charging of regenerative power. The second inverter circuit performs driving control of the motor generator. The control unit includes a driving level determining section that determines a driving level of the engine or the operating element. The second inverter circuit performs electric operation of the motor generator when the driving level determining section determines that the driving level of the engine or the operating element is equal to or lower than a predetermined level.

The second inverter circuit may perform electric driving of the motor generator so that a state of charge of the battery is maintained at a predetermined level or higher.

The driving level determining section may be configured to determine the driving level of the engine on the basis of an operating state of the operating element, determine the driving level of the engine according to the number of revolutions of the engine, determine the driving level of the operating element according to the amount of operation input to an operating device of the operating element, determine the driving level of the engine or the operating element according to an operating state of a gate lock lever to prohibit a driver from leaving a driver's seat, or determine the driving level of the engine or the operating element according to an operation position of an ignition switch.

Preferably, a plurality of operating elements including a motor generator to assist an engine and a capacitor, which performs supplying of electric power to the motor generator or charging of regenerative power, is driven by an electromotive force or a hydraulic force. A driving control section, which performs driving control of the motor generator, and a driving level determining section, which determines a driving level of the engine or the operating element, are provided. The driving control section performs electric operation of the motor generator when the driving level determining section determines that the driving level of the engine or the operating element is equal to or lower than a predetermined level.

Preferably, the driving control section may perform electric driving of the motor generator using electric power stored in the capacitor.

The driving control section may perform electric driving of the motor generator so that a state of charge of the capacitor is maintained at a predetermined level or higher.

The driving level determining section is configured to determine the driving level of the engine on the basis of an operating state of the operating element, and the driving control section may perform electric operation of the motor generator when the driving level determining section determines that the driving level of the engine is equal to or lower than a predetermined level on the basis of the operating state of the operating element.

The driving level determining section is configured to determine the driving level of the engine according to the number of revolutions of the engine, and the driving control section may perform electric operation of the motor generator when the driving level determining section determines that the driving level of the engine is equal to or lower than a predetermined level on the basis of the number of revolutions of the engine.

The driving level determining section is configured to determine the driving level of the operating element according to the amount of operation input to an operating device of the operating element, and the driving control section may perform electric operation of the motor generator when the driving level determining section determines that the driving level of the operating element is equal to or lower than a predetermined level on the basis of the amount of operation input to the operating device of the operating element.

The driving level determining section is configured to determine the driving level of the engine or the operating element according to an operating state of a gate lock lever to prohibit a driver from leaving a driver's seat, and the driving control section may perform electric operation of the motor generator when the driving level determining section determines that the driving level of the engine or the operating element is equal to or lower than a predetermined level on the basis of the operating state of the gate lock lever.

The driving level determining section is configured to determine the driving level of the engine or the operating element according to an operation position of an ignition switch, and the driving control section may perform electric operation of the motor generator when the driving level determining section determines that the driving level of the engine or the operating element is equal to or lower than a predetermined level on the basis of the operation position of the ignition switch.

Advantageous Effects of Invention

According to those described above, a unique effect is obtained that a working machine, in which the life of a capacitor is increased by reducing the state of charge, can be provided.

BRIEF DESCRIPTION OF DRAWINGS

FIG. 9A is a perspective view and FIG. 9B is a side view showing a console located at the left side of the driver's seat;

DESCRIPTION OF EMBODIMENTS

It is desirable to provide a working machine in which the life of a battery is increased by reducing the state of charge.

First Example

Figure 1:
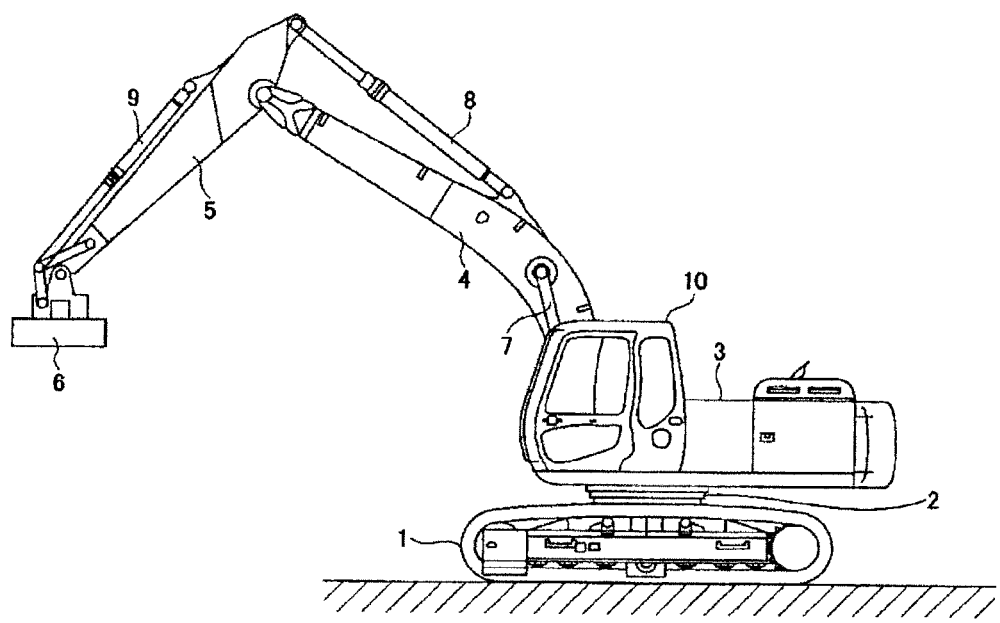
FIG. 1 is a side view showing a hybrid type construction machine of one example.

FIG. 1 is a side view showing a hybrid type construction machine of a first example.

On a base carrier 1 of the hybrid type construction machine, an upper revolving body 3 is mounted with a revolving mechanism 2. In addition, a boom 4, an arm 5, a lifting magnet 6, a boom cylinder 7 for hydraulic driving of these components, an arm cylinder 8, and a bucket cylinder 9, a cabin 10, and a power source are mounted in the upper revolving body 3.

[Overall Configuration]

Figure 2:
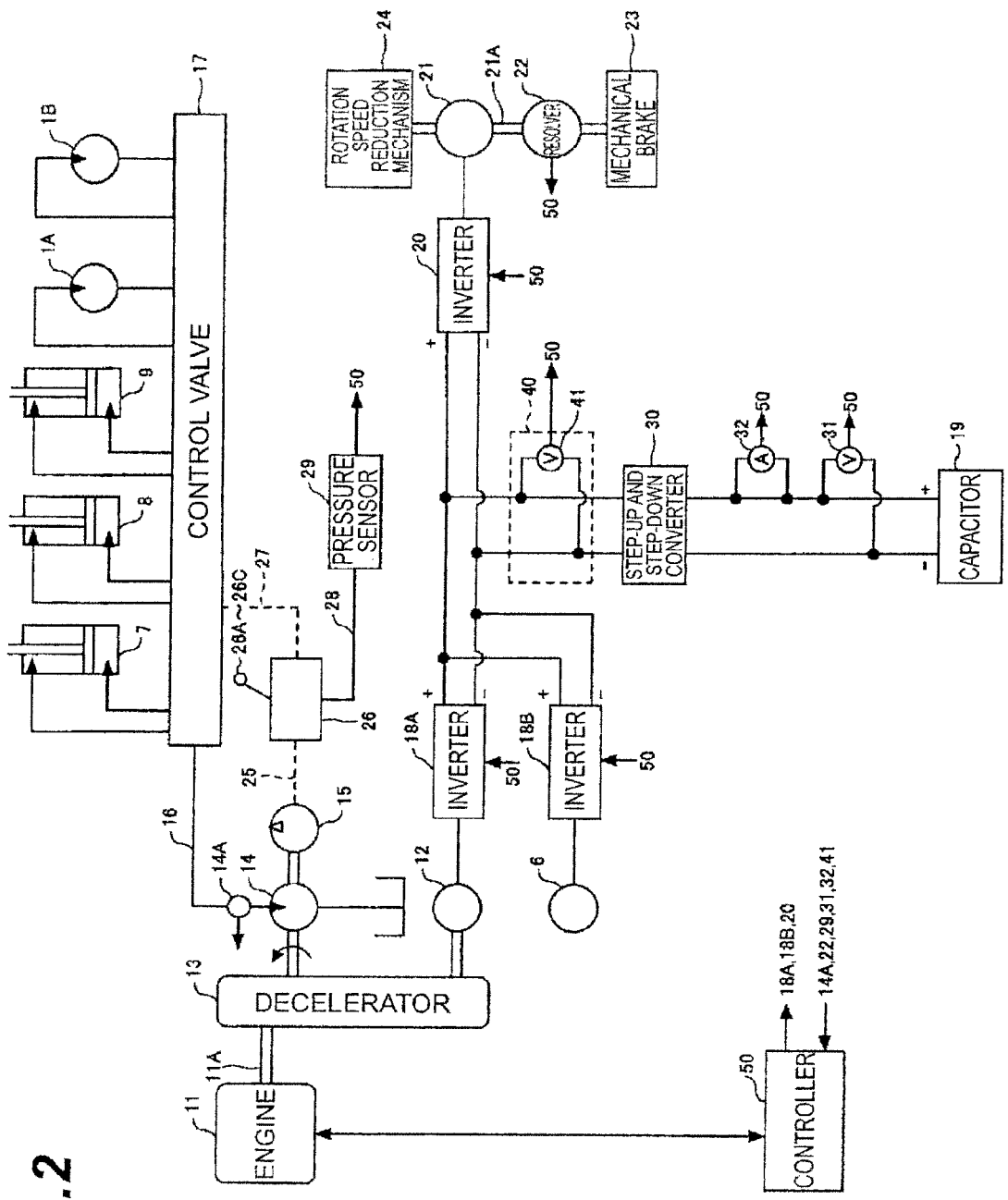
FIG. 2 is a block diagram showing the configuration of the hybrid type construction machine of the example.

FIG. 2 is a block diagram showing the configuration of a hybrid type construction machine of the first example. In FIG. 2, a mechanical power system, a high-pressure hydraulic line, a pilot line, and an electric driving and control system are indicated by a double line, a solid line, a broken line, and a one-dot chain line, respectively.

Both an engine 11 as a mechanical driving section and a motor generator 12 (second electric motor) as an assistant driving section are connected to an input shaft of a decelerator 13 as a force multiplying mechanism. In addition, a main pump 14 and a pilot pump 15 are connected to an output shaft of the decelerator 13. A control valve 17 is connected to the main pump 14 through a high-pressure hydraulic line 16.

The control valve 17 is a control device which controls the hydraulic system in the construction machine of the first example. Hydraulic motors 1A (for right) and 1B (for left) for the base carrier 1, the boom cylinder 7, the arm cylinder 8, and the bucket cylinder 9 are connected to the control valve 17 through high-pressure hydraulic lines.

In addition, a capacitor, that is, a capacitor 19 as a battery is connected to the motor generator 12 through an inverter 18A as a second inverter circuit (driving control section) and a step-up and step-down converter 30. The inverter 18A and the step-up and step-down converter 30 are connected to each other through a DC bus 40.

Moreover, a lifting magnet 6 is connected to the DC bus 40 through an inverter 18B, and an electric motor 21 (first electric motor) for rotation is connected to the DC bus 40 through an inverter 20 as a first inverter circuit. The DC bus 40 is provided for transmission of electric power between the capacitor 19, the motor generator 12, and the electric motor 21 for rotation.

A DC bus voltage detecting section 41 for detecting the voltage value (hereinafter, referred to as a DC bus voltage value) of the DC bus 40 is provided in the DC bus 40. The detected DC bus voltage value is input to a controller 50 as a control unit.

A capacitor voltage detecting section 31 for detecting the capacitor voltage value and a capacitor current detecting section 32 for detecting the capacitor current value are provided in the capacitor 19. The capacitor voltage value detected by the capacitor voltage detecting section 31 is input to the controller 50. In addition, the capacitor current value detected by the capacitor current detecting section 32 is input to the controller 50.

A resolver 22, a mechanical brake 23, and a rotation speed reduction mechanism 24 are connected to a rotary shaft 21A of the electric motor 21 for rotation. In addition, an operating device 26 is connected to the pilot pump 15 through a pilot line 25.

The operating device 26 is an operating device for operating the electric motor 21 for rotation, the base carrier 1, the boom 4, the arm 5, and the bucket 6, and includes levers 26A and 26B and a pedal 26C. The lever 26A is a lever for operating the electric motor 21 for rotation and the arm 5, and is provided near the driver's seat of the upper revolving body 3. The lever 26B is a lever for operating the boom 4 and the bucket 6, and is provided near the driver's seat. In addition, the pedal 26C is a pair of pedals for operating the base carrier 1, and is provided below the feet in the driver's seat.

The operating device 26 converts the oil pressure (oil pressure on the primary side), which is supplied through the pilot line 25, into the oil pressure (oil pressure on the secondary side) according to the amount of operation of a driver and outputs it. The oil pressure on the secondary side output from the operating device 26 is supplied to the control valve 17 through a hydraulic line 27 and is also detected by a pressure sensor 29.

If each of the levers 26A and 26B and the pedal 26C is operated, the control valve 17 is driven through the hydraulic line 27. Then, since the oil pressure in the hydraulic motors 1A and 1B, the boom cylinder 7, the arm cylinder 8, and the bucket cylinder 9 is controlled, the base carrier 1, the boom 4, the arm 5, and the bucket 6 are driven.

In addition, the controller 50 which performs driving control of an electric system of the construction machine of the first example is connected to the pressure sensor 29.

Such a construction machine of the first example is a hybrid type construction machine which has the engine 11, the motor generator 12, and the electric motor 21 for rotation as power sources. These power sources are mounted in the upper revolving body 3 shown in FIG. 1. Hereinafter, each section will be described.

[Configuration of Each Section]

The engine 11 is an internal combustion engine formed by a diesel engine, for example, and the output shaft is connected to one input shaft of the decelerator 13. The engine 11 works all the time during the operation of the construction machine.

Preferably, the motor generator 12 is an electric motor both electric (assistant) operation and power generation operation of which are possible. Here, a motor generator which is AC-driven by the inverter 20 is shown as the motor generator 12. For example, the motor generator 12 may be formed by an IPM (Interior Permanent Magnetic) motor in which a magnet is embedded in a rotor. The rotary shaft of the motor generator 12 is connected to the other input shaft of the decelerator 13.

The decelerator 13 has two input shafts and one output shaft. A driving shaft of the engine 11 and a driving shaft of the motor generator 12 are connected to each of the two input shafts. In addition, a driving shaft of the main pump 14 is connected to the output shaft. When the load of the engine 11 is large, the motor generator 12 performs electric (assistant) operation so that the driving force of the motor generator 12 is transmitted to the main pump 14 through the output shaft of the decelerator 13. Then, driving of the engine 11 is assisted. On the other hand, when the load of the engine 11 is small, the driving force of the engine 11 is transmitted to the motor generator 12 through the decelerator 13. Accordingly, the motor generator 12 performs power generation by the power generation operation. Switching between electric (assistant) operation and power generation operation of the motor generator 12 is performed according to the load of the engine 11 or the like by the controller 50.

The main pump 14 is a pump which generates oil pressure for supplying to the control valve 17. This oil pressure is supplied to drive each of the hydraulic motors 1A and 1B, the boom cylinder 7, the arm cylinder 8, and the bucket cylinder 9 through the control valve 17. In addition, a sensor 14A which detects the amount of discharge and pressure of the pressure oil is provided in the main pump 14. A signal indicating the amount of discharge and pressure of the pressure oil which have been detected is input to the controller 50.

The pilot pump 15 is a pump which generates pilot pressure required for a hydraulic operation system. In addition, the configuration of the hydraulic operation system will be described later.

The control valve 17 is a hydraulic control device which controls hydraulic driving of the hydraulic motors 1A and 1B, the boom cylinder 7, the arm cylinder 8, and the bucket cylinder 9 for the base carrier 1, which are connected through a high-pressure hydraulic line, by controlling the oil pressure supplied to each of them according to the operation input of a driver.

The inverter 18A is provided between the motor generator 12 and the step-up and step-down converter 30 as described above, and performs operation control of the motor generator 12 according to a command from the controller 50. Accordingly, when the inverter 18A makes the motor generator 12 perform electric operation, required electric power is supplied from the capacitor 19 and the step-up and step-down converter 30 to the motor generator 12 through the DC bus 40. In addition, when the inverter 18A makes the motor generator 12 perform power generation operation, electric power generated by the motor generator 12 is charged to the capacitor 19 through the DC bus 40 and the step-up and step-down converter 30.

Similarly, the inverter 18B is provided between the lifting magnet 6 and the step-up and step-down converter 30, and supplies the electric power requested to the lifting magnet 6 from the DC bus 40 according to a command from the controller 50 when turning on an electromagnet. In addition, when turning off the electromagnet, the inverter 18B supplies the regenerated electric power to the DC bus 40.

The lifting magnet 6 includes an electromagnet, which generates a magnetic force for adsorbing a metal material magnetically, and receives electric power from the DC bus 40 through the inverter 18B.

The capacitor 19 is connected to the inverters 18A, 18B, and 20 through the step-up and step-down converter 30. The capacitor 19 is a power source which supplies electric power required for electric (assistant) operation or power operation when at least one of the electric (assistant) operation of the motor generator 12 and the power operation of the electric motor 21 for rotation is performed and which stores the electric power generated by power generation operation or regenerative operation as electrical energy when at least one of the power generation operation of the motor generator 12 and the regenerative operation of the electric motor 21 for rotation is performed. The capacitor 19 is formed by a group of condensers.

Charging and discharging control of the capacitor 19 is performed by the step-up and step-down converter 30 on the basis of the charge state of the capacitor 19, the operation state (electric (assistant) operation or power generation operation) of the motor generator 12, the driving state of the lifting magnet 6, and the operation state (power operation or regenerative operation) of the electric motor 21 for rotation. A switching control between a step-up operation and a step-down operation of the step-up and step-down convertor 30 is performed by the controller 50 on the basis of the capacitor voltage value detected by the capacitor voltage detecting section 31, the capacitor current value detected by the capacitor current detecting section 32, and DC bus voltage value detected by the DC bus voltage detecting section 41.

The inverter 20 is provided between the electric motor 21 for rotation and the step-up and step-down converter 30 as described above and performs operation control of the electric motor 21 for rotation according to a command from the controller 50. Accordingly, when the inverter controls the power operation of the electric motor 21 for rotation, required electric power is supplied from the capacitor 19 to the electric motor 21 for rotation through the step-up and step-down converter 30. In addition, when the electric motor 21 for rotation performs regenerative operation, electric power generated by the electric motor 21 for rotation is charged to the capacitor 19 through the step-up and step-down converter 30. Although the example in FIG. 2 shows that electric motor for rotation (one set) and an inverter (one set), other magnet mechanisms or driving sections other than a rotating mechanism section may be provided so that a plurality of electric motors and a plurality of inverters are connected to the DC bus 40.

One side of the step-up and step-down converter 30 is connected to the motor generator 12, the lifting magnet 6, and the electric motor 21 for rotation through the DC bus 40, and the other side of the step-up and step-down converter 30 is connected to the capacitor 19. The step-up and step-down converter 30 performs control for switching of step-up operation and step-down operation so that the DC bus voltage value falls within a fixed range. When the motor generator 12 performs an electric (assistant) operation, it is necessary to supply electric power to the motor generator 12 through the inverter 18A. Accordingly, it is necessary to increase the DC bus voltage value. Moreover, also when driving the lifting magnet 6, it is necessary to supply electric power to the lifting magnet 6 through the inverter 18B. Accordingly, the DC bus voltage value is increased according to the electric power supplied to the lifting magnet 6.

On the other hand, when the motor generator 12 performs power generation operation, it is necessary to charge generated electric power to the capacitor 19 through the inverter 18A. Accordingly, it is necessary to lower the DC bus voltage value. In addition, when electric cower regenerated when turning off an electromagnet of the lifting magnet 6 is supplied to the DC bus 40, this electric power is charged to the capacitor 19. Accordingly, the step-up and step-down converter 30 increases the DC bus voltage value.

Such a switching of step-up operation and step-down operation is also the same for the power generation and the regenerative operation of the electric motor 21 for rotation.

At the time of actual operation of a hybrid type working machine, the operation state of the motor generator 12 is changed according to the load condition of the engine 11 and the operation state of the electric motor 21 for rotation is changed according to the rotational operation of the upper revolving body 3. Accordingly, a situation may occur in which one of the motor generator 12 and the electric motor 21 for rotation performs electric (assistant) operation or power operation and the other one performs power generation operation or regenerative operation. In addition to this, the electromagnet of the lifting magnet 6 is turned on/off according to the working conditions.

For this reason, the step-up and step-down converter 30 performs switching between a step-up operation and a step-down operation according to the operation state (driving state) of the motor generator 12, the power generator 30, and the lifting magnet 6 such that the voltage value of the DC bus 40 falls within a fixed range.

The capacitor voltage detecting section 31 is a voltage detecting section detecting the voltage value of the capacitor 19 and is used to detect the charge state of a battery. The detected capacitor voltage value is input to the controller 50 and is used to perform switching control of a step-up operation and a step-down operation of the step-up and step-down converter 30.

The capacitor current detecting section 32 is a current detecting section for detecting the current value of the capacitor 19. The capacitor current value is detected with a current, which flows from the capacitor 19 to the step-up and step-down converter 30, as a positive value. The detected capacitor current value is input to the controller 50 and is used to perform switching control of a step-up operation and a step-down operation of the step-up and step-down converter 30.

The DC bus 40 is provided between the three inverters 18A, 18B, and 20 and the step-up and step-down converter, and is configured such that transmission of electric power between the capacitor 19, the motor generator 12, the lifting magnet 6, and the electric motor 21 for rotation is possible.

The DC bus voltage detecting section 41 is a voltage detecting section for detecting the DC bus voltage value. The detected DC bus voltage value is input to the controller 50 and is used to perform switching control of a step-up operation and a step-down operation for making the DC bus voltage value fall within a fixed range.

The electric motor 21 for rotation can be an electric motor both power operation and regenerative operation of which are possible, and is provided to drive the rotary mechanism 2 of the upper revolving body 3. At the time of power operation, torque of the rotational driving force of the electric motor 21 for rotation is amplified by the speed reduction mechanism 24, and the upper revolving body 3 performs rotational operation by acceleration and deceleration control. Moreover, due to inertial rotation of the upper revolving body 3, the number of revolutions is increased in the speed reduction mechanism 24 and it is transmitted to the electric motor 21 for rotation. This can generate the regenerative power. Here, an electric motor which is AC-driven by the inverter 20 using a PWM (Pulse Width Modulation) control signal is shown as the electric motor 21 for rotation. For example, the electric motor 21 for rotation may be formed using a magnet embedded type IPM motor. In this case, since the larger induced electromotive force can be generated, electric power generated by the electric motor 21 for rotation at the time of regeneration can be increased.

The resolver 22 is a sensor which detects the rotation position and the rotation angle of the rotary shaft 21A of the electric motor 21 for rotation, and is configured to detect the rotation angle and the rotation direction of the rotary shaft 21A by detecting a difference between the rotation position of the rotary shaft 21A before rotation of the electric motor 21 for rotation and the rotation position after left rotation or right rotation by mechanical connection with the electric motor 21 for rotation. By detecting the rotation angle of the rotary shaft 21A of the electric motor 21 for rotation, the rotation angle and the rotation direction of the rotary mechanism 2 are derived. Moreover, although a form in which the resolver 22 is fixed is shown in FIG. 2, it is also possible to adopt an inverter control method in which a rotary sensor of an electric motor is not used.

The mechanical brake 23 is a braking device which generates a mechanical braking force and stops the rotary shaft 21A of the electric motor 21 for rotation mechanically. Switching between braking and the release of braking of the mechanical brake 23 is performed by an electromagnetic switch. This switching is performed by the controller 50.

The rotation speed reduction mechanism 24 is a decelerator which reduces the rotation speed of the rotary shaft 21A of the electric motor 21 for rotation and mechanically transmits it to the rotary mechanism 2. Accordingly, at the time of power operation, torque of the electric motor 21 for rotation is increased so that larger torque can be transmitted to a revolving body. In contrast, at the time of regenerative operation, the number of revolutions occurring in the revolving body is increased so that a greater number of rotational operations are generated in the electric motor 21 for rotation.

The rotary mechanism 2 can rotate in a state where the mechanical brake 23 of the electric motor 21 for rotation is released, so that the upper revolving body 3 rotates in the left or right direction.

The operating device 26 is an operating device for operating the electric motor 21 for rotation, the base carrier 1, the boom 4, the arm 5, and the lifting magnet 6, and is operated by a driver of the hybrid type construction machine.

The operating device 26 converts the oil pressure (oil pressure on the primary side), which is supplied through the pilot line 25, into the oil pressure (oil pressure on the secondary side) according to the amount of operation of a driver and outputs it. The oil pressure on the secondary side output from the operating device 26 is supplied to the control valve 17 through the hydraulic line 27 and is also detected by a pressure sensor 29.

If the operating device 26 is operated, the control valve 17 is driven through the hydraulic line 27. Then, since the oil pressure in the hydraulic motors 1A and 1B, the boom cylinder 7, the arm cylinder 8, and the bucket cylinder 9 is controlled, the base carrier 1, the boom 4, the arm 5, and the lifting magnet 6 are driven.

In addition, the hydraulic line 27 supplies the oil pressure, which is required for driving of the hydraulic motors 1A and 1B, the boom cylinder 7, the arm cylinder 8, and the bucket cylinder 9, to the control valve.

When an operation for rotating the rotary mechanism 2 is input to the operating device 26, the pressure sensor 29 as a section which detects an operation for rotation detects the amount of operation as a change in the oil pressure in a hydraulic line 28. The pressure sensor 29 outputs an electrical signal indicating the oil pressure in the hydraulic line 26. Thus, the amount of operation for rotating the rotary mechanism 2 which is input to the rotary mechanism 2 can be precisely checked. The electrical signal is input to the controller 5C and is used for driving control of the electric motor 21 for rotation. Moreover, although a form in which a pressure sensor as a lever handling detecting section is described in the first example, it is also possible to use a sensor which reads the amount of operation for rotating the rotary mechanism 2, which is input to the operating device 26, as an electrical signal as it is.

The controller 50 is a control device which performs driving control of the hybrid type construction machine of the first example and is formed by an arithmetic processing unit including a CPU and an internal memory. The controller 50 is a device realized when the CPU executes a program for driving control stored in the internal memory.

A controller 50 is a control device for performing operation control of the engine 11, operation control (switching of electric (assistant) operation and power generation operation)

of the motor generator 12, charging and discharging control of the capacitor 19 which is realized by performing driving control of the step-up and step-down converter 30, and driving control of the electric motor 21 for rotation. In addition, the driving control of the electric motor 21 for rotation is executed by converting a signal input from the pressure sensor 29 (signal indicating the amount of operation for rotating the rotary mechanism 2 which is input to the operating device 26) into a speed command by means of the controller 50 and performing driving control of the electric motor 21 for rotation using the speed command. In the present example, the controller 50 as a control unit includes a driving level determining section.

The controller 50 performs switching control between a step-up operation and a step-down operation of the step-up and step-down converter 30 on the basis of the charge state of the capacitor 19, the operation state (electric (assistant) operation or power generation operation) of the motor generator 12, and the operation state (power operation or regenerative operation) of the electric motor 21 for rotation, thereby performing charging and discharging control of the capacitor 19.

A switching control between a step-up operation and a step-down operation of the step-up and step-down converter 30 is performed on the basis of the capacitor voltage value detected by the capacitor voltage detecting section 31, the capacitor current value detected by the capacitor current detecting section 32, and DC bus voltage value detected by the DC bus voltage detecting section 41.

In addition, the operation control of the engine 11 includes not only control of the amount of fuel injection according to the load condition of the engine 11 but also control of start and end of the engine 11.

Moreover, in the first example, the controller 50 monitors the oil pressure of pressure oil detected by the sensor 14A, the control command value transmitted to the inverter 18B, and the control command value transmitted to the inverter 20.

Here, an increase in the oil pressure of pressure oil detected by the sensor 14A means that any of the work elements of a hydraulic system (hereinafter, the traveling motors 1A and 1B, the boom cylinder 7, the arm cylinder 8, and the bucket cylinder 9 are collectively called a "work element of a hydraulic system") connected to the control valve 17 has been driven. Accordingly, it is possible to detect the driving of a work element of a hydraulic system by monitoring the increase in the oil pressure.

Moreover, driving of the lifting magnet 6 can be detected by monitoring the control command value transmitted to the inverter 18B. Similarly, power operation of the electric motor 21 for rotation can be detected by monitoring the control command value transmitted to the inverter 20.

In addition, the controller 50 holds the threshold values for monitoring the oil pressure of pressure oil detected by the sensor 14A, the control command value transmitted to the inverter 18B, and the control command value transmitted to the inverter 20. When each value becomes equal to or greater than the corresponding threshold value, the controller 50 detects driving of an operating element of the hydraulic system, driving of the lifting magnet 6, and power operation of the electric motor 21 for rotation.

[Setting of the State of Charge (SOC)]

In the hybrid type construction machine of the first example, the state of charge (SOC) of the capacitor 19 immediately after the start of operation (before operation) is set to 70%. In addition, when any of the operating elements of the hydraulic system, the lifting magnet 6, and the electric motor 21 for rotation needs to be driven, the state of charge (SOC) increases to 85%. Then, when none of the operating elements of the hydraulic system, the lifting magnet 6, and the electric motor 21 for rotation is driven, the state of charge (SOC) is reduced to 70%.

This is because it is not necessary to store a large amount of electric power in the capacitor 19 until any of the operating element of the hydraulic system, the lifting magnet 6, and the electric motor 21 for rotation is driven after the start of operation or when none of the operating elements of the hydraulic system, the lifting magnet 6, and the electric motor 21 for rotation is driven and accordingly, the amount of heat generation is reduced by setting the state of charge (SOC) relatively low (to 70%) by discharging electric energy of the capacitor 19, as a discharge mode, so that the life of the capacitor 19 can be increased.

In addition, since it is necessary to supply electric power from the capacitor 19 in order to drive any of them, it is necessary to increase the state of charge (SOC) to some extent by absorbing electrical energy. Accordingly, since the state of charge (SOC) is increased to 85%. In addition, since driving of an operating element of a hydraulic system is performed by oil pressure, electrical energy is not needed directly. However, when driving an operating element of the hydraulic system, pressure oil from the main pump 14 is needed. Accordingly, since driving of the motor generator 12 for assisting the engine 11 may be needed, the controller 50 increases the state of charge (SOC) when driving of the operating element of the hydraulic system is detected.

Here, the reason why the state of charge (SOC) is set to 70% when reducing the state of charge (SOC) is that a certain amount of electric power is immediately needed when driving at least one of the operating element of the hydraulic system, the lifting magnet 6, and the electric motor 21 for rotation. In this case, the state of charge (SOC) is set low and the responsiveness which does not cause a problem in the work is secured. That is, the minimum state of charge is set in advance on the basis of starting responsiveness of a driving section.

In addition, the reason why the state of charge (SOC) is set to 85% when increasing the state of charge (SOC) is that electric power obtained by regenerative operation needs to be charged to the capacitor 19 when driving at least either the lifting magnet 6 or the electric motor 21 for rotation. In this case, the state of charge (SOC) is set relatively high and sufficient room (free space) for charge is secured. That is, the maximum state of charge is set in advance on the basis of regenerative power of a driving section.

In addition, a reduction of the state of charge (SOC) from 85% (or more) to 70% is realized when the controller 50 transmits a driving command to the inverter 18A so that the motor generator 12 performs electric (assistant) operation and electric power stored in the capacitor 19 is consumed.

Since the engine 11 works all the time to drive the main pump 14, the operating efficiency of the engine 11 can be further improved by converting electrical energy in the capacitor 19 into mechanical energy by electric (assistant) operation of the motor generator 12.

In addition, an increase or decrease in the state of charge (SOC) is performed when the controller 50 drives the step-up and step-down converter 30. When the DC bus voltage value is low at the time of step-down (charge of the capacitor 19), the motor generator 12 is made to perform power generation operation in order to increase the DC bus voltage.

Figure 3:
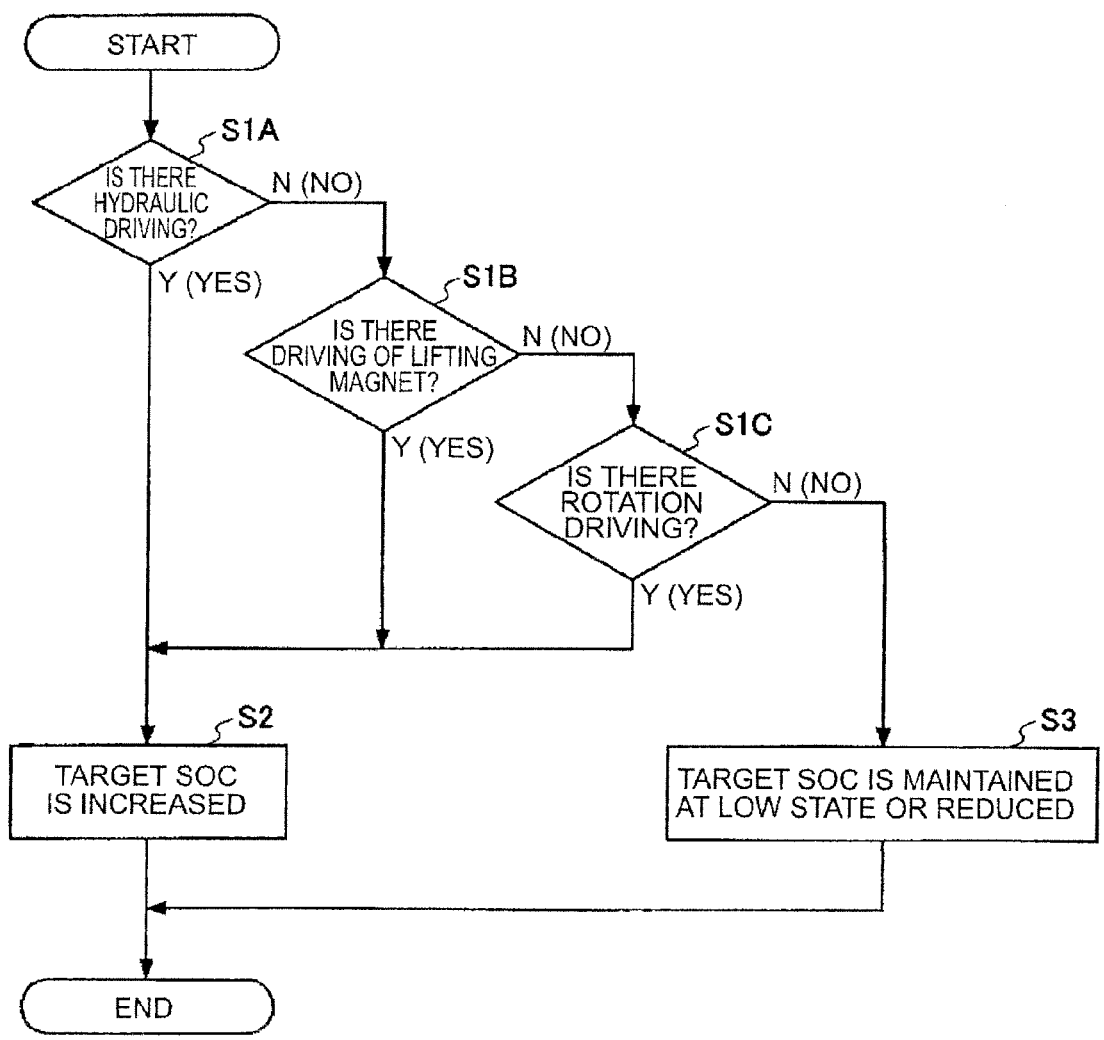
FIG. 3 is a view showing the procedure when changing an SOC of a capacitor according to the degree of load of an operating element in the hybrid type construction machine of the example.

FIG. 3 is a view showing the procedure when changing the SOC of the capacitor 19 according to the driving level of operating elements (rotary mechanism 2 (electric motor 21 for rotation), the boom 4, the arm 5, and the lifting magnet 6)

in the hybrid type construction machine of the first example. This process is a process executed by the controller 50.

The controller 50 starts the process shown in FIG. 3 during an operation of a hybrid type construction machine.

First, the controller 50 determines whether or not the oil pressure of pressure oil detected by the sensor 14A is equal to or greater than the threshold value (step S1A). Since pressure oil from the main pump 14 is needed when driving an operating element of the hydraulic system, driving of the motor generator 12 which assists the engine 11 may be needed. Accordingly, a possibility of driving of the motor generator 12 is detected by detecting driving of the operating element of the hydraulic system.

The controller 50 increases the state of charge (SOC) to 85% when it is determined that the oil pressure is equal to or greater than the threshold value (step S2). This is to increase the state of charge (SOC) according to driving of any of the operating elements of the hydraulic system in preparation for a case where the motor generator 12 performs electric (assistant) operation.

On the other hand, when the oil pressure of pressure oil detected by the sensor 14A is less than the threshold value, the controller 50 determines whether or not driving of the lifting magnet 6 has been detected (step S1B). When driving the lifting magnet 6, it is necessary to supply electric power through the DC bus 40. Since it is necessary to increase the state of charge (SOC) in order to do so, it is determined whether or not driving of the lifting magnet 6 has been detected.

The controller 50 increases the state of charge (SOC) to 85% when driving of the lifting magnet 6 has been detected (step S2). This is to increase the state of charge (SOC) in preparation for supplying electric power to the lifting magnet 6.

On the other hand, when the driving of the lifting magnet 6 has not been detected, the controller 50 determines whether or not driving of the electric motor 21 for rotation has been detected (step S1C). When driving the electric motor 21 for rotation, it is necessary to supply electric power through the DC bus 40. Since it is necessary to increase the state of charge (SOC) in order to do so, it is determined whether or not driving of the electric motor 21 for rotation has been detected.

The controller 50 increases the state of charge (SOC) to 85% when driving of the electric motor 21 for rotation has been detected (step S2). This is to increase the state of charge (SCC) in preparation for supplying electric power to the electric motor 21 for rotation.

On the other hand, when driving of the electric motor 21 for rotation has not been detected, the controller 50 holds the state of charge (SOC) to 70%, (step S3). This is to increase the life of the capacitor 19 by holding the capacitor voltage in a low state because none of the operating elements (the operating element of the hydraulic system, the lifting magnet 6, and the electric motor 21 for rotation) is not driven.

In addition, the process in steps S1A to S3 described above is repeatedly executed. When the procedure proceeds to step S3 in a state where the state of charge (SOC) is high (85% or more), the controller 50 makes the motor generator 12 perform electric (assistant) operation so that the state of charge (SOC) is reduced to 70%.

Figure 4:
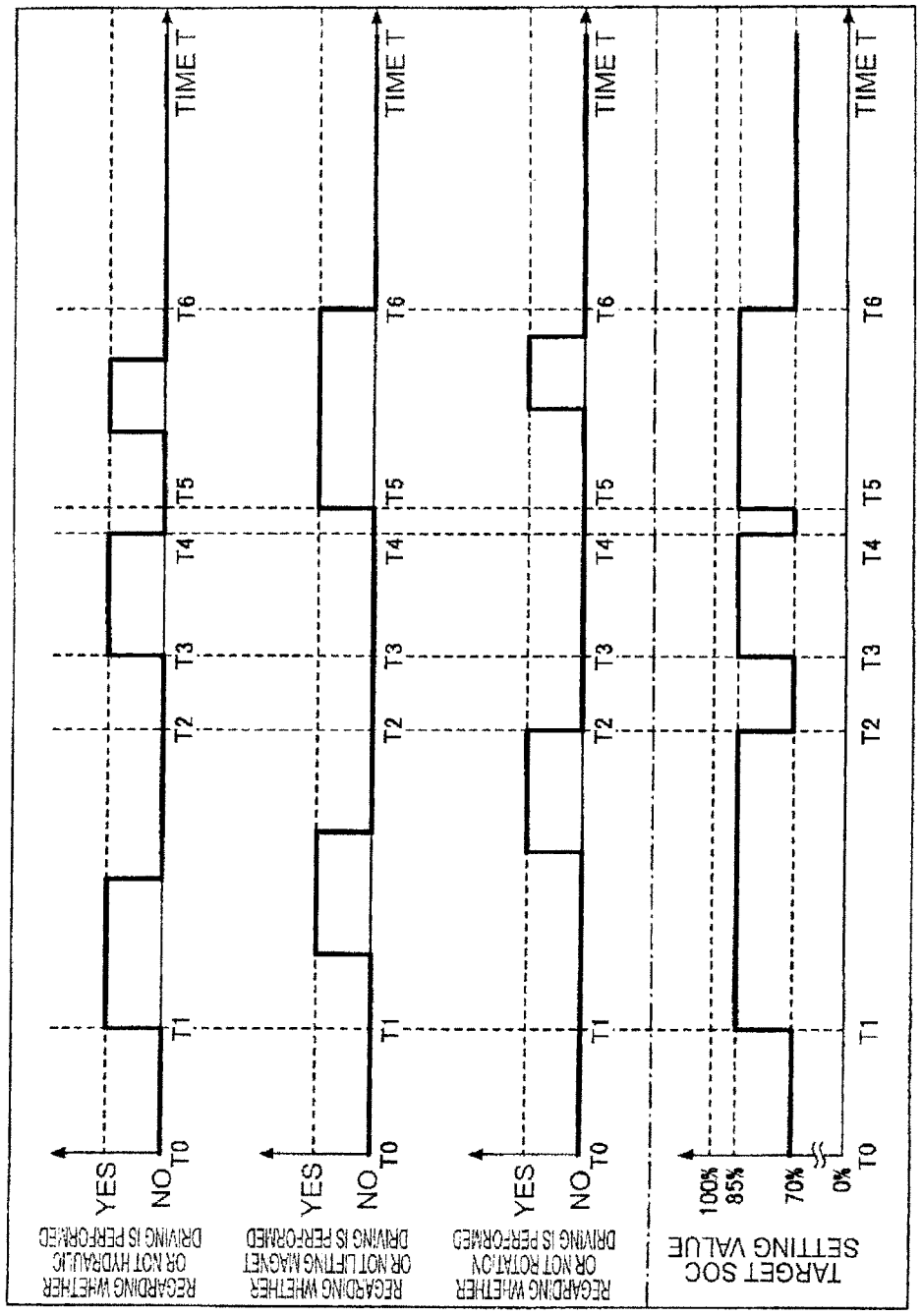
FIG. 4 is a view showing a chart when changing the SOC of the capacitor in the hybrid type construction machine of the example.

FIG. 4 is a view showing a chart when changing the SOC of the capacitor 19 in the hybrid type construction machine of the first example.

When an operation of the hybrid type construction machine is started at time T0, the state of charge (SOC) is held to 70% (low state) by the controller 50.

If driving of an operating element of the hydraulic system is detected at time T1 (equivalent to YES in step S1A), the controller 50 increases the state of charge (SOC) to 85% (high state) (equivalent to step S2).

Then, the operating element of the hydraulic system, the lifting magnet 6, and the electric motor 21 for rotation are driven in a sequential manner, and power generation operation of the motor generator 12 is performed by the inverter 18a so that mechanical energy increased by the engine 11 is converted into electric energy by the motor generator 12 and is then supplied to the capacitor 19. In this case, the output of the engine 11 is increased corresponding to the driving state of the motor generator 12. In this way, the state of charge (SOC) is increased to 85% (high state) (equivalent to step S2).

In addition, if driving of the electric motor 21 for rotation ends at time T2 (equivalent to NO in step S1C), electric (assistant) operation of the motor generator 12 is performed by the inverter 18a so that electric energy from the capacitor 19 is converted into mechanical energy by the motor generator 12 and is then transmitted to the engine 11 by the controller 50. Also in this case, the driving torque of the engine 11 is increased by electric (assistant) operation of the motor generator 12. In this way, the state of charge (SOC) is increased to 70% (low state) (equivalent to step S3).

If driving of an operating element of the hydraulic system is detected again at time T3 (equivalent to YES in step S1A), the controller 50 increases the state of charge (SOC) to 85% (high state) (equivalent to step S2).

Then, if elements (the lifting magnet 6 or the electric motor 21 for rotation) other than the operating element of the hydraulic system are not driven and driving of the operating element of the hydraulic system ends at time T4 (equivalent to NO in steps S1A to S1C), the controller 50 reduces the state of charge (SOC) to 70% (low state) (equivalent to step S3).

At time T5, the lifting magnet 6 is driven (equivalent to YES in step S1B), and the controller 50 increases the state of charge (SOC) to 85% (high state) (equivalent to step S2).

Then, if driving of the operating element of the hydraulic system and the electric motor 21 for rotation is performed in addition to the lifting magnet 6 and then driving of the lifting magnet 6 ends at time T6 after returning to driving of only the lifting magnet 6 again, the controller 50 reduces the state of charge (SOC) to 70% (low state) (equivalent to step S3). As described above, the operation shown in FIG. 4 is completed.

According to the hybrid type construction machine of the first example, if a state where none of the operating elements of the hydraulic system, the lifting magnet 6, and the electric motor 21 for rotation is driven is detected, the controller 50 sets the capacitor voltage to be low. Thus, when it is not necessary to supply electric power to any of the motor generator 12, the lifting magnet 6, and the electric motor 21 for rotation, the capacitor voltage is set to be low. As a result, it is possible to provide a hybrid type construction machine in which the life of the capacitor 19 is long.

In the above, a form in which it is determined whether or not the state of charge (SOC) of the capacitor 19 is equal to or lower than 80% has been described. Setting the threshold value of SOC to 80% is to secure the sufficient state of charge when the next operation of the hybrid type construction machine is started and to secure a sufficient free space for charging regenerative power. For this reason, the threshold value of SOC used for determination is not limited to 80% but may be suitably set according to the specifications and the like of an actual system.

In the above, a form has been described in which the state of charge (SOC) of the capacitor 19 is set to 70% when reducing the state of charge (SOC). However, the state of charge (SOC) when set to be low is not limited to 70% but may be higher or lower than 70% as long as the responsiveness which does not cause a problem in the work can be secured when driving at least one of the operating element of the hydraulic system, the lifting magnet 6, and the electric motor 21 for rotation.

Moreover, in the above, a form has been described in which the hybrid type working machine of the present example is applied to a hybrid type construction machine including the motor generator 12 and the electric motor 21 for rotation for assisting the engine 11. However, elements which are electrically driven by hybridization are not limited to these, but the hybrid type working machine of the present example may be similarly applied to a hybrid type construction machine in which the hydraulic motors 1A and 1B, the boom cylinder 7, the arm cylinder 8, or the bucket cylinder 9 is electrically driven.

Second Example

A hybrid type construction machine of a second example is different from that of the first example in that the state of charge (SOC) of the capacitor 19 is set according to the number of revolutions of the engine 11. For this reason, an electrical signal indicating the number of revolutions of the engine 11 is input to the controller 50.

In the second example, the controller 50 monitors the number of revolutions of the engine transmitted from a control device (for example, an ECU (Electronic Control Unit)) of the engine 11.

For example, assuming that the number of revolutions at the time of idling of the engine 11 is 1000 rpm and the maximum number of revolutions allowed is 2000 rpm, the threshold value used for determination may be set to 1200 rpm.

Here, the number of revolutions of the engine 11 is changed by a volume switch provided together with the operating device 26 in the cabin 10. For example, assuming that the number of revolutions at the time of idling of the engine 11 is 1000 rpm and the maximum number of revolutions allowed is 2000 rpm, generally, the driver sets the volume switch to a desired rated value (for example, 1800 rpm) during working and sets it to an idling state (1000 rpm) when not working.

Accordingly, the hybrid type construction machine of the second example determines whether or not work is going on by monitoring the number of revolutions of the engine.

In addition, since the other configuration is similar to the hybrid type construction machine of the first example, a repeated explanation will be omitted.

[Setting of the State of Charge (SOC)]

In the hybrid type construction machine of the second example, the state of charge (SOC) of the capacitor 19 immediately after the start of operation (before operation) is set to 70%. In addition, when the number of revolutions of the engine has increased to the threshold value or more, the state of charge (SOC) is increased to 85%. Moreover, if the number of revolutions of the engine has decreased to less than the threshold value, the state of charge (SOC) is reduced to 70%.

This is because it is not necessary to store a large amount of electric power in the capacitor 19 when the user does not work and accordingly, the amount of heat generation is reduced by setting the state of charge (SOC) of the capacitor 19 relatively low (to 70%), as a discharge mode, so that the life of the capacitor 19 can be increased.

In addition, when the number of revolutions of the engine 11 has increased by operation of the volume switch in order to work, it is necessary to increase the state of charge (SOC) to some extent in order to make preparations for supplying electric power from the capacitor 19 in preparation for driving of the operating element of the hydraulic system, the lifting magnet 6, or the electric motor 21 for rotation. Accordingly, the state of charge (SOC) of the capacitor 19 is increased to 85%.

Figure 5:
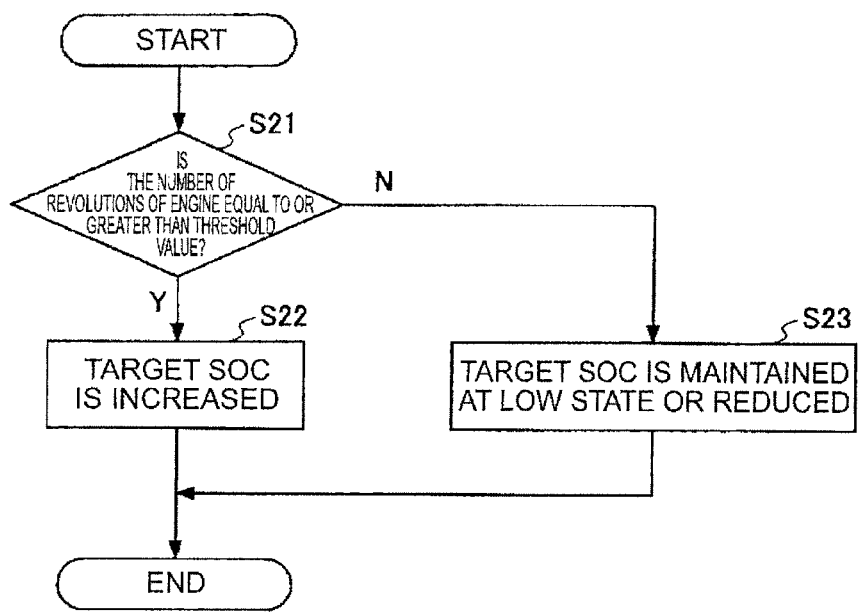
FIG. 5 is a view showing the procedure when changing the SOC of a capacitor according to the number of revolutions of an engine in a hybrid type construction machine of another example.

FIG. 5 is a view showing the procedure when changing the SOC of the capacitor 19 according to the number of revolutions of the engine (driving level of the engine 11) in the hybrid type construction machine of the second example. This process is a process executed by the controller 50.

The controller 50 starts the process shown in FIG. 5 during an operation of a hybrid type construction machine.

First, the controller 50 determines whether or not the number of revolutions of the engine is equal to or greater than a threshold value (step S21). If the number of revolutions of the engine is increased, it is thought that work is going on. Accordingly, whether or not driving of an operating element of the hydraulic system, the lifting magnet 6, or the electric motor 21 for rotation is being performed is detected by monitoring the number of revolutions of the engine.

In addition, the threshold value used for determination can be set to 1200 rpm, for example.

The controller 50 increases the state of charge (SOC) to 85% when it is determined that the number of revolutions of the engine is equal to or greater than the threshold value (step S22). This is to increase the state of charge (SOC) according to driving of the operating element of the hydraulic system, the lifting magnet 6, or the electric motor 21 for rotation in preparation for a case where the motor generator 12 performs electric (assistant) operation.

On the other hand, when it is determined that the number of revolutions of the engine is less than the threshold value, the controller 50 holds the state of charge (SOC) to 70%, (step S23). This is to increase the life of the capacitor 19 by holding the capacitor voltage in a low state because none of the operating elements (the operating element of the hydraulic system, the lifting magnet 6, and the electric motor 21 for rotation) is driven (non-working state).

In addition, the process in steps S21 to S23 described above is repeatedly executed. When the procedure proceeds to step S23 in a state where the state of charge (SOC) is high (85% or more), the controller 50 makes the motor generator 12 perform electric (assistant) operation so that the state of charge (SOC) is reduced to 70%.

Figure 6:
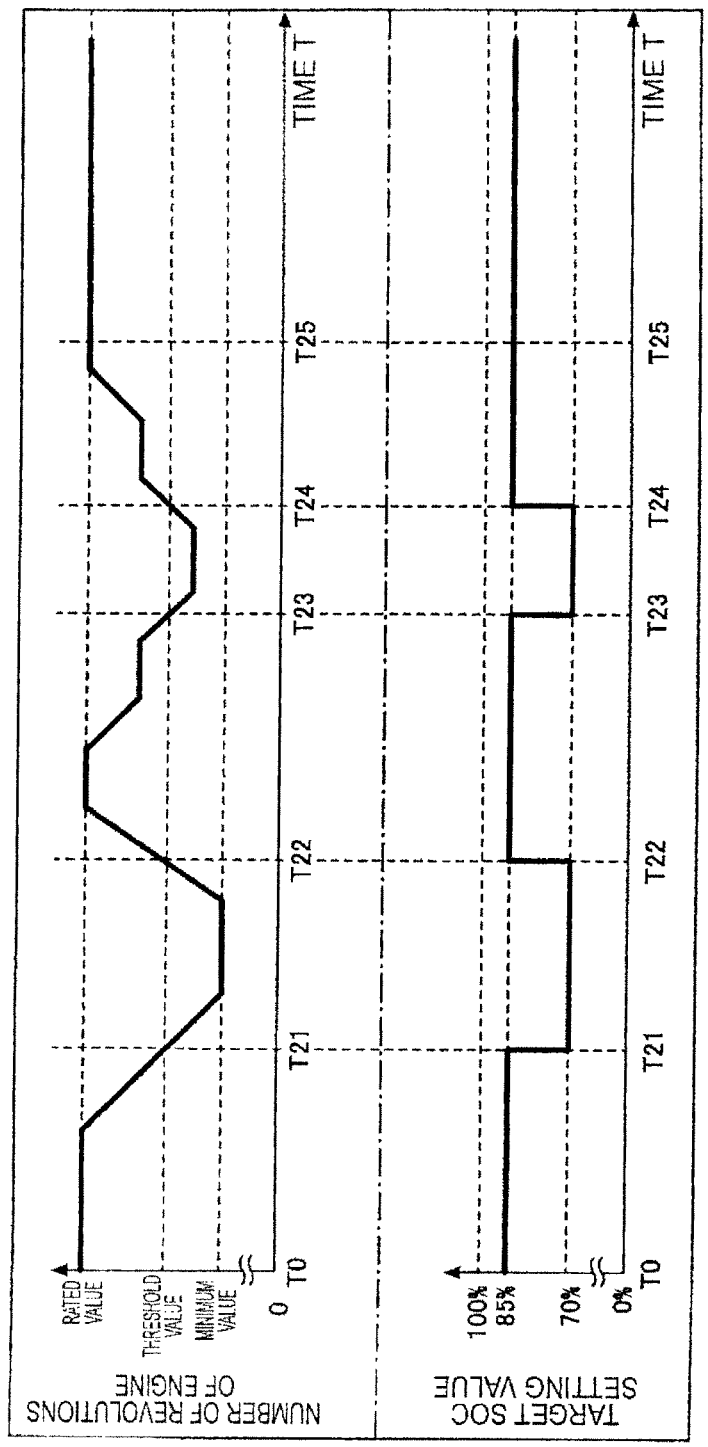
FIG. 6 is a view showing a chart when changing the SOC of the capacitor in the hybrid type construction machine of another example.

FIG. 6 is a view showing a chart when changing the SOC of the capacitor 19 in the hybrid type construction machine of the second example.

When the number of revolutions of the engine 11 of the hybrid type construction machine is set to the rated value at time T0, the state of charge (SOC) is increased to 85% (high state) by the controller 50.

Then, when the number of revolutions of the engine becomes less than the threshold value (1200 rpm) at time T21 (equivalent to NO in step S21), the controller 50 sets the state of charge (SOC) to 70% (low state) (equivalent to step S23).

Then, when the number of revolutions of the engine becomes equal to or greater than the threshold value (1200 rpm) at time T22 (equivalent to YES in step S21), the controller 50 increases the state of charge (SOC) to 85% (high state) (equivalent to step S22).

Then, when the number of revolutions of the engine becomes less than the threshold value (1200 rpm) at time T23 (equivalent to NO in step S21), the controller 50 sets the state of charge (SOC) to 70% (low state) (equivalent to step S23).

Then, when the number of revolutions of the engine becomes equal to or greater than the threshold value (1200 rpm) at time T24 (equivalent to YES in step S21), the controller 50 increases the state of charge (SOC) to 85% (high state) (equivalent to step S22).

Then, at time T25, the number of revolutions of the engine returns to the rated value.

Thus, according to the hybrid type construction machine of the second example, if an idling state (equivalent to a non-working state) of the engine 11 is detected, the controller 50 sets the capacitor voltage to be low. Thus, when it is not necessary to supply electric power to any of the motor generator 12, the lifting magnet 6, and the electric motor 21 for rotation, the capacitor voltage is set to be low. As a result, it is possible to provide a hybrid type construction machine in which the life of the capacitor 19 is long.

Third Example

A hybrid type construction machine of a third example is different from that of the first example in that the state of charge (SOC) of the capacitor 19 is set according to whether or not the levers 26A and 26B and the pedal 26C (hereinafter, simply referred to as "lever 26A and the like" in the third example) have been operated. For this reason, an electrical signal indicating whether or not the lever 26A and the like have been operated, which is transmitted from the pressure sensor 29, is input to the controller 50.

The hybrid type construction machine of the third example determines whether or not work is going on by determining whether or not the lever 26A and the like have been operated.

In addition, since the other configuration is similar to the hybrid type construction machine of the first example, a repeated explanation will be omitted.

[Setting of the State of Charge (SOC)]

In the hybrid type construction machine of the third example, the state of charge (SOC) of the capacitor 19 immediately after the start of operation (before operation) is set to 70%. In addition, when it is determined that there is an operation of the lever 26A and the like, it is determined that the driving level of the engine 11 or the operating element (the rotary mechanism 2 (electric motor 21 for rotation), the bucket 4, the arm 5, and the lifting magnet 6) is high and the state of charge (SOC) is increased to 85%. In addition, when it is determined that there is no operation of the lever 26A and the like, it is determined that the driving level of the engine 11 or the operating element (the rotary mechanism 2 (electric motor 21 for rotation), the bucket 4, the arm 5, and the lifting magnet 6) is low and the state of charge (SOC) is reduced to 70%.

This is because it is not necessary to store a large amount of electric power in the capacitor 19 when the user does not work and accordingly, the amount of heat generation is reduced by setting the state of charge (SOC) of the capacitor 19 relatively low (to 70%), as a discharge mode, so that the life of the capacitor 19 can be increased.

In addition, when the lever 26A and the like have been operated in order to work, it is necessary to increase the state of charge (SOC) to some extent in order to make preparations for supplying electric power from the capacitor 19 in preparation for driving of the operating element of the hydraulic system, the lifting magnet 6, or the electric motor 21 for rotation. Accordingly, the state of charge (SOC) of the capacitor 19 is increased to 85%.

Figure 7:
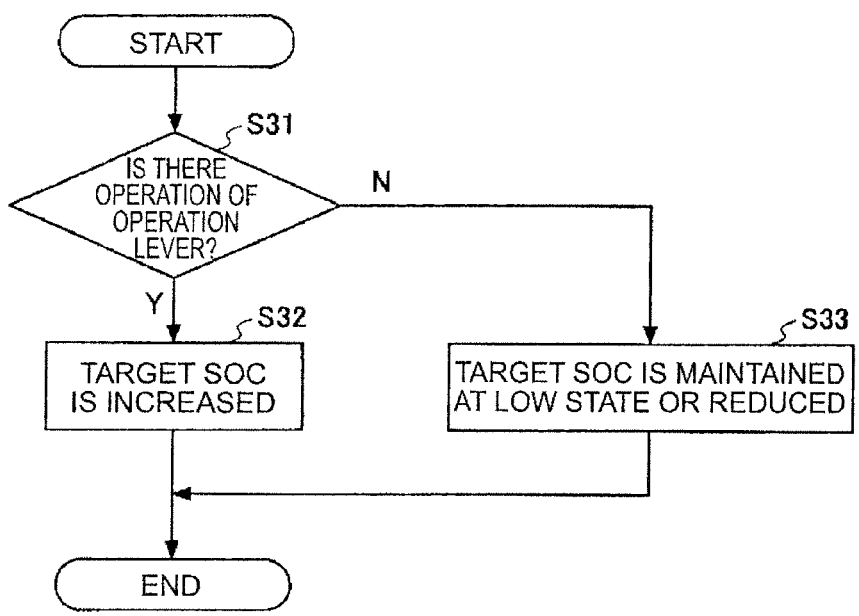
FIG. 7 is a view showing the procedure when changing the SOC of a capacitor according to whether or not a lever or the like has been operated in a hybrid type construction machine of still another example.

FIG. 7 is a view showing the procedure when changing the SOC of the capacitor 19 according to whether or not the lever 26A and the like have been operated (according to the driving level of an operating element according to the amount of operation input to the operating device 26) in the hybrid type construction machine of the third example. This process is executed by the controller 50.

The controller 50 starts the process shown in FIG. 7 during an operation of a hybrid type construction machine.

First, the controller 50 determines whether or not the lever 26A and the like have been operated (step S31). This is to detect driving of the operating element of the hydraulic system, the lifting magnet 6, or the electric motor 21 for rotation since work is going on when the lever 26A and the like have been operated.

The controller 50 increases the state of charge (SOC) to 85% when it is determined that there is an operation of the lever 26A and the like (step S32). This is to increase the state of charge (SOC) according to driving of the operating element of the hydraulic system, the lifting magnet 6, or the electric motor 21 for rotation in preparation for a case where the motor generator 12 performs electric (assistant) operation.

On the other hand, when it is determined that there is no operation of the lever 26A and the like, the state of charge (SOC) is held to 70% (step S33). This is to increase the life of the capacitor 19 by holding the capacitor voltage in a low state because none of the operating elements (the operating element of the hydraulic system, the lifting magnet 6, and the electric motor 21 for rotation) is driven (non-working state).

In addition, the process in steps S31 to S33 described above is repeatedly executed. When the procedure proceeds to step S33 in a state where the state of charge (SOC) is high (85% or more), the controller 50 makes the motor generator 12 perform electric (assistant) operation so that the state of charge (SOC) is reduced to 70%.

Figure 8:
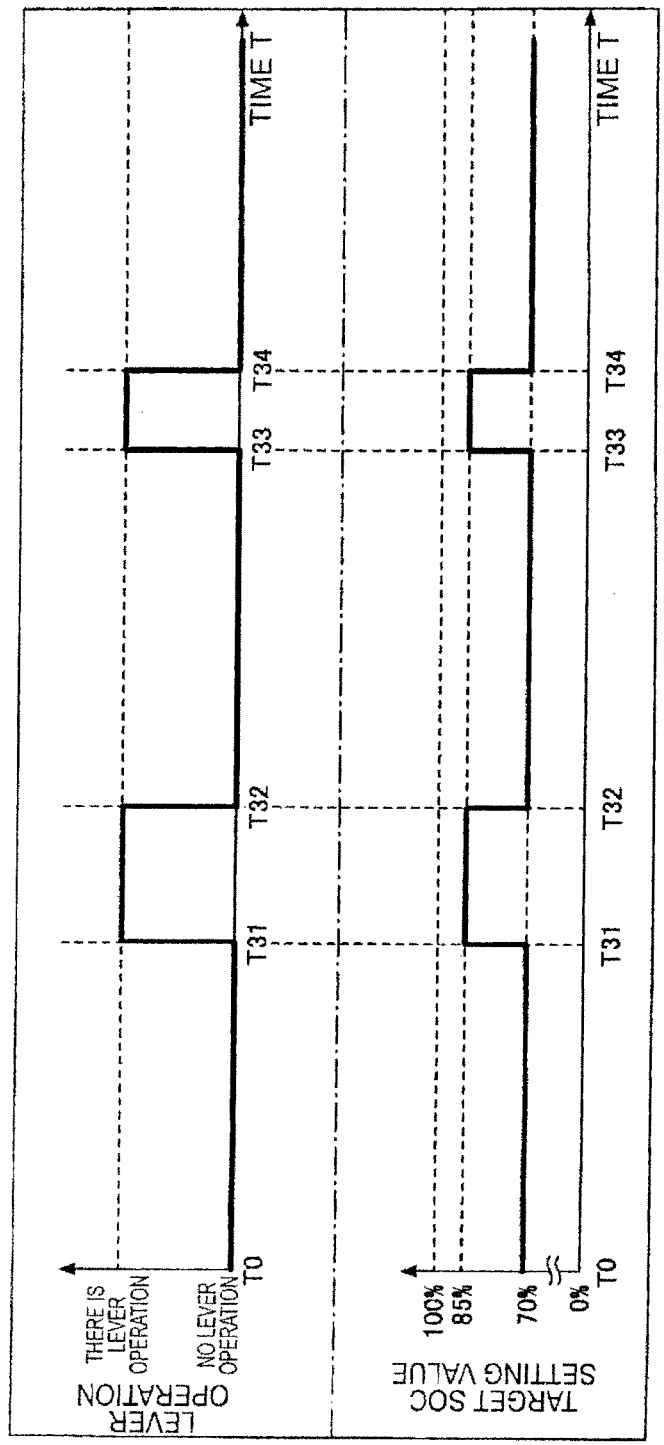
FIG. 8 is a view showing a chart when changing the SOC of the capacitor in the hybrid type construction machine of still another example.

FIG. 8 is a view showing a chart when changing the SOC of the capacitor 19 in the hybrid type construction machine of the third example.

When an operation of the hybrid type construction machine is started at time T0, the state of charge (SOC) is held to 70% (low state) by the controller 50.

If it is determined that there is an operation of the lever 26A and the like at time T31 (equivalent to step S31), the controller 50 increases the state of charge (SOC) to 85% (high state) (equivalent to step S32).

Moreover, if it is determined that there is no operation of the lever 26A and the like at time T32 (equivalent to NO in step S31), the controller 50 sets the state of charge (SOC) to 70% (low state) (equivalent to step S33).

Moreover, if it is determined that there is an operation of the lever 26A and the like at time T33 (equivalent to YES in step S31), the controller 50 increases the state of charge (SOC) to 85% (high state) (equivalent to step S32).

Moreover, if it is determined that there is no operation of the lever 26A and the like at time T34 (equivalent NO in step S31), the controller 50 sets the state of charge (SOC) to 70% (low state) (equivalent to step S33).

Thus, according to the hybrid type construction machine of the third example, if it is determined that there is no operation of the lever 26A and the like, the controller 50 sets the capacitor voltage to be low. Thus, when it is not necessary to supply electric power to any of the motor generator 12, the lifting magnet 6, and the electric motor 21 for rotation, the capacitor voltage is set to be low. As a result, it is possible to provide a hybrid type construction machine in which the life of the capacitor 19 is long.

Fourth Example

A hybrid type construction machine of a fourth example is different from that of the first example in that the state of charge (SOC) of the capacitor 19 is set according to whether or not a gate lock lever has been operated. For this reason, an electrical signal indicating an opening and closing state of a gate lock lever is input to the controller 50.

Figure 9:
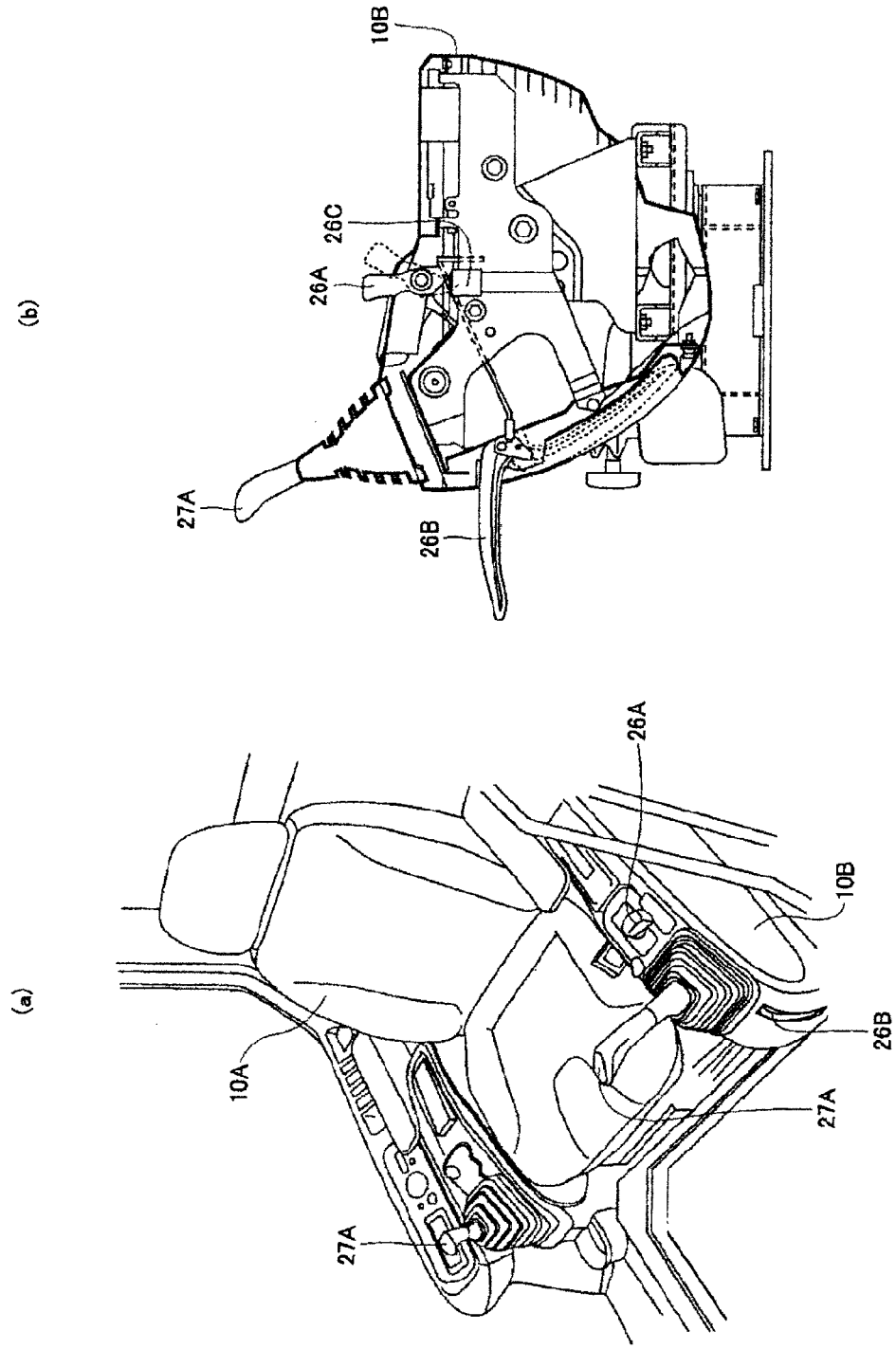
FIGS. 9A and 9B are views showing a driver's seat and the periphery of a hybrid type construction machine of still another example, where

FIGS. 9A and 9B are views showing a driver's seat and the periphery of the hybrid type construction machine of the fourth example. FIG. 9A is a perspective view, and FIG. 9B is a side view showing a console located at the left side of the driver's seat.

A gate lock operating section 60 is a gate locking device for switching between a state where a construction machine can be used (operable state) and a state where the construction machine cannot be used (inoperable state). The gate lock operating section 60 is provided to prevent a malfunction of the construction machine. Here, the gate lock operating section 60 will be described with reference to FIGS. 9A and 9B.

Consoles 10B are provided at both sides of a driver's seat 10A disposed in the cabin 10, and a pair of operating levers 26A is provided in the pair of consoles 10B. From the left side with respect to the cabin front direction, the operator can get on and off the driver's seat 10A. The gate lock operating section 60 is provided in the left console 10B.

Moreover, as shown in FIG. 93, the gate lock operating section 60 provided in the left console 10B includes a gate lock lever 60A, a gate 60B, and a limit switch 60C.

The gate lock operating section 60 is disposed at a side of the driver's seat provided in the cabin of the upper revolving body 3, and is an operating section for opening and closing operation of the gate 60B provided in a portion for getting on/off a driver's seat. The gate 60B and the gate lock lever 60A are connected to each other by a wire. The gate 60B is closed (state indicated by a solid line) if the gate lock lever 60A is pulled up, and the gate 60B is opened if the gate lock lever 60A is pulled down (state indicated by a broken line). The driver cannot get down from the driver's seat when the gate is closed and can get down when the gate is opened.

The limit switch 60C is a sensor for detecting the operation of the gate lock lever 60A. The limit switch 60C is turned on when the gate lock lever 60A is pulled up and is turned off when the gate lock lever 60A is pulled down.

This limit switch 60C is connected to a shutoff valve, which is provided in the pilot line 25 which transmits pilot pressure from the pilot pump 15 to the operating device 26, so that switching between a connection state and a cutoff state is performed according to an electrical signal transmitted from the limit switch 60C. When the construction machine is used, the limit switch 60C is set to a connection state so that pilot pressure is transmitted to the operating device 26. On the other hand, when the construction machine is not used, the limit switch 60C is set to a cutoff state so that transmission of pilot pressure to the operating device 26 is cut off. Switching control of the shutoff valve is performed by the gate lock operating section 60.

If the limit switch 60C is turned on, a relay of the shutoff valve is turned on. If the limit switch 60C is turned off, the relay is turned off. Thus, the shutoff valve is switched by the limit switch 60C. In addition, a signal indicating ON/OFF of the limit switch 60C is also input to a controller 30.

In a state where the gate lock lever 60A is pulled up and the gate 60B is closed, the relay is turned on to set the shutoff valve to a connection state. Then, the construction machine becomes in a usable state (operable state). On the other hand, in a state where the gate lock lever 60A is pulled down and the gate 60B is opened, the relay is turned off to set the shutoff valve to a cutoff state. Then, the construction machine enters an unusable state (inoperable state). This is to prevent a malfunction.

In the fourth example, the controller 50 monitors whether or not there is an operation of the gate lock lever 60A transmitted from the gate lock operating section 60. The controller 50 determines whether or not work is going on by determining whether or not the gate lock lever 60A has been operated.

In addition, since the other configuration is similar to the hybrid type construction machine of the first example, a repeated explanation will be omitted.

[Setting of the State of Charge (SOC)]

In the hybrid type construction machine of the fourth example, the state of charge (SOC) of the capacitor 19 immediately after the start of operation (before operation) is set to 70%. In addition, when it is determined that the gate lock lever 60A has been pulled up, the state of charge (SOC) is increases to 85%. In addition, when it is determined that the gate lock lever 60A has been pulled down, the state of charge (SOC) is reduced to 70%.

This is because it is not necessary to store a large amount of electric power in the capacitor 19 when the user does not work and accordingly, the amount of heat generation is reduced by setting the state of charge (SOC) of the capacitor 19 relatively low (to 70%), as a discharge mode, so that the life of the capacitor 19 can be increased.

In addition, when it is determined that the gate lock lever 60A has been pulled up in order to work, it is necessary to increase the state of charge (SOC) to some extent in order to make preparations for supplying electric power from the capacitor 19 in preparation for driving of the operating element of the hydraulic system, the lifting magnet 6, or the electric motor 21 for rotation. Accordingly, the state of charge (SOC) of the capacitor 19 is increased to 85%.

Figure 10:
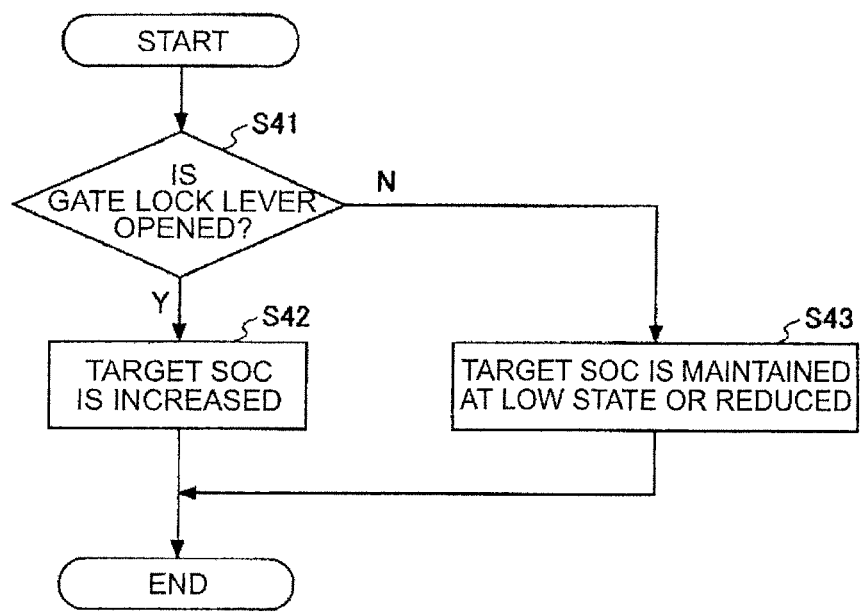
FIG. 10 is a view showing the procedure when changing the SOC of a capacitor according to whether or not a gate lock lever has been operated in the hybrid type construction machine of still another example.

FIG. 10 is a view showing the procedure when changing the SOC of the capacitor 19 according to whether or not the gate lock lever 60A has been operated in the hybrid type construction machine of the fourth example.

In the fourth example, the driving level of the engine 11 or the operating element (the rotary mechanism 2 (electric motor 21 for rotation), the bucket 4, the arm 5, and the lifting magnet 6) is determined according to whether or not the gate lock lever 60 has been operated (according to the operation state), and the SOC is changed by making the motor generator 12 perform electric (assistant) operation.

This process is a process executed by the controller 50. Here, the case where it is determined that the gate lock lever 60A has been pulled up is expressed as "operated", and the case where it is determined that the gate lock lever 60A has been pulled down is expressed as "not operated".

The controller 50 starts the process shown in FIG. 10 during an operation of a hybrid type construction machine.

First, the controller 50 determines whether or not the gate lock lever 60A has been operated (step S41). This is to detect driving of the operating element of the hydraulic system, the lifting magnet 6, or the electric motor 21 for rotation since work is going on when the gate lock lever 60A has been operated.

The controller 50 increases the state of charge (SOC) to 85% when it is determined that the gate lock lever 60A has been operated (step S42). This is to increase the state of charge (SOC) according to driving of the operating element of the hydraulic system, the lifting magnet 6, or the electric motor 21 for rotation in preparation for a case where the motor generator 12 performs electric (assistant) operation.

On the other hand, when it is determined that the gate lock lever 60A has not been operated, the state of charge (SOC) is held to 70% (step S43). This is to increase the life of the capacitor 19 by holding the capacitor voltage in a low state because none of the operating elements (the operating element of the hydraulic system, the lifting magnet 6, and the electric motor 21 for rotation) is driven (state where working is prohibited).

In addition, the process in steps S41 to S43 described above is repeatedly executed. When the procedure proceeds to step S43 in a state where the state of charge (SOC) is high (85% or more), the controller 50 makes the motor generator 12 perform electric (assistant) operation so that the state of charge (SOC) is reduced to 70%.

Figure 11:
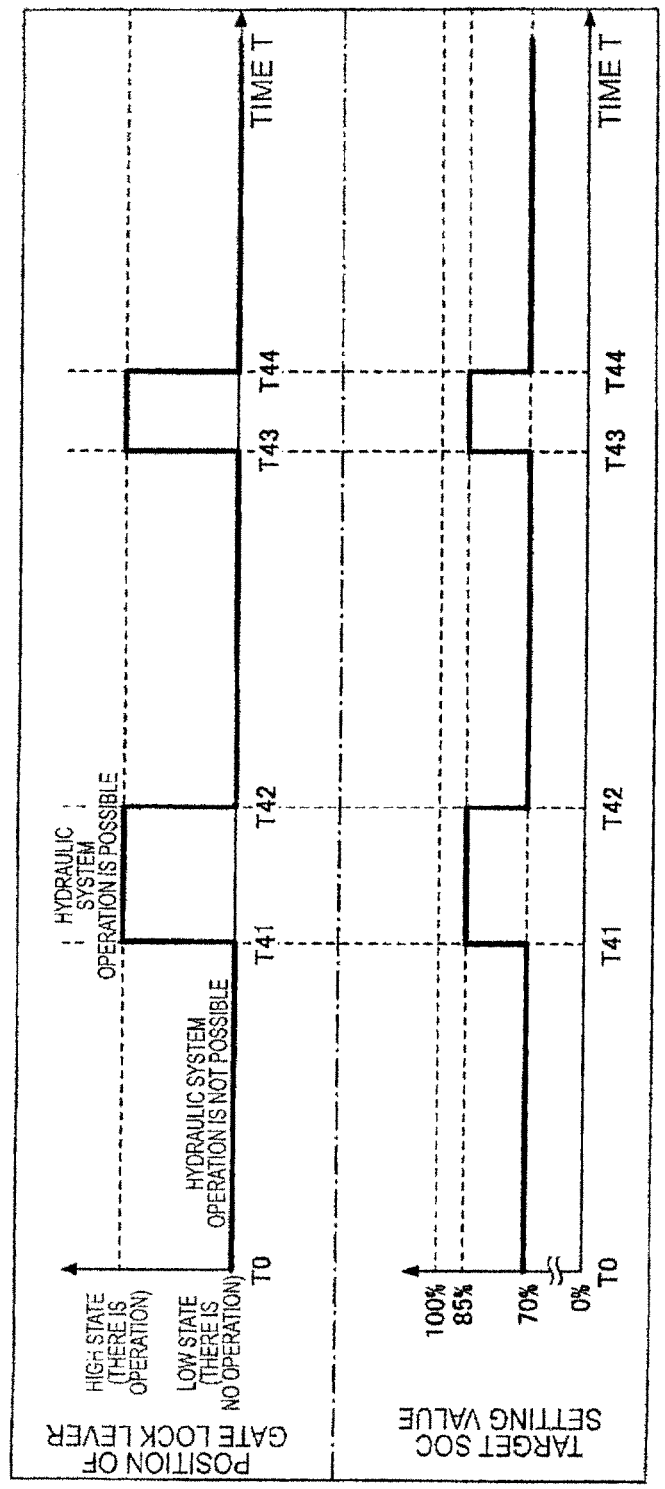
FIG. 11 is a view showing a chart when changing the SOC of the capacitor in the hybrid type construction machine of still another example.

FIG. 11 is a view showing a chart when changing the SOC of the capacitor 19 in the hybrid type construction machine of the fourth example.

When an operation of the hybrid type construction machine is started at time T0, the state of charge (SOC) is held to 70% (low state) by the controller 50.

If it is determined that the gate lock lever 60A has been operated at time T41 (equivalent to step S41), the controller 50 increases the state of charge (SOC) to 85% (high state) (equivalent to step S42).

Moreover, if it is determined that the gate lock lever 60A has not been operated at time T42 (equivalent NO in step S41), the controller 50 sets the state of charge (SOC) to 70% (low state) (equivalent to step S43).

Moreover, if it is determined that the gate lock lever 60A has been operated at time T43 (equivalent to YES in step S41), the controller 50 increases the state of charge (SOC) to 85% (high state) (equivalent to step S42).

Moreover, if it is determined that the gate lock lever 60A has not been operated at time T44 (equivalent to NO in step S41), the controller 50 sets the state of charge (SOC) to 70% (low state) (equivalent to step S43).

Thus, according to the hybrid type construction machine of the fourth example, if it is determined that the gate lock lever 60A has not been operated, the controller 50 sets the capacitor voltage to be low. Thus, when it is not necessary to supply electric power to any of the motor generator 12, the lifting magnet 6, and the electric motor 21 for rotation, the capacitor voltage is set to be low. As a result, it is possible to provide a hybrid type construction machine in which the life of the capacitor 19 is long.

Fifth Example

A hybrid type construction machine of a fifth example is different from that of the first example in that the state of charge (SOC) of the capacitor 19 is set according to the operation position of an ignition switch. For this reason, an electrical signal indicating whether or not the lever 26A and the like have been operated, which is transmitted from the ignition switch, is input to the controller 50. The ignition switch is provided at a side of the driver's seat 10A shown in FIG. 9.

When determining whether or not work is going on the basis of the operation position of the ignition switch, the hybrid type construction machine of the fifth example determines that the engine 11 is in the operation state when the operation position of the ignition switch reaches a START (mode for driving a starter) position from an OFF position through an ACC (accessory mode) position and is then set to the ON position. In addition, when the ignition switch is operated to move from the ON position to the ACC position or the OFF position, it is determined that the engine 11 has stopped.

In addition, since the other configurations are similar to the hybrid type construction machine of the first example, repeated explanations will be omitted.

[Setting of the State of Charge (SOC)]

In the hybrid type construction machine of the fifth example, the state of charge (SOC) of the capacitor 19 immediately after the start of operation (before operation) is set to 70%. In addition, when the engine 11 has changed to the operation state by the operation of the ignition switch, the state of charge (SOC) is increased to 85%. In addition, when the engine 11 has changed to the stopped state by the operation of the ignition switch, the state of charge (SOC) is reduced to 70%.

This is because it is not necessary to store a large amount of electric power in the capacitor 19 in a non-working state where the engine 11 is stopped and accordingly, the amount of heat generation is reduced by setting the state of charge (SOC) of the capacitor 19 relatively low (to 70%), as a discharge mode, so that the life of the capacitor 19 can be increased.

In addition, when the engine 11 is in the operation state in order to work, it is necessary to increase the state of charge (SOC) to some extent in order to make preparations for supplying electric power from the capacitor 19 in preparation for driving of the operating element of the hydraulic system, the lifting magnet 6, or the electric motor 21 for rotation. Accordingly, the state of charge (SOC) of the capacitor 19 is increased to 85%.

Figure 12:
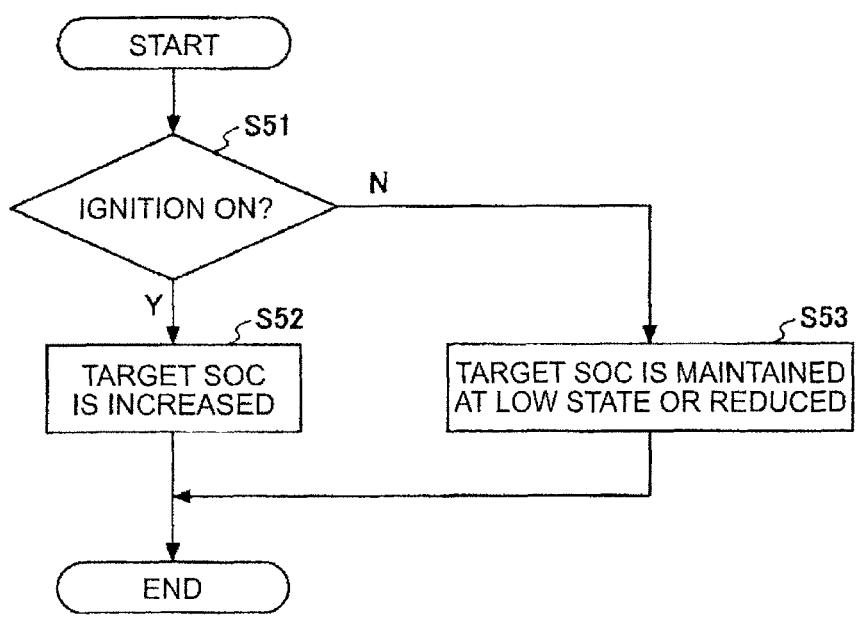
FIG. 12 is a view showing the procedure when changing the SOC of a capacitor according to the operation position of an ignition switch in a hybrid type construction machine of still another example.

FIG. 12 is a view showing the procedure when changing the SOC of the capacitor 19 according to the operation position of the ignition switch in the hybrid type construction machine of the fifth example.

In the fifth example, the driving level of the engine 11 or the operating element (the rotary mechanism 2 (electric motor 21 for rotation), the bucket 4, the arm 5, and the lifting magnet 6) is determined according to the operation position of the ignition switch, and the SOC is changed by making the motor generator 12 perform electric (assistant) operation. In addition, this process is a process executed by the controller 50.

The controller 50 starts the process shown in FIG. 12 during an operation of a hybrid type construction machine.

First, the controller 50 determines whether or not the engine 11 has started up on the basis of a change in the operation position of the ignition switch (step S51). This is to detect driving of the operating element of the hydraulic system, the lifting magnet 6, or the electric motor 21 for rotation since work is going on when the engine 11 has started.

The controller 50 increases the state of charge (SOC) to 85% when it is determined that the engine 11 has started on the basis of a change in the operation position of the ignition switch (step S52). This is to increase the state of charge (SOC) according to driving of the operating element of the hydraulic system, the lifting magnet 6, or the electric motor 21 for rotation in preparation for a case where the motor generator 12 performs electric (assistant) operation.

On the other hand, the controller 50 holds the state of charge (SOC) to 70% when it is determined that the engine 11 has stopped on the basis of a change in the operation position of the ignition switch (step S53). This is to increase the life of the capacitor 19 by holding the capacitor voltage in a low state by the stopping of the engine 11 because none of the operating elements (the operating element of the hydraulic system, the lifting magnet 6, and the electric motor 21 for rotation) is driven (non-working state).

In addition, the process in steps S51 to S53 described above is repeatedly executed. When the procedure proceeds to step S53 in a state where the state of charge (SOC) is high (85% or more), the controller 50 makes the motor generator 12 perform electric (assistant) operation so that the state of charge (SOC) is reduced to 70%.

Figure 13:
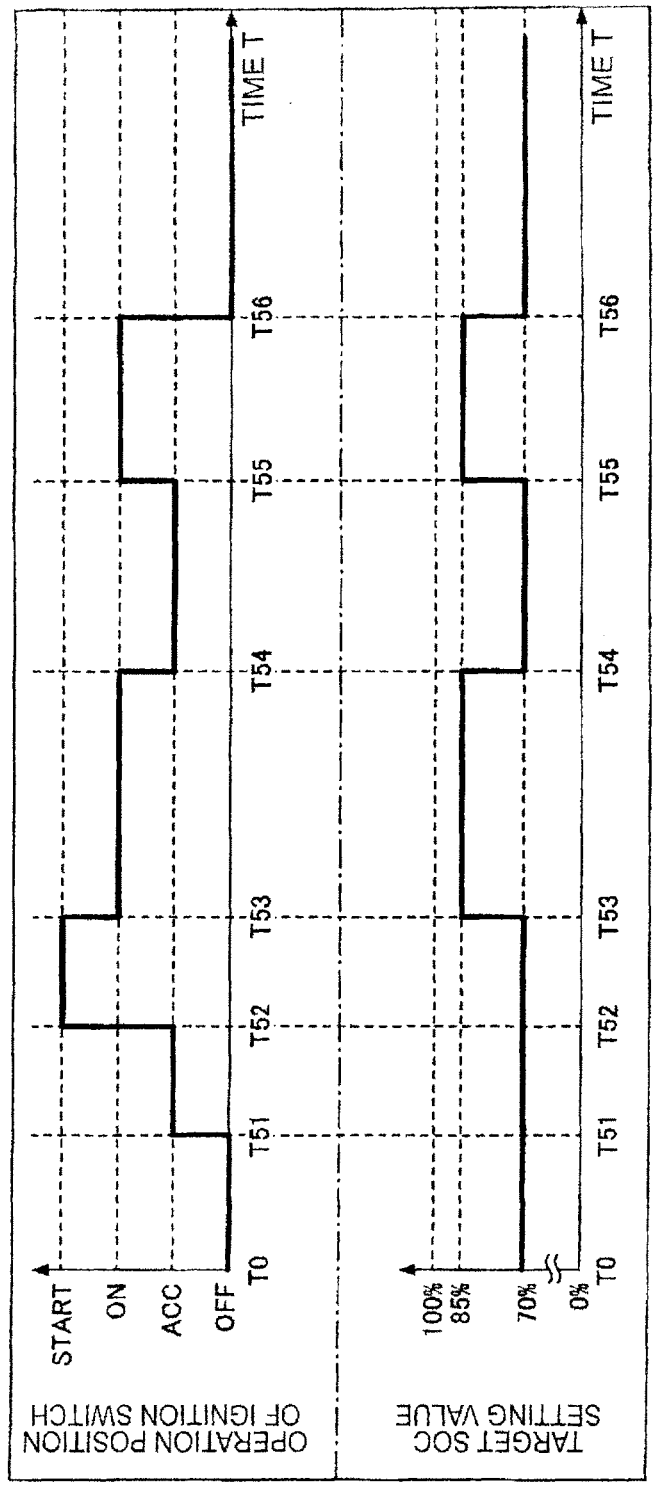
FIG. 13 is a view showing a chart when changing the SOC of the capacitor in the hybrid type construction machine of still another example.

FIG. 13 is a view showing a chart when changing the SOC of the capacitor 19 in the hybrid type construction machine of the fifth example.

When an operation of the hybrid type construction machine is started at time T0, the state of charge (SOC) is held to 70% (low state) by the controller 50.

If it is determined that the engine 11 has started on the basis of a change in the operation position of the ignition switch at time T51 (equivalent to YES in step S51), the controller 50 increases the state of charge (SOC) to 85% (high state) (equivalent to step S52).

If it is determined that the engine 11 has stopped on the basis of a change in the operation position of the ignition switch at time T52 (equivalent to NO in step S51), the controller 50 sets the state of charge (SOC) to 70% (low state) (equivalent to step S53).

Moreover, if it is determined that the engine 11 has started on the basis of a change in the operation position of the ignition switch at time T53 (equivalent to YES in step S51), the controller 50 increases the state of charge (SOC) to 85% (high state) (equivalent to step S52).

In addition, if it is determined that the engine 11 has stopped on the basis of a change in the operation position of the ignition switch at time T54 (equivalent to NO in step S51), the controller 50 sets the state of charge (SOC) to 70% (low state) (equivalent to step S53).

Thus, according to the hybrid type construction machine of the fifth example, if it is determined on the basis of a change in the operation position of the ignition switch that the engine 11 has stopped, the controller 50 sets the capacitor voltage to be low. Thus, when it is not necessary to supply electric power to any of the motor generator 12, the lifting magnet 6, and the electric motor 21 for rotation, the capacitor voltage is set to be low. As a result, it is possible to provide a hybrid type construction machine in which the life of the capacitor 19 is long.

In the above, a form in which the hybrid type working machine of the present example is applied to a hybrid type construction machine, in which the step-up and step-down converter 30 is disposed between the capacitor 19 and the DC bus 41 to which the inverters 18A and 20 are connected, has been described. However, the arrangement, the number, and the like of an inverter or a step-up and step-down converter are just examples and may also be similarly applied in other configurations.

Although the hybrid type construction machine has been described above, the hybrid type working machine may be a working machine other than a construction machine. For example, it may be a hybrid type transportation and loading and unloading machine (a crane or a forklift).

For example, it is possible to use the engine 11 and the motor generator 12 shown in FIG. 2 as an engine and a motor generator for assistance of a crane and to use the electric motor 21 for rotation shown in FIG. 2 as a power source for lifting components, goods, and the like up and down in the loading and unloading operation of a crane. In particular, a power source for lifting components, goods, and the like up and down performs a power operation (at the time of rolling up) and a regenerative operation (at the time of rolling down) according to the rolling up or down of a wire, it can be executed as a hybrid type working machine similar to the hybrid type construction machine described above.

Also in the case of a forklift, it is possible to use the engine 11 and the motor generator 12 shown in FIG. 2 as an engine and a motor generator for assistance of the forklift and to use the electric motor 21 for rotation shown in FIG. 2 as a power source for lifting components, goods, and the like up and down in the loading and unloading operation of the forklift in the same manner as described above. In particular, a power source for lifting a fork up and down performs power operation (at the time of rolling up) and regenerative operation according to an up-and-down operation, it can be executed as a hybrid type working machine similar to the hybrid type construction machine described above.

As described above, in the first to fifth examples, even if the work does not end, the state of charge of a battery (capacitor 19) can be reduced according to the working state or the operation state.

Sixth Example

Figure 14:
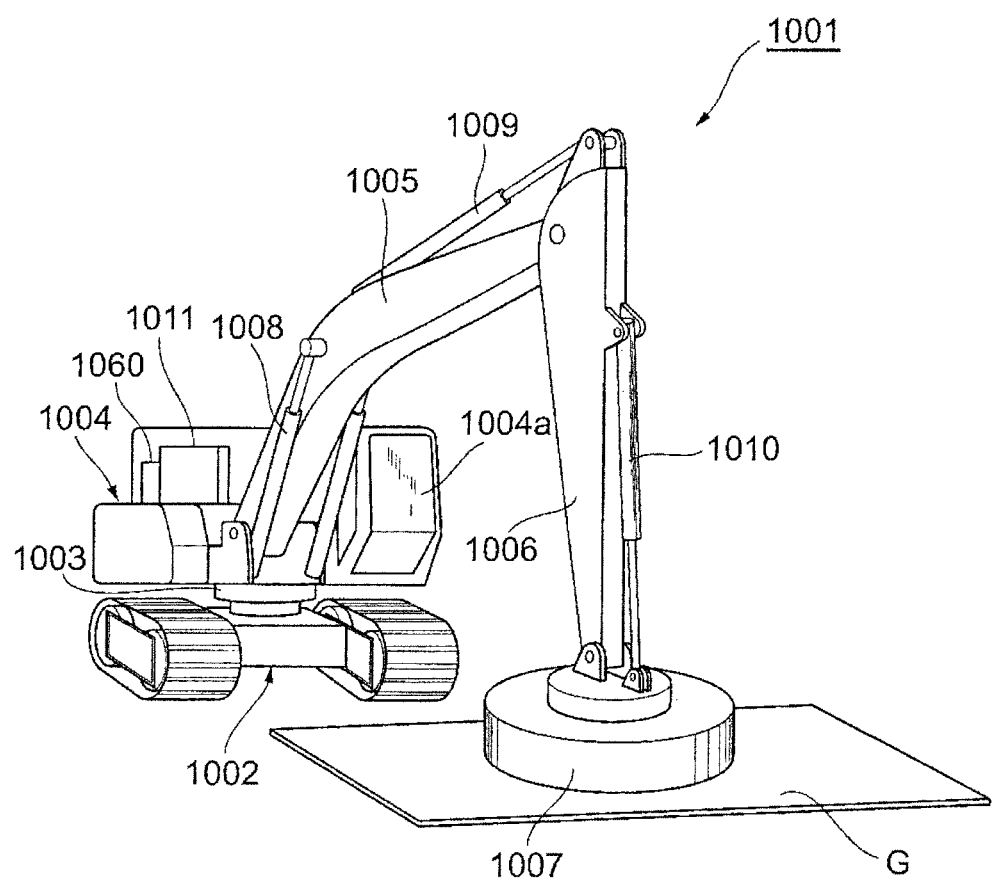
FIG. 14 is a perspective view showing the appearance of a hybrid type construction machine of still another example.

FIG. 14 is a perspective view showing the appearance of a hybrid type construction machine 1001 as an example of a working machine related to the present invention. As shown in FIG. 14, the hybrid type construction machine 1001 is a so-called lifting magnet vehicle and includes a traveling mechanism 1002 having an endless track and a revolving body 1004 which is rotatably mounted on the traveling mechanism 1002 with a rotary mechanism 1003 interposed therebetween. A boom 1005, an arm 1006 which is link-connected to the tip of the boom 1005, and a lifting magnet 1007 which is link-connected to the tip of the arm 1006 are fixed to the revolving body 1004. The lifting magnet 1007 is a facility for adsorbing and capturing a hoisted load G, such as steel, by the magnetic force. The boom 1005, the arm 1006, and the lifting magnet 1007 are hydraulically driven by a boom cylinder 1008, an arm cylinder 1009, and a bucket cylinder 1010, respectively. In addition, an operator's cabin 1004a, in which an operator who performs a position operation or an excitation operation and a release operation on the lifting magnet 1007 is located, or a power source, which is called an engine (internal combustion engine) 1011 for generating oil pressure, is provided in the revolving body 1004. The engine 1011 is a diesel engine, for example.

In addition, the hybrid type construction machine 1001 includes a servo control unit 1060. The servo control unit 1060 controls charging and discharging of an AC motor for driving the operating elements, such as the rotary mechanism 1003 and the lifting magnet 1007, a motor generator for assisting the engine 1011, and a battery. The servo control unit 1060 includes an inverter unit for driving an AC motor or a motor generator by converting DC power into AC power, a plurality of driver units called step-up and step-down converter units which control charging and discharging of a battery, and a control unit for controlling the plurality of driver units.

Figure 15:
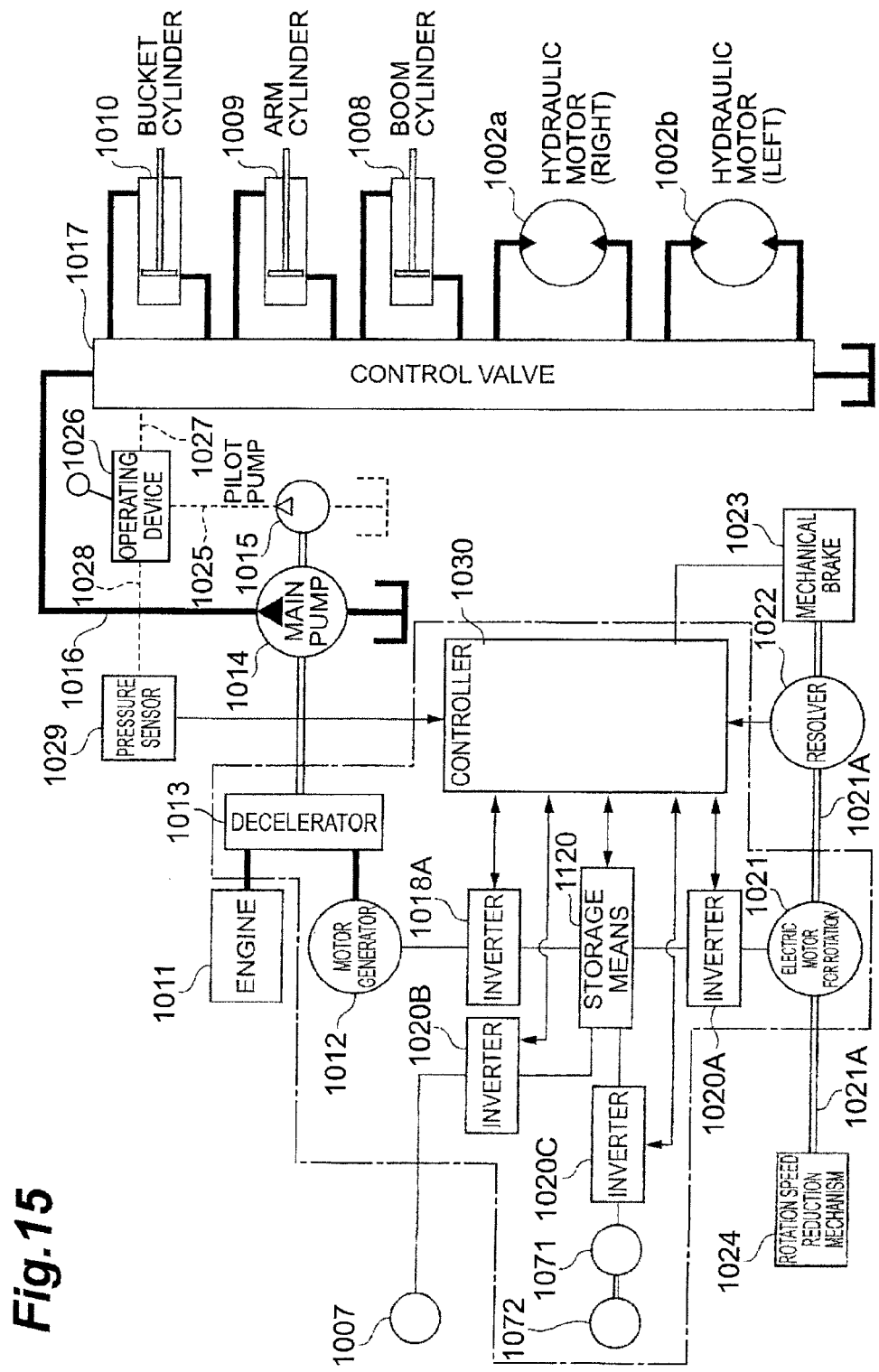
FIG. 15 is a block diagram showing the internal configuration called an electrical system or a hydraulic system of the hybrid type construction machine of still another example.
Figure 16:
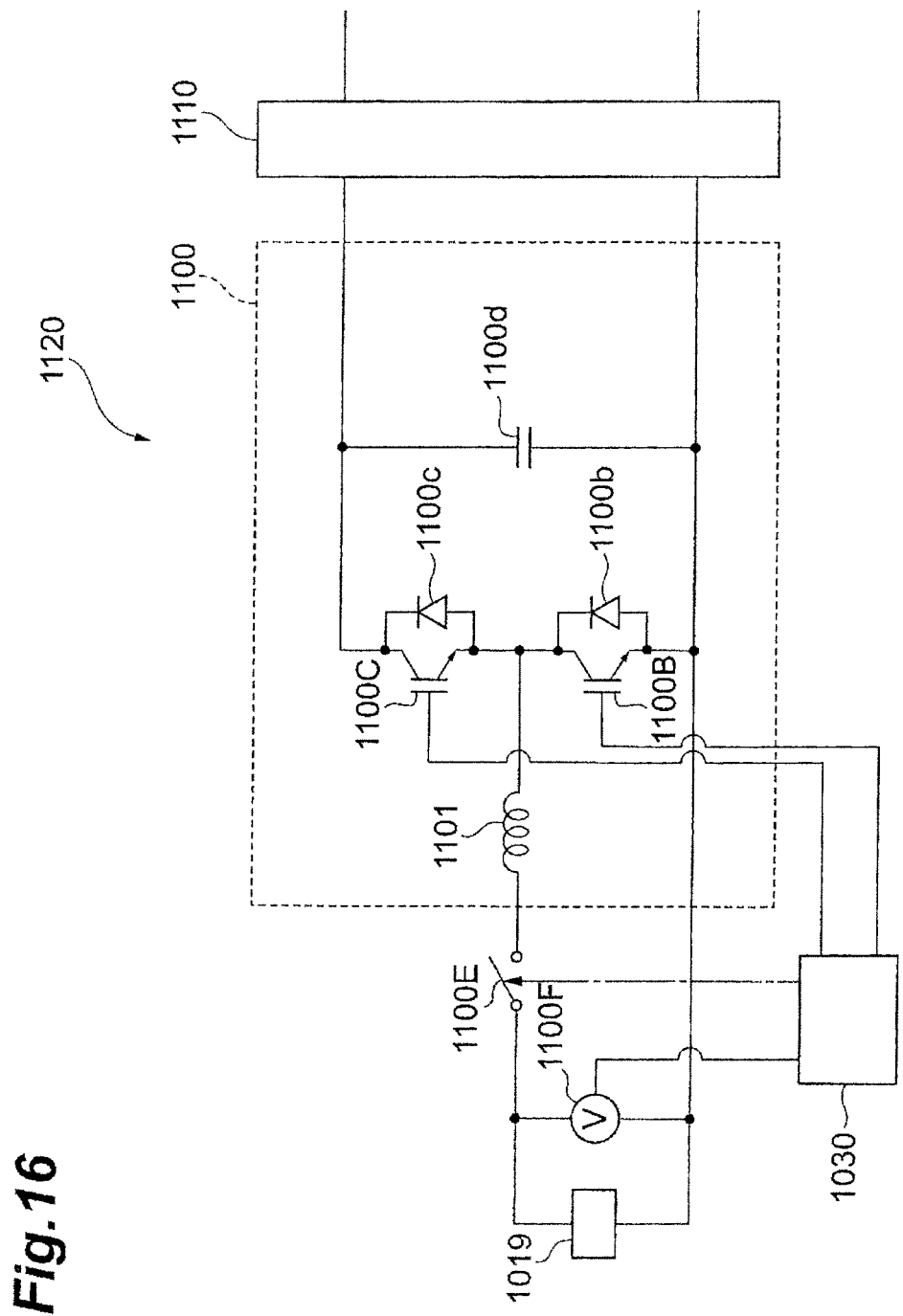
FIG. 16 is a view showing the internal configuration of a storage section in FIG. 15.

FIG. 15 is a block diagram showing the internal configuration of an electrical system or a hydraulic system of the hybrid type construction machine 1001 of the present example. Moreover, in FIG. 15, a system which transmits power mechanically, a hydraulic system, a control system, and an electrical system are indicated by a double line, a thick solid line, a broken line, and a thin solid line, respectively. In addition, FIG. 16 is a view showing the internal configuration of a storage section 1120 in FIG. 15.

As shown in FIG. 15, the hybrid type construction machine 1001 includes a motor generator 1012 and a decelerator 1013, and both rotary shafts of the engine 1011 and the motor generator 1012 are connected to each other by being connected to an input shaft of the decelerator 1013. When the load of the engine 1011 is large, the motor generator 1012 drives the engine 1011 as an operating element to assist a driving force of the engine 1011, so that the driving force of the motor generator 1012 is transmitted to the main pump 1014 through the output shaft of the decelerator 1013. On the other hand, when the load of the engine 1011 is small, the driving force of the engine 1011 is transmitted to the motor generator 1012 through the decelerator 1013 so that the motor generator 1012 performs power generation. For example, the motor generator 1012 may be formed by an IPM (Interior Permanent Magnetic) motor in which a magnet is embedded in a rotor. Switching between driving and power generation of the motor generator 1012 is performed according to the load of the engine 1011 or the like by a controller 1030 which performs driving control of the electrical system in the hybrid type construction machine 1001.

A main pump 1014 and a pilot pump 1015 are connected to the output shaft of the decelerator 1013, and a control valve 1017 is connected to the main pump 1014 through a high-pressure hydraulic system 1016. The control valve 1017 is a device which controls the hydraulic system in the hybrid type construction machine 1001. Not only hydraulic motors 1002*a* and 1002*b* for driving the traveling mechanism 1002 shown in FIG. 14 but also the boom cylinder 1008, the arm cylinder 1009, and the bucket cylinder 1010 are connected to the control valve 1017 through a high-pressure hydraulic line, and the control valve 1017 controls the oil pressure supplied to those described above according to a driver's operation input.

An output end of an inverter circuit 1018A is connected to an electric terminal of the motor generator 1012. The inverter circuit 1018A is a third inverter circuit in the present example. The storage section 1120 is connected to an input end of the inverter circuit 1018A. As shown in FIG. 16, the storage section 1120 includes a DC bus 1110 which forms a DC wiring line, a step-up and step-down converter (DC voltage converter) 1100, and a battery 1019. That is, an input end of the inverter circuit 1018A is connected to an input end of the step-up and step-down converter 1100 through the DC bus 1110. The battery 1019 is connected to an output end of the step-up and step-down converter 1100. The battery 1019 is formed by a capacitor type battery, for example.

The inverter circuit 1018A performs operation control of the motor generator 1012 according to a command from the controller 1030. That is, when the inverter circuit 1018A makes the motor generator 1012 perform power operation, required electric power is supplied from the battery 1019 and the step-up and step-down converter 1100 to the motor generator 1012 through the DC bus 1110. In addition, when the inverter circuit 1018A makes the motor generator 1012 perform regenerative operation, electric power generated by the motor generator 1012 is charged to the battery 1019 through the DC bus 1110 and the step-up and step-down converter 1100. In addition, switching control between step-up operation and step-down operation of the step-up and step-down converter 1100 is performed on the basis of the DC bus voltage value, the battery voltage value, and the battery current value by the controller 1030. Accordingly, the DC bus 1110 can be maintained in a state being electrically charged as a fixed voltage value set in advance.

The lifting magnet 1007 is connected to the DC bus 1110 of the storage section 1120 through an inverter circuit 1020B. The lifting magnet 1007 includes an electromagnet, which generates a magnetic force for adsorbing a metal material magnetically, and receives electric power from the DC bus 1110 through the inverter circuit 1020B. The inverter circuit 1020B supplies electric power requested to the lifting magnet 1007 from the DC bus 1110 according to a command from the controller 1030 when turning on an electromagnet. In addition, when turning off the electromagnet, the inverter circuit 1020B supplies the regenerated electric power to the DC bus 1110.

In addition, an inverter circuit 1020A is connected to the storage section 1120. An electric motor 1021 for rotation (AC motor) as an electric motor for operation (first electric motor) is connected to one end of the inverter circuit 1020A, and the other end of the inverter circuit 1020A is connected to the DC bus 1110 of the storage section 1120. The electric motor 1021 for rotation is a power source of the rotary mechanism 1003 which rotates the revolving body 1004. A resolver 1022, a mechanical brake 1023, and a rotation speed reduction mechanism 1024 are connected to a rotary shaft 1021A of the electric motor 1021 for rotation. In addition, the inverter circuit 1020A is a first inverter circuit in the present example.

When the electric motor 1021 for rotation performs power operation, torque of the rotational driving force of the electric motor 1021 for rotation is amplified by the rotation speed reduction mechanism 1024, and the revolving body 1004 performs rotational operation by acceleration and deceleration control. Moreover, by inertial rotation of the revolving body 1004, the number of revolutions in the rotation speed reduction mechanism 1024 is increased and is transmitted to the electric motor 1021 for rotation so that regenerative power is generated. The electric motor 1021 for rotation is AC-driven by the inverter circuit 1020A using a PWM (Pulse Width Modulation) control signal. As the electric motor 1021 for rotation, for example, a magnet embedded type IPM motor is suitable.

The resolver 1022 is a sensor which detects the rotation position and the rotation angle of the rotary shaft 1021A of the electric motor 1021 for rotation. The resolver 1022 is mechanically connected with the electric motor 1021 for rotation in order to detect the rotation angle and the rotation direction of the rotary shaft 1021A. By detecting the rotation angle of the rotary shaft 1021A using the resolver 1022, the rotation angle and the rotation direction of the rotary mechanism 1003 are derived. The mechanical brake 1023 is a braking device which generates a mechanical braking force and stops the rotary shaft 1021A of the electric motor 1021 for rotation mechanically according to a command from the controller 1030. The rotation speed reduction mechanism 1024 is a decelerator which reduces the rotation speed of the rotary shaft 1021A of the electric motor 1021 for rotation and mechanically transmits it to the rotary mechanism 1003.

In addition, the motor generator 1012, the electric motor 1021 for rotation, and the lifting magnet 1007 are connected to the DC bus 1110 through the inverter circuits 1018A, 1020A, and 1020B, respectively. Accordingly, electric power generated by the motor generator 1012 may be directly supplied to the lifting magnet 1007 or the electric motor 1021 for rotation, electric power regenerated by the lifting magnet 1007 may be supplied to the motor generator 1012 or the electric motor 1021 for rotation, and electric power regenerated by the electric motor 1021 for rotation may be supplied to the motor generator 1012 or the lifting magnet 1007.

Since the inverter circuits 1018A, 1020A, and 1020B control large amount of electric power, the amount of heat generation is very large. Moreover, also in a reactor 1101 (see FIG. 3) included in the step-up and step-down converter 1100, the amount of heat generation is large. Accordingly, it is necessary to cool the inverter circuits 1018A, 1020A, and 1020B and the step-up and step-down converter 1100. Therefore, the hybrid type construction machine 1001 of the present example includes a coolant circulation system 1070 for cooling the step-up and step-down converter 1100 and the inverter circuits 1018A, 1020A, and 1020B separately from a coolant circulation system for the engine 1011.

The coolant circulation system 1070 includes a pump 1072 for circulating the coolant, which is supplied to the step-up and step-down converter 1100, the inverter circuits 1018A, 1020A, and 1020B, and the like, and a pump motor (electric motor for cooling) 1071 which drives the pump 1072. The pump motor 1071 is also a second electric motor in the present example. The pump motor 1071 is connected to the storage section 1120 through an inverter circuit 1020C. The inverter circuit 1020C is a second inverter circuit in the present example. The inverter circuit 1020C supplies electric power, which is requested to the pump motor 1071 when cooling the step-up and step-down converter 1100, according to a command from the controller 1030. The coolant circulation system 1070 of the present example cools the step-up and step-down converter 1100, the inverter circuits 1018A, 1020A, and 1020B, and the controller 1030. In addition, the coolant circulation system 1070 cools the motor generator 1012, the decelerator 1013, and the electric motor 1021 for rotation.

An operating device 1026 is connected to the pilot pump 1015 through a pilot line 1025. The operating device 1026 is an operating device for operating the electric motor 1021 for rotation, the traveling mechanism 1002, the boom 1005, the arm 1006, and the lifting magnet 1007, and is operated by an operator. The control valve 1017 is connected to the operating device 1026 through a hydraulic line 1027, and a pressure sensor 1029 is connected to the operating device 1026 through a hydraulic line 1028. The operating device 1026 converts the oil pressure (oil pressure on the primary side), which is supplied through the pilot line 1025, into the oil pressure (oil pressure on the secondary side) according to the amount of operation of the operator and outputs it. The oil pressure on the secondary side output from the operating device 1026 is supplied to the control valve 1017 through the hydraulic line 1027 and is also detected a pressure sensor 1029. Here, the electric motor 1021 for rotation as an electric motor for operation is mentioned. However, the traveling mechanism 1002 may be electrically driven as an electric motor for operation. Moreover, when the present invention of this application is applied to a forklift, a lifting device may be electrically driven as an electric motor for operation.

When an operation for rotating the rotary mechanism 1003 with respect to the operating device 1026 is input, the pressure sensor 1029 detects the amount of operation as a change of oil pressure in the hydraulic line 1028. The pressure sensor 1029 outputs an electrical signal indicating the oil pressure in the hydraulic line 1028. The electrical signal is input to the controller 1030 and is used for driving control of the electric motor 1021 for rotation.

The controller 1030 forms a control unit in the present example. The controller 1030 is formed by an arithmetic processing unit including a CPU and an internal memory, and is realized when the CPU executes a program for driving control stored in the internal memory. In addition, a power source of the controller 1030 is a separate battery (for example, a 24 V in-vehicle battery) from the battery 1019. The controller 1030 converts a signal, which indicates the amount of operation for rotating the rotary mechanism 1003, among signals input from the pressure sensor 1029 into a speed command and performs driving control of the electric motor 1021 for rotation. In addition, the controller 1030 controls charging and discharging of the battery 1019 by performing operation control (switching between assistant operation and power generation operation) of the motor generator 1012, driving control (switching between excitation and degaussing) of the lifting magnet 1007, and driving control of the step-up and step-down converter 1100.

In addition, the controller 1030 of the present example has a discharge mode for discharging electric power which is stored in the battery 1019 when executing the maintenance of the hybrid type construction machine 1001 and the like. In this discharge mode, the controller 1030 stops all of the inverter circuits 1018A, 1020A, and 1020B while making the pump motor 1071 consume electric power by driving the inverter circuit 1020C, so that the battery 1019 is discharged. The start of the discharge mode is determined by an operator through an operation panel in the operator's cabin 1004a (see FIG. 14).

Here, the step-up and step-down converter 1100 in the present example will be described in detail. As shown in FIG. 16, the step-up and step-down converter 1100 uses a step-up and step-down type switching control method, and includes the reactor 1101, transistors 1100B and 1100C, and a smoothing capacitor 1100d. The transistor 1100B is a step-up switching element, and the transistor 1100C is a step-down switching element. For example, the transistors 1100B and 1100C are formed by IGBT (Insulated Gate Bipolar transistor) and are connected in series to each other.

Specifically, a collector of the transistor 1100B and an emitter of the transistor 1100C are connected to each other, an emitter of the transistor 1100B is connected to a negative terminal of the battery 1019 and a negative side wiring line of the DC bus 1110, and a collector of the transistor 1100C is connected to a positive side wiring line of the DC bus 1110. Moreover, one end of the reactor 1101 is connected to the collector of the transistor 1100B and the emitter of the transistor 1100C, the other end is connected to a positive side terminal of the battery 1019 through a switch 1100E. A PWM voltage from the controller 1030 is applied to gates of the transistors 1100B and 1100C. A connection state of the switch 1100E is controlled by a command from the controller 1030.

In addition, a diode 1100b which is a rectifying element is connected in the reverse direction and in parallel between the collector and the emitter of the transistor 1100B. Similarly, a diode 1100c is connected in the reverse direction and in parallel between the collector and the emitter of the transistor 1100C. The smoothing capacitor 1100d is connected between the collector of the transistor 1100C and the emitter of the transistor 1100B and smoothes the output voltage from the step-up and step-down converter 1100. Between the positive and negative terminals of the battery 1019, a voltage sensor 1100F for detecting the voltage between both ends of the battery 1019 is provided. A result of voltage detection by the voltage sensor 1100F is supplied to the controller 1030.

In the step-up and step-down converter 1100 with such a configuration, when supplying DC power from the battery 1019 to the DC bus 1110, a PWM voltage is applied to the gate of the transistor 1100B according to a command from the controller 1030, the induced electromotive force generated in the reactor 1101 according to ON/OFF of the transistor 1100B is transmitted through the diode 1100c, and the electric power is smoothed by the capacitor 1100d. In addition, when supplying DC power from the DC bus 1110 to the battery 1019, a PWM voltage is applied to the gate of the transistor 1100C according to a command from the controller 1030 and a current output from the transistor 1100C is smoothed by the reactor 1101. Moreover, in the discharge mode, the controller 1030 controls neither of the transistors 1100B and 1100C, and electric power stored in the battery 1019 is transmitted to the DC bus 1110 through the diode 1100c.

Figure 17:
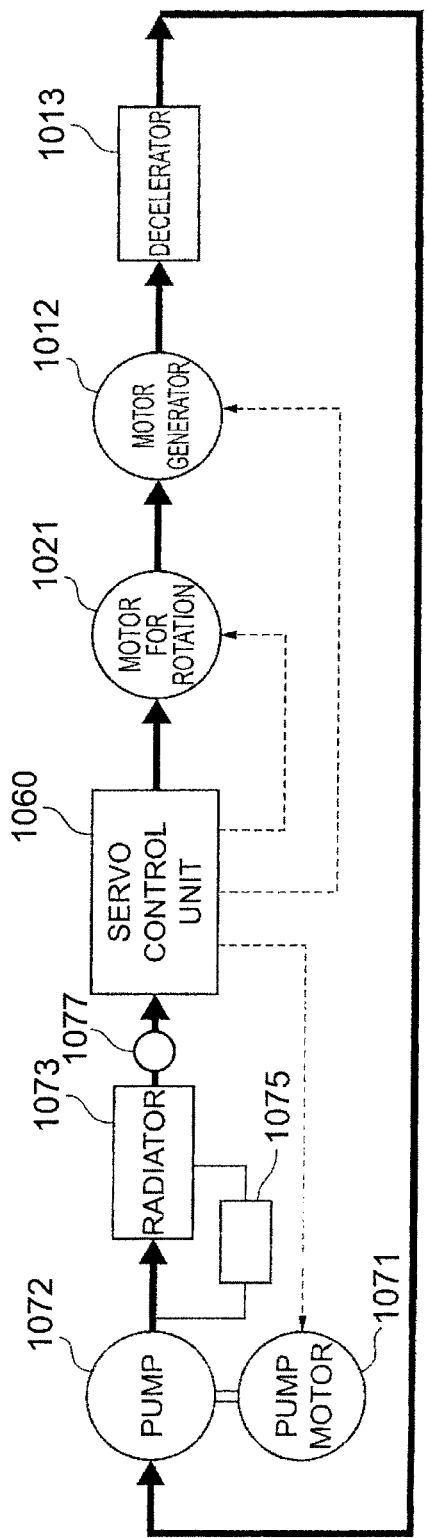
FIG. 17 is a block diagram of a coolant circulation system.

FIG. 17 is a block diagram for explaining the coolant circulation system 1070. As shown in FIG. 17, the coolant circulation system 1070 includes the pump 1072 driven by the pump motor 1071, a radiator 1073, and the servo control unit

1060. The coolant circulated by the pump 1072 is heat-radiated by the radiator 1073 and is then sent to the servo control unit 1060. The servo control unit 1060 has a pipe for cooling the step-up and step-down converter 1100, the inverter circuits 1018A, 1020A, and 1020B, and the controller 1030, and the coolant circulates through the inside of the pipe. The coolant having passed through the pipe of the servo control unit 1060 cools the electric motor 1021 for rotation, the motor generator 1012, and the decelerator 1013 in this order and then returns from the pump 1072 to the radiator 1073. In addition, it is preferable to provide a temperature sensor 1077 for detecting the temperature of the coolant at the inlet of the servo control unit 1060. In addition, it is preferable to provide a display device which displays the detected temperature. In this case, if the radiator clogs 1073 to lower the cooling capability, outputs of the electric motor 1021 for rotation and the motor generator 1012 (or one of these) can be restricted on the basis of the temperature detection value. As a result, since continuous operation becomes possible, continuous working becomes possible without stopping the hybrid type construction machine 1001.

Figure 18:
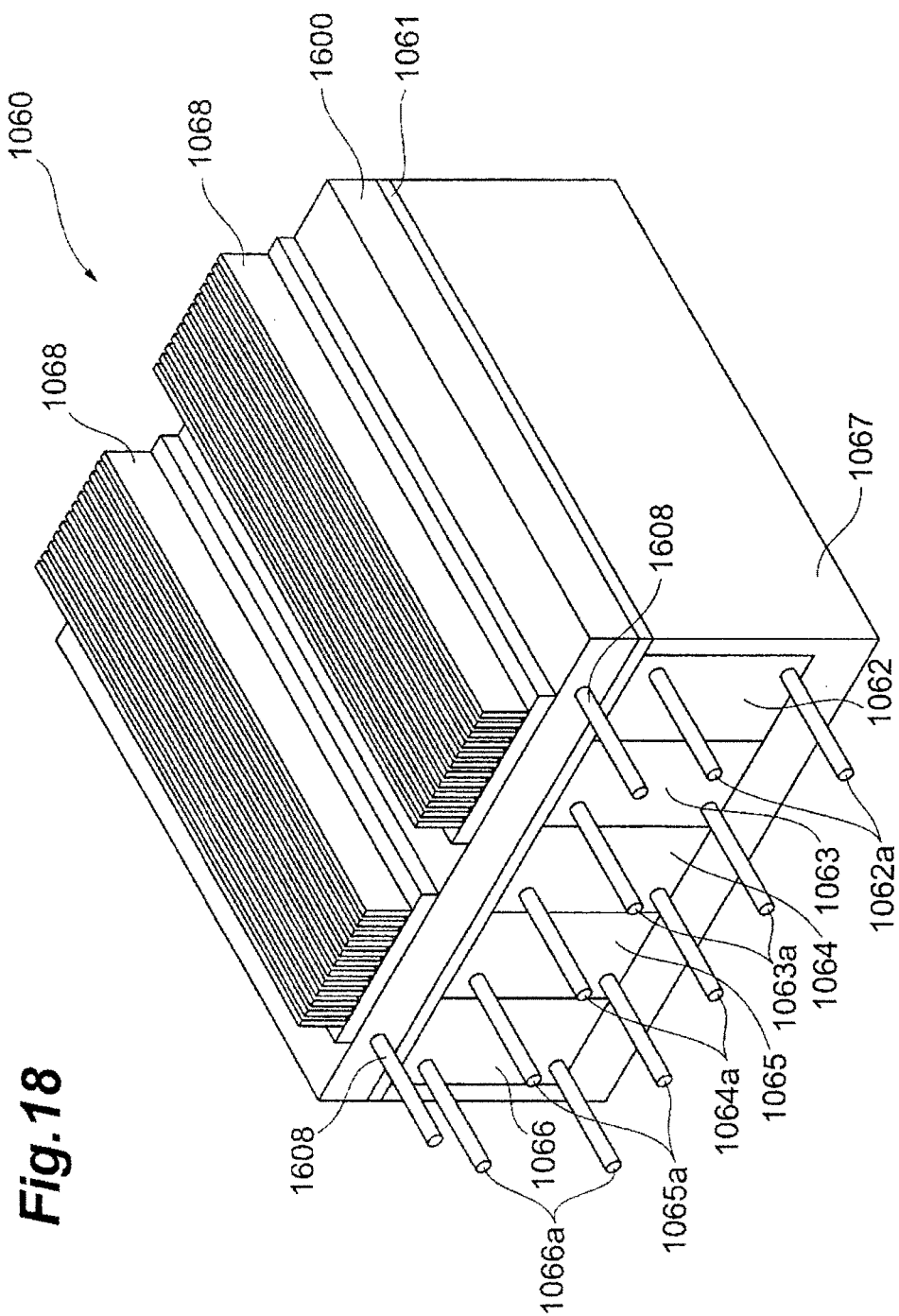
FIG. 18 is a perspective view of a servo control unit.

Next, the servo control unit 1060 will be described with reference to FIG. 18. FIG. 18 is a perspective view showing the appearance of the servo control unit 1060. The servo control unit 1060 has an approximately rectangular parallelepiped appearance and includes a control unit 1600, which has the controller 1030, a step-up and step-down converter unit 1066, and inverter units 1062 to 1065. The step-up and step-down converter unit 1066 has the step-up and step-down converter 1100, and the inverter units 1062 to 1065 have the inverter circuits 1018A, 1020A, and 1020B and other inverter circuits.

Each of the step-up and step-down converter unit 1066 and the inverter units 1062 to 1065 has a metal container with a rectangular parallelepiped shape which is long in the depth direction. These units 1062 to 1066 are provided in a plate-shaped pedestal 1067, which is formed of metal and a top surface of which is opened, in a state located side by side in a direction perpendicular to their longitudinal directions and, each of the units 1062 to 1066 is fixed to the pedestal 1067 with a bolt. On these units 1062 to 1066, a control unit low plate 1061 as a top cover is provided so as to cover the upper surfaces of the units 1062 to 1066. On the control unit low plate 1061, the control unit 1600 is placed. In addition, a heat sink 1068 for air cooling is fixed to the upper surface of the control unit 1600. The upper surface sides of the units 1062 to 1066 are sealed by the control unit low plate 1061.

The control unit 1600 has a controller for controlling the step-up and step-down converter unit 1066 and the inverter units 1062 to 1065. The controller has an arithmetic processing unit including a CPU and an internal memory, and is realized when the CPU executes a program for driving control stored in the internal memory.

In addition, a cooling pipe 1608 is provided in the control unit 1600. Similarly, a cooling pipe 1066a is provided in the step-up and step-down converter unit 1066, and cooling pipes 1062a to 1065a are provided in the inverter units 1062 to 1065, respectively.

Figure 19:
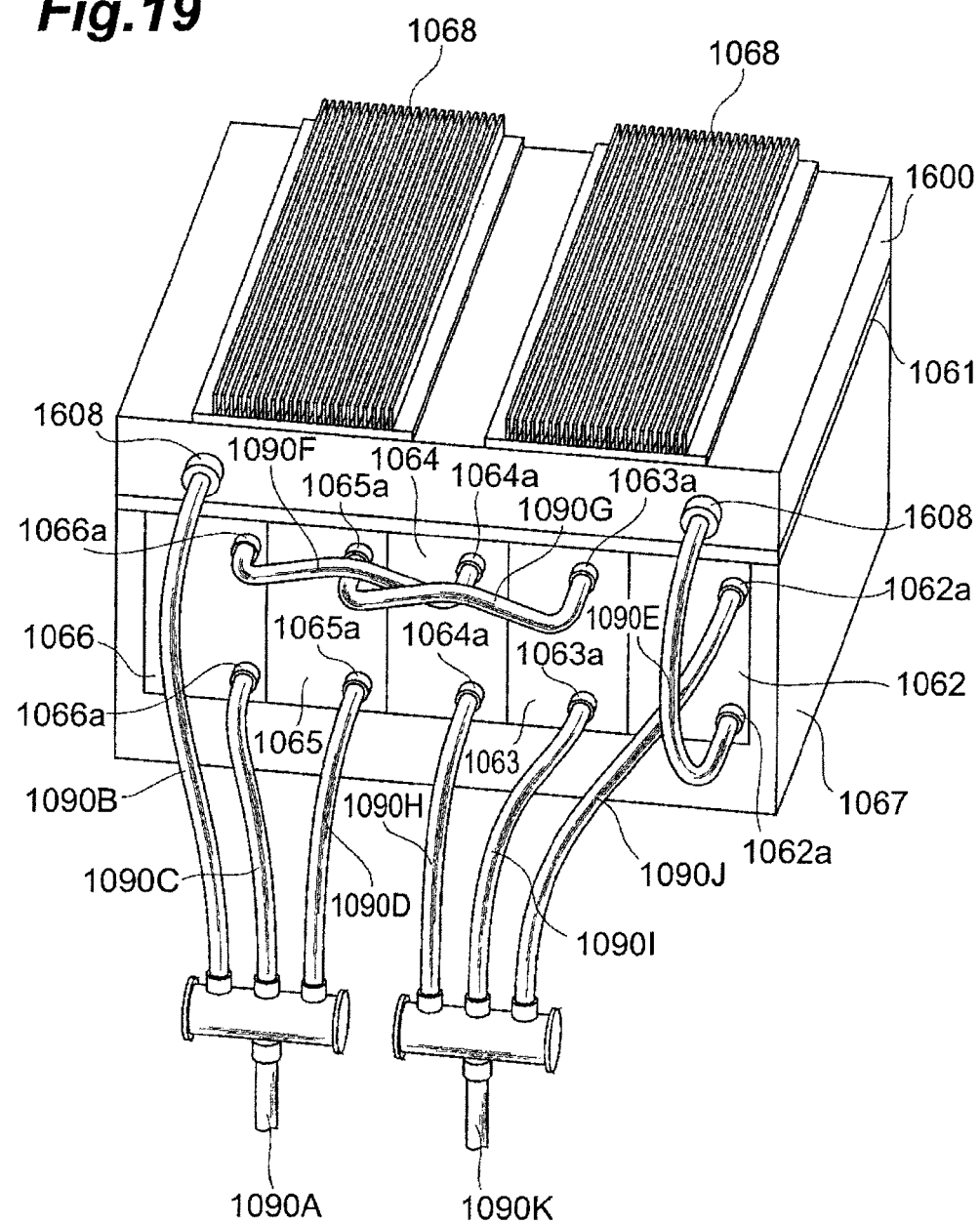
FIG. 19 is a perspective view showing a state where each cooling pipe is connected.

FIG. 19 is a perspective view showing a state where the cooling pipes 1062a to 1066a are connected. A pipe 1090A provided to extend from the radiator 1073 (see FIG. 17) branches into three pipes 1090B to 1090D. Among these pipes, the pipe 1090B is connected to one end of the cooling pipe 1608 of the control unit 1600, and the other end of the cooling pipe 1608 is connected to one end of the cooling pipe 1062a of the inverter unit 1062 through another pipe 1090E. In addition, the pipe 1090C is connected to one end of the cooling pipe 1066a of the step-up and step-down converter unit 1066, and the other end of the cooling pipe 1066a is connected to one end of the cooling pipe 1064a of the inverter unit 1064 through another pipe 1090F. In addition, the pipe 1090D is connected to one end of the cooling pipe 1065a of the inverter unit 1065, and the other end of the cooling pipe 1065a is connected to one end of the cooling pipe 1063a of the inverter unit 1063 through a pipe 1090G.

In addition, pipes 1090J, 1090I, and 1090H are connected to the other ends of the cooling pipes 1062a to 1064a of the inverter units 1062 to 1064, respectively. The pipes 1090J, 1090I, and 1090H are connected to one pipe 1090K. The pipe 1090K is provided to extend to other elements to be cooled, such as the electric motor 1021 for rotation.

Figure 20:
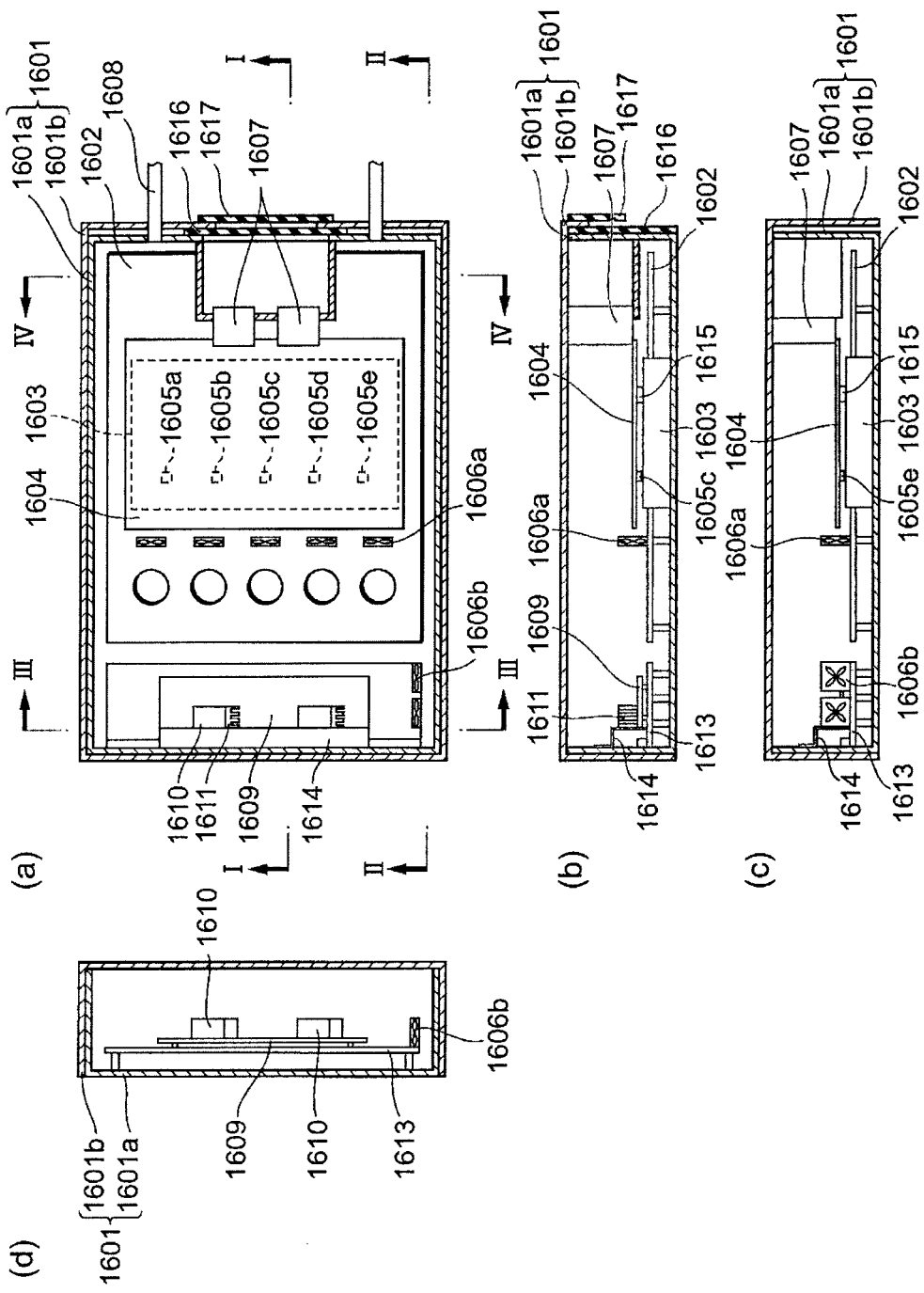
FIG. 20A is a planar sectional view of a control unit.
FIG. 20B is a side sectional view taken along the line I-I in FIG. 20A.
FIG. 20C is a side sectional view taken along the line II-II in FIG. 20A.
FIG. 20D is a side sectional view taken along the line III-III in FIG. 20A.
Figure 21:
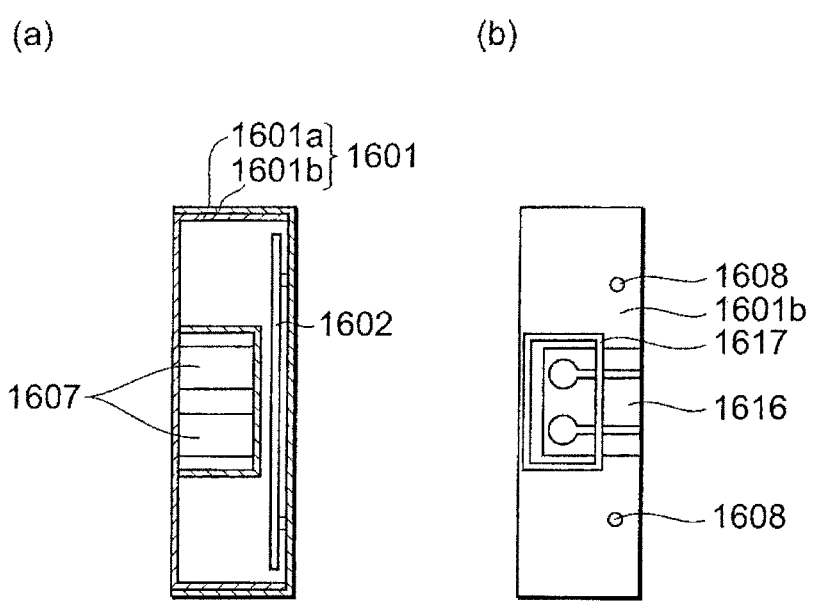
FIG. 21A is a side sectional view taken along the line IV-IV in FIG. 20A.
FIG. 21B is a side view when viewing the control unit from the same direction as in FIG. 21A.

Next, the configuration of the control unit 1600 will be described in detail. FIG. 20A is a planar sectional view of the control unit 1600, FIG. 20B is a side sectional view taken along the line I-I in FIG. 20A, FIG. 20C is a side sectional view taken along the line II-II in FIG. 20A, and FIG. 20D is a side sectional view taken along the line in FIG. 20A. In addition, FIG. 21A is a side sectional view taken along the line IV-IV in FIG. 20A, and FIG. 21B is a side view when viewing the control unit 1600 from the same direction as in FIG. 21A.

The control unit 1600 has a housing 1601 which includes a housing container 1601a and a housing cover 1601b, and an electronic circuit and the like of a controller are housed in the housing 1601.

The housing 1601 of the control unit 1600 has a rectangular parallelepiped appearance and is provided on the step-up and step-down converter unit 1066 and the inverter units 1062 to 1065 which are a plurality of driver units. In addition, the housing 1601 has an approximately rectangular parallelepiped inner space on the bottom surface which has an approximately rectangular planar shape. This inner space is blocked from the ambient air, and the housing 1601 of the control unit 1600 has a sealed structure. In addition, a direction in which the units 1062 to 1066 are arrayed is equal to the short side direction of the control unit 600, and this direction is equivalent to a vertical direction with respect to the plane in FIG. 20A. In addition, a direction perpendicular to the direction in which the plurality of units 1062 to 1066 are arrayed is equal to the longitudinal direction of the control unit 1600, and this direction is equivalent to a horizontal direction with respect to the plane in FIG. 20A.

On the bottom surface in the housing 1601, a card plate 1602 with a rectangular planar shape is provided. The card plate 1602 is disposed in a state where the longitudinal direction and the short side direction of the card plate 1602 match the longitudinal direction and the short side direction of the control unit 1600, respectively. An opening with an approximately rectangular planar shape is provided in the card plate 1602.

In the opening of the card plate 1602, a heat sink (thermally conductive plate) 1603 which has a planar shape, which is approximately the same shape as the opening, and also has an approximately rectangular parallelepiped appearance is provided on the bottom surface in the housing 1601. The heat sink 1603 is for cooling electronic components provided in the housing 1601 and is provided such that the cooling pipe 1608 is thermally coupled (for example, contacted) with the heat sink 1603. The heat sink 1603 is cooled by the coolant which circulates through the cooling pipe 1608. The coolant is water, for example.

On the heat sink 1603, a control card 1604 which has an approximately rectangular planar shape is provided. The control card 1604 is a substrate on which various electronic components are mounted and is disposed such that the back surface faces the heat sink 1603. On the back surface of the control card 1604, a plurality of CPUs 1605*a* to 1605*e* is mounted as examples of electronic components. The plurality of CPUs 1605*a* to 1605*e* corresponds to the plurality of units 1062 to 1066 in a one-to-one manner and controls ON/OFF of a transistor included in an inverter circuit of a corresponding unit of the units 1062 to 1066. In addition, the plurality of CPUs 1605*a* to 1605*e* is thermally coupled with the heat sink 1603. That is, the heat sink 1603 is disposed between the plurality of CPUs 1605*a* to 1605*e* and the cooling pipe 1608.

On the card plate 1602, a plurality of fans 1606*a* is arrayed in the short side direction of the control unit 1600. The plurality of fans 1606*a* is provided corresponding to the CPUs 1605*a* to 1605*e* in order to eliminate the temperature gradient in the housing by churning the air, which is heated by the heat generated in the CPUs 1605*a* to 1605*e*, and generates the airflow which moves toward each of the CPUs 1605*a* to 1605*e*.

On the bottom surface in the housing 1601, a card plate 1613 with a rectangular planar shape is further provided together with the card plate 1602. A power card 1609 is provided on the card plate 1613. Two power supply ICs (power supply units) 1610 are provided on the power card 1609. A heat sink 1611 for air-cooling of the power supply IC is provided in each power supply IC 1610. In addition, a thermally conductive plate 1614 is provided so as to be in contact with the internal surface of the housing 1601, and the power supply IC 1610 and the heat sink 1611 are in contact with the surface of the thermally conductive plate 1614. Accordingly, it is possible to radiate a part of the heat generated in the power supply IC 1610. In addition, two fans 1606*b* are provided on the card plate 1613. These fans 1606*b* are provided in order to eliminate the temperature gradient in the housing by churning the air, which is heated by the heat generated in the power supply IC 1610, and generates the airflow which moves toward power supply IC 1610.

I/O sections of electronic components mounted on the control card 1604 are connected to a connector 1607. For example, command signals for operating the units 1062 to 1066, output signals from electronic components, and the like are input or output through the connector 1607. The connector 1607 is connected with, for example, a control unit (not shown) for controlling the servo control unit 1060, by a wire.

The connector 1607 is provided in a recessed hollow portion on the side surface of the housing 1601, and the hollow portion is covered with a packing 1616. The packing 1616 is covered with a packing pressure member 1617 through a housing cover 1601*b*. Protection of the connector 1607 against water and dust is realized by the packing 1616.

Figure 22:
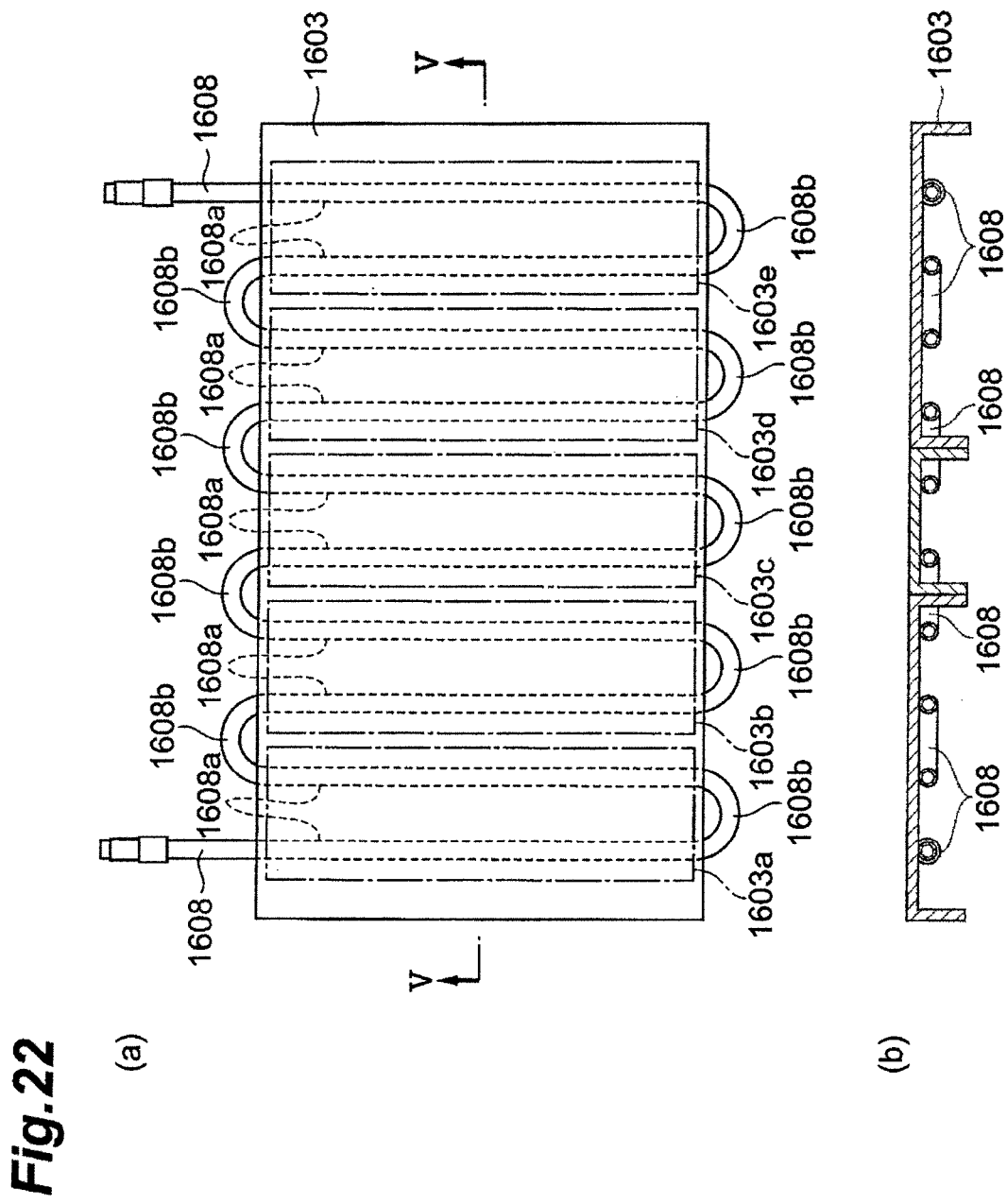
FIG. 22A is a plan view showing a heat sink and a cooling pipe.
FIG. 22B is a side sectional view taken along the line V-V in FIG. 22A.
Figure 23:
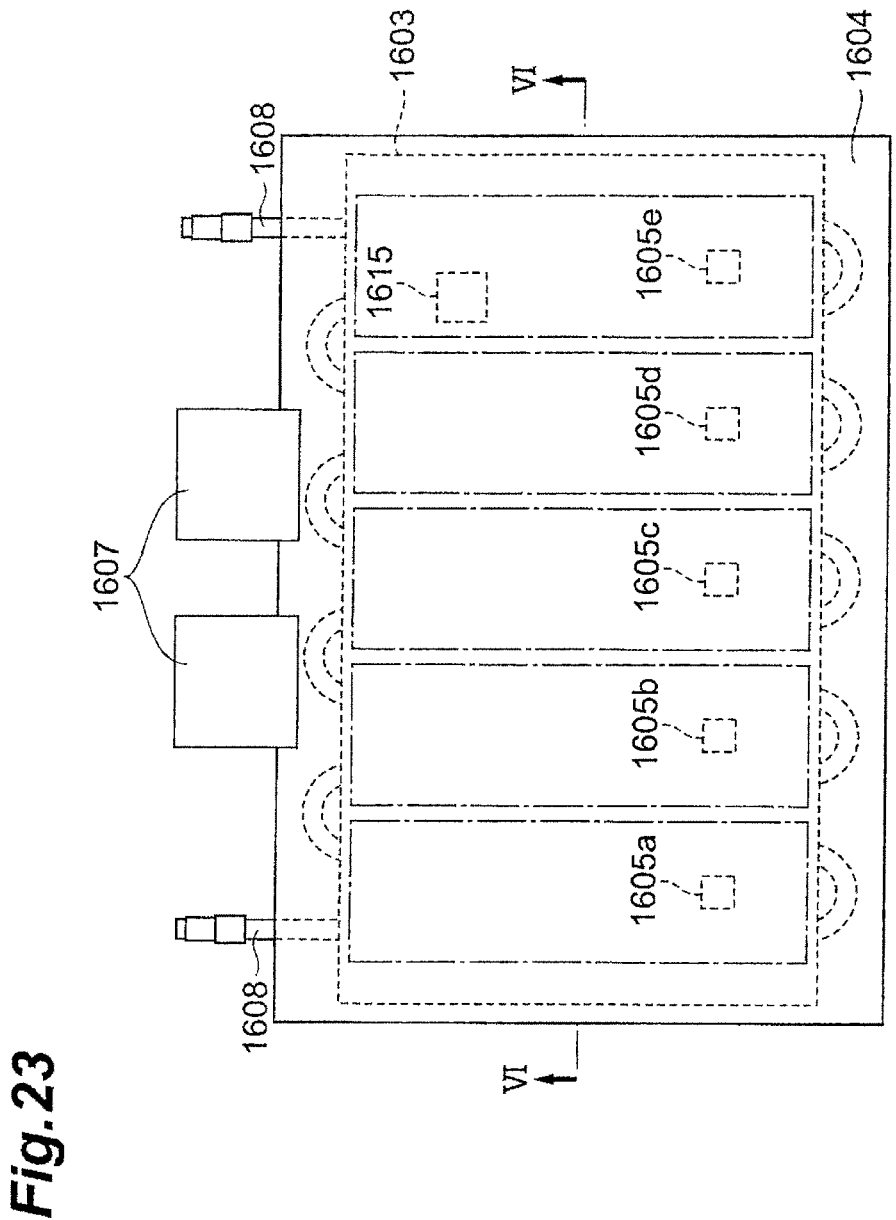
FIG. 23 is a plan view showing a control card disposed to cover the heat sink and the cooling pipe.
Figure 24:
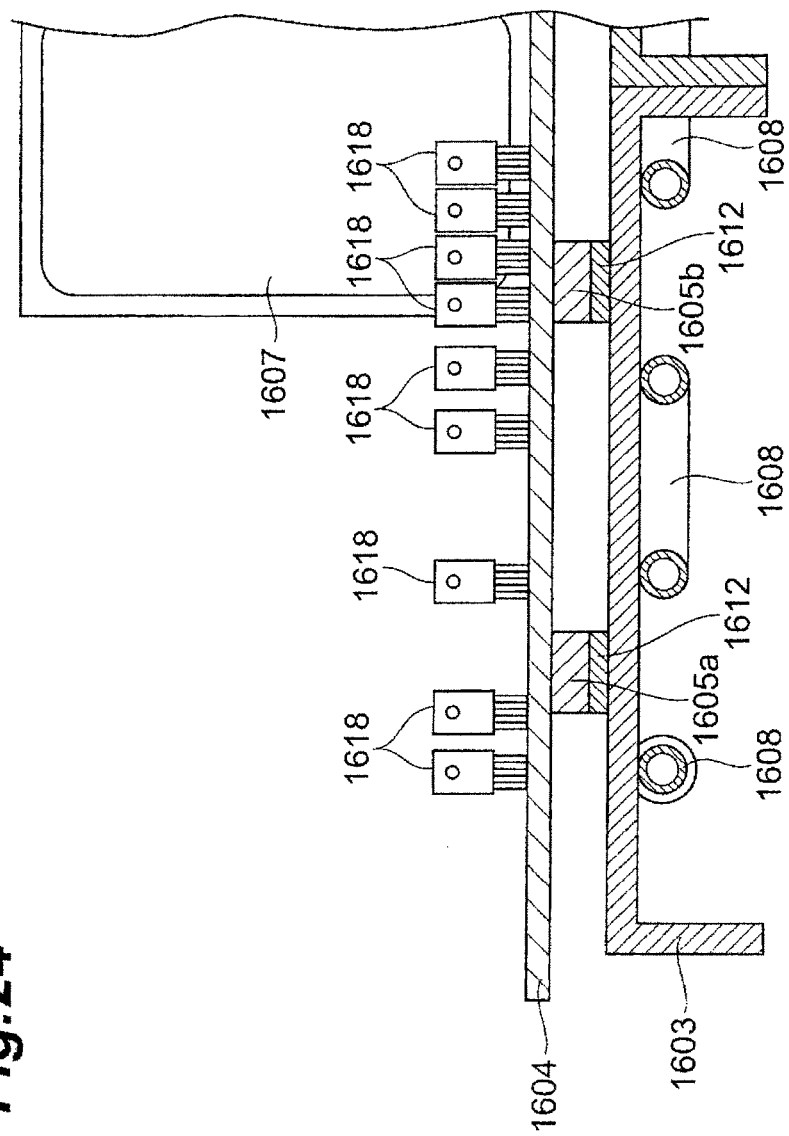
FIG. 24 is a side sectional view showing a part of the section taken along the line VI-VI in FIG. 23.

Here, a water cooling structure in the control unit 1600 will be described in detail. FIGS. 22A to 24 are views showing a cooling structure. FIG. 22A is a plan view showing the heat sink 1603 and the cooling pipe 1608, and FIG. 22B is a side sectional view taken along the line V-V in FIG. 22A. In addition, FIG. 23 is a plan view showing the control card 1604 disposed to cover the heat sink 1603 and the cooling pipe 1608. In addition, FIG. 24 is a side sectional view showing a part of the section taken along the line VI-VI in FIG. 23.

As shown in FIG. 22A and FIG. 22B, the cooling pipe 1608 in the present example is formed in a hairpin pipe shape and is bonded and fixed to the back surface side of the heat sink 1603. More specifically, the cooling pipe 1608 is configured to include a plurality of pipe portions 1608*a*. The plurality of pipe portions 1608*a* extends in the short side direction of the heat sink 1603 and is provided in parallel at predetermined distances therebetween in the longitudinal direction of the heat sink 1603 crossing the short side direction. Moreover, one ends and the other ends of the plurality of pipe portions 1608*a* are alternately connected in a U shape to the pipe portions 1608*b*, thereby forming a single pipe as a whole.

The heat sink 1603 has a plurality of cooling regions 1603*a* to 1603*e* with rectangular shapes which extends in the short side direction of the heat sink 1603 and are located side by side in the longitudinal direction of the heat sink 1603. Each of the plurality of cooling regions 1603*a* to 1603*e* is thermally coupled with two adjacent pipe portions 1608*a* among the plurality of pipe portions 1608*a*. In other words, each of the plurality of cooling regions 1603*a* to 1603*e* is demarcated to include two pipe portions 1608*a* when viewed from above.

Moreover, referring to FIGS. 23 and 24, the plurality of CPUs 1605*a* to 1605*e* is mounted on the back surface of the control card 1604 and a plurality of electrical components including an electric contact 1618 for generating an electrical signal to an electromagnetic valve or the like is disposed on the top surface, as described above. In addition, the plurality of CPUs 1605*a* to 1605*e* are connected by a pattern wire formed on the control card 1604 so that communications can be performed. These CPUs 1605*a* to 1605*e* are arrayed side by side in the longitudinal direction of the heat sink 1603 and are also arrayed on the cooling regions 1603*a* to 1603*e* of the heat sink 1603, respectively. In addition, the CPU 1605*a* is thermally coupled with the cooling region 1603*a* of the heat sink 1603 through a thermally conductive sheet 1612, and the CPU 1605*b* is thermally coupled with the cooling region 1603*b* through the thermally conductive sheet 1612 (see FIG. 24). Similarly, the CPUs 1605*c* to 1605*e* are thermally coupled with the cooling regions 1603*c*-1603*e* through thermally conductive sheets, respectively. That is, in the present example, each of the plurality of CPUs 1605*a* to 1605*e* is thermally coupled with one cooling region.

In addition, a CPU 1615 which is different from the CPUs 1605*c* to 1605*e* may be mounted on the control card 1604, for example, as shown in FIG. 23. For example, this CPU 1615 is a host CPU for performing overall control of the plurality of CPUs 1605*a* to 1605*e*. Since the amount of heat generation of such a CPU 1615 is not large compared with those of the CPUs 1605*e* to 1605*e* which control an inverter circuit and the like, the CPU 1615 is disposed at an arbitrary position on the control card 1604 irrespective of the cooling regions 1603*c* to 1603*e*.

Moreover, as described above, the CPUs 1605*a* to 1605*e* are thermally coupled with the heat sink 1603 through the thermally conductive sheet 1612 disposed between the CPUs 1605*a* to 1605*e* and the heat sink 1603. It is preferable that the thermally conductive sheet 1612 contains an elastic material which can absorb the vibration transmitted from the heat sink 1603 to the CPUs 1605*a* to 1605*e*. For example, silicone rubber is used.

Figure 25:
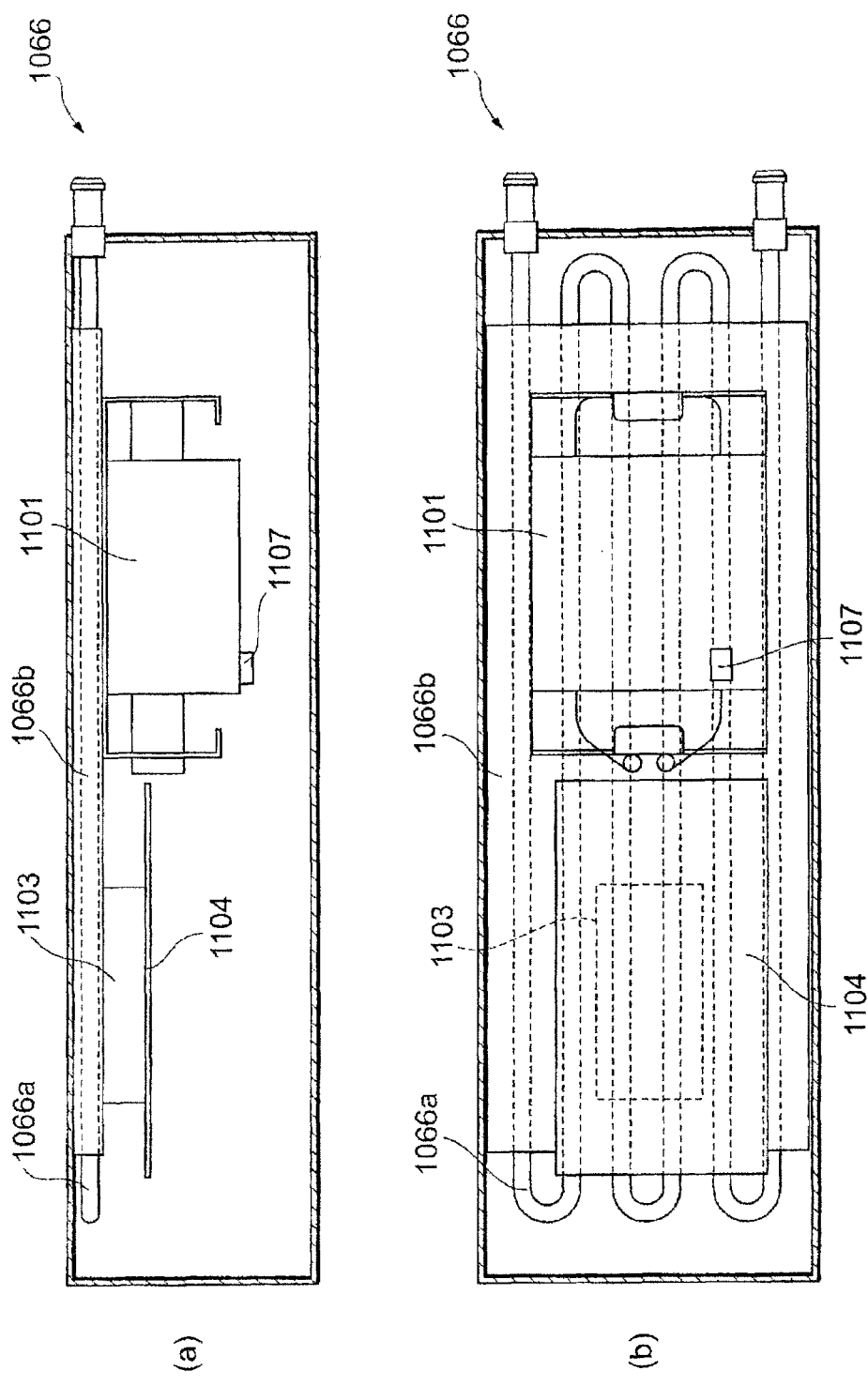
FIG. 25A is a plan view showing the internal configuration of a step-up and step-down converter unit.
FIG. 25B is a side view showing the internal configuration of a step-up and step-down converter unit.

Then, a water cooling structure in the step-up and step-down converter unit 1066 and the inverter units 1062 to 1065 will be described in detail. FIG. 25A is a plan view showing the internal configuration of the step-up and step-down converter unit 1066. In addition, FIG. 25B is a side view showing the internal configuration of the step-up and step-down converter unit 1066. Moreover, FIGS. 25A and 25B show states where a top plate or a side plate of the case is removed so that the internal configuration of the step-up and step-down converter unit 1066 can be understood.

An intelligent power module (IPM) 1103 in which the transistors 1100B and 1100C (see FIG. 16) of the step-up and step-down converter 1100 are provided, the reactor 1101, and the cooling pipe 1066*a* are built in the step-up and step-down converter unit 1066. The IPM 1103 is mounted on a wiring substrate 1104. The cooling pipe 1066a is disposed in a two-dimensional shape along the side surface of the step-up and step-down converter unit 1066. Specifically, the cooling pipe 1066a is housed in a metal container 1066b, which has a rectangular section, in a state being bent several times so that it can be provided as long as possible within the step-up and step-down converter unit 1066. In addition, the cooling pipe 1066a is in contact with the inside surface of the metal container 1066b. As shown in FIG. 25A, the reactor 1101 and the IPM 1103 are disposed so as to be in contact with the outside surface of the metal container 1066b, and the metal container 1066b transmits the heat from the reactor 1101 and the IPM 1103 to the cooling pipe 1066a. Accordingly, the reactor 1101 and IPM 1103 are cooled. In addition, it is preferable that a temperature sensor 1107 for detecting the temperature of the reactor 1101 is provided in the reactor 1101.

Figure 26:
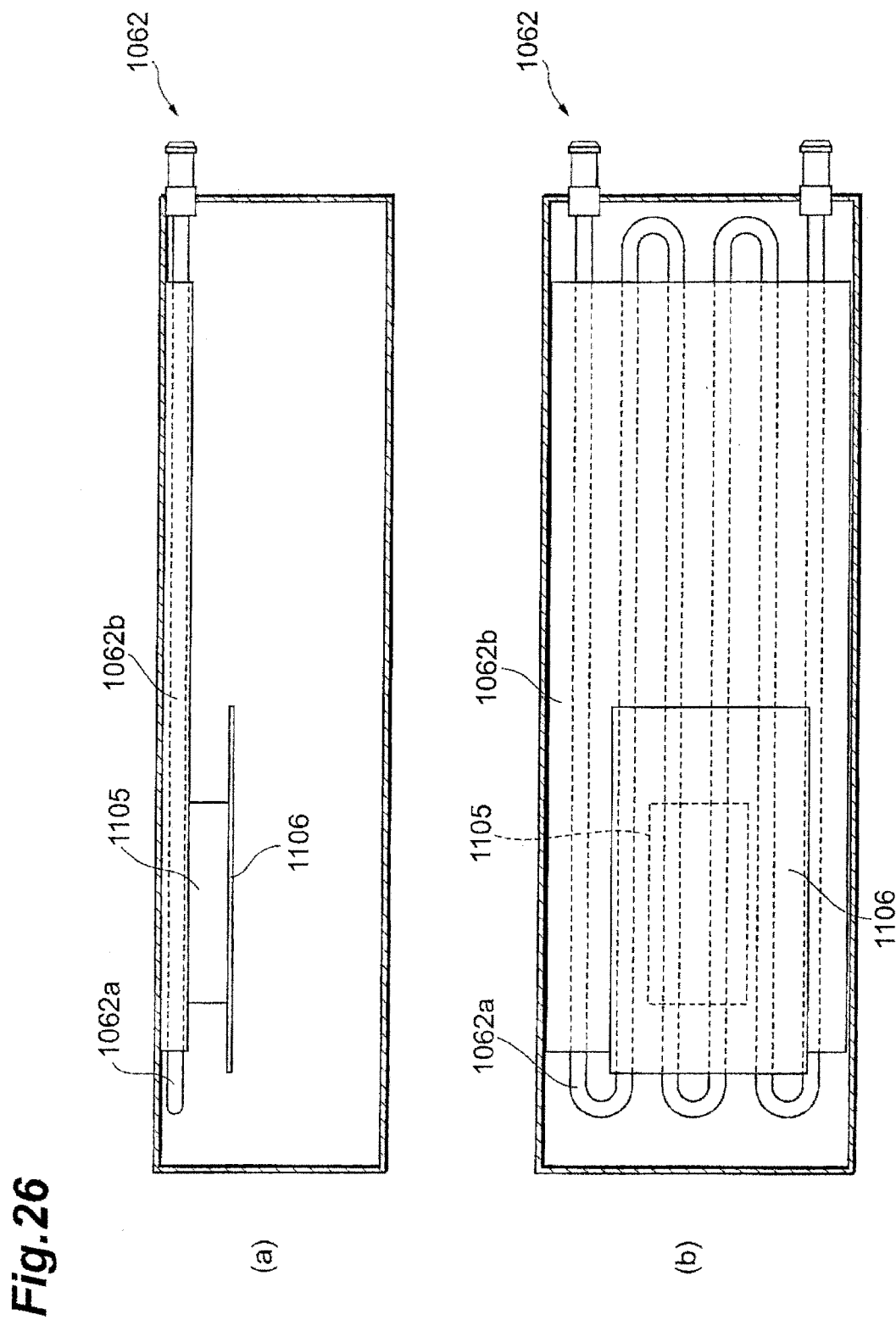
FIG. 26A is a plan view showing the internal configuration of an inverter unit.
FIG. 26B is a side view showing the internal configuration of an inverter unit.

FIG. 26A is a plan view showing the internal configuration of the inverter unit 1062. In addition, FIG. 26B is a side view showing the internal configuration of the inverter unit 1062. Moreover, similar to FIGS. 25A and 25B, FIGS. 26A and 26B also show states where a top plate or a side plate of the case is removed so that the internal configuration of the inverter unit 1062 can be understood. In addition, the internal configurations of the inverter units 1063 to 1065 are the same as the internal configuration of the inverter unit 1062 shown in FIG. 26 except for the configuration of a built-in inverter circuit.

An IPM 1105, in which a transistor of an inverter circuit is provided, and the cooling pipe 1062a are built in the inverter unit 1062. The IPM 1105 is mounted on a wiring substrate 1106. The cooling pipe 1062a is disposed in the same form as the cooling pipe 1066a in the step-up and step-down converter unit 1066. The cooling pipe 1062a is housed in a metal container 1062b with a rectangular section and is in contact with the internal surface of the metal container 1062b. As shown in FIG. 26A, the IPM 1105 is disposed so as to be in contact with the outside surface of the metal container 1062b, and the metal container 1062b transmits the heat from the IPM 1105 to the cooling pipe 1062a.

Figure 27:
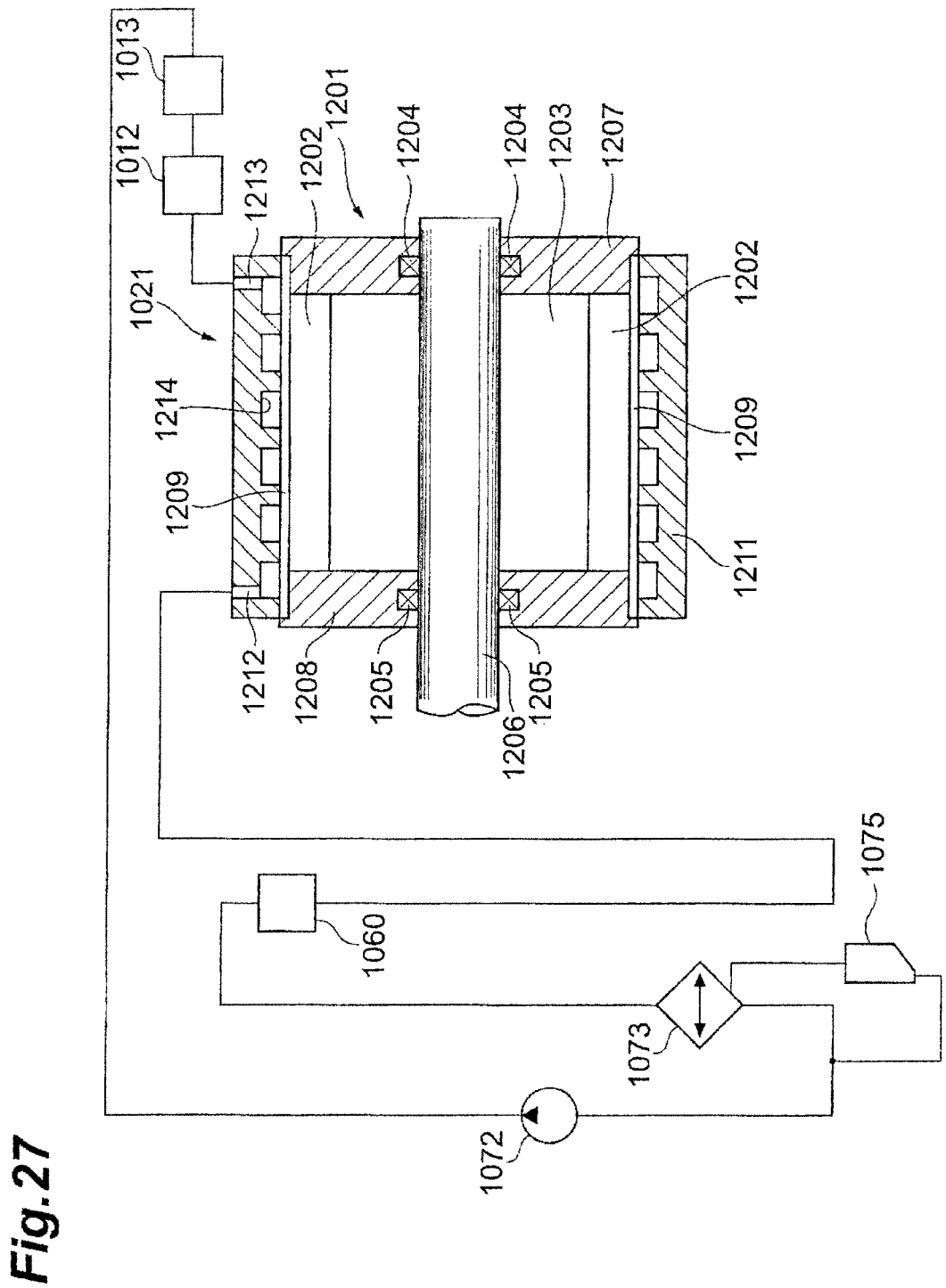
FIG. 27 is a view for explaining a cooling method of an electric motor for rotation using a coolant circulation system.

FIG. 27 is a view for explaining a cooling method of the electric motor 1021 for rotation using the coolant circulation system 1070. In addition, since a cooling method in the motor generator 1012 is the same as the method in the electric motor 1021 for rotation, only a cooling method in the electric motor 1021 for rotation will be representatively described herein.

As shown in FIG. 27, the electric motor 1021 for rotation includes a driving unit case 1201, a stator 1202 fixed to the driving unit case 1201, a rotor 1203 which is rotatably provided in the inside of a diameter direction of the stator 1202, and an output shaft 1206 which extends to pass through the rotor 1203 and which is provided so as to be rotatable with respect to the driving unit case 1201 by bearings 1204 and 1205. The driving unit case 1201 is formed by side plates 1207 and 1208 and a cylindrical motor frame 1209 which is fixed between the side plates 1207 and 1208 and which extends axially. The bearing 1204 is fixed to the side plate 1207, the bearing 1205 is fixed to the side plate 1208, and the stator 1202 is fixed to the motor frame 1209.

The stator 1202 has a coil (not shown). If a predetermined current is supplied to the coil, the electric motor 1021 for rotation is driven and the rotor 1203 rotates at the rotation speed corresponding to the size of a current. Then, the rotation of the rotor 1203 is transmitted to the output shaft 1206 to which the rotor 1203 is fixed.

In order to cool the electric motor 1021 for rotation by radiating the heat generated by driving of the electric motor 1021 for rotation, a jacket 1211 is fixed to the outer periphery of the driving unit case 1201. The jacket 1211 includes: a coolant supply port 1212 to which the coolant is supplied; a coolant discharge port 1213 from which the coolant with a high temperature after cooling the electric motor 1021 for rotation is discharged; and one coolant flow passage 1214 which connects the coolant supply port 1212 and the coolant discharge port 1213 with each other and which extends in a spiral shape or in a meandering shape. The coolant supplied from the pump 1072 to the coolant supply port 1212 through the radiator 1073 and the servo control unit 1060 flows through the coolant flow passage 1214 while meandering so that the electric motor 1021 for rotation is cooled in the meantime and is then discharged from the coolant discharge port 1213. In the coolant circulation system, it is preferable to provide an auxiliary tank 1075 for supplementing the coolant as shown in FIG. 27.

Here, a discharge mode of the controller 1030 will be further described. As described above, the discharge mode is an operation mode for discharging electric power stored in the battery 1019 and is also a mode in which the battery 1019 is discharged by stopping all of the inverter circuits 1018A, 1020A, and 1020B while making the pump motor 1071 consume electric power by driving the inverter circuit 1020C.

Figure 28:
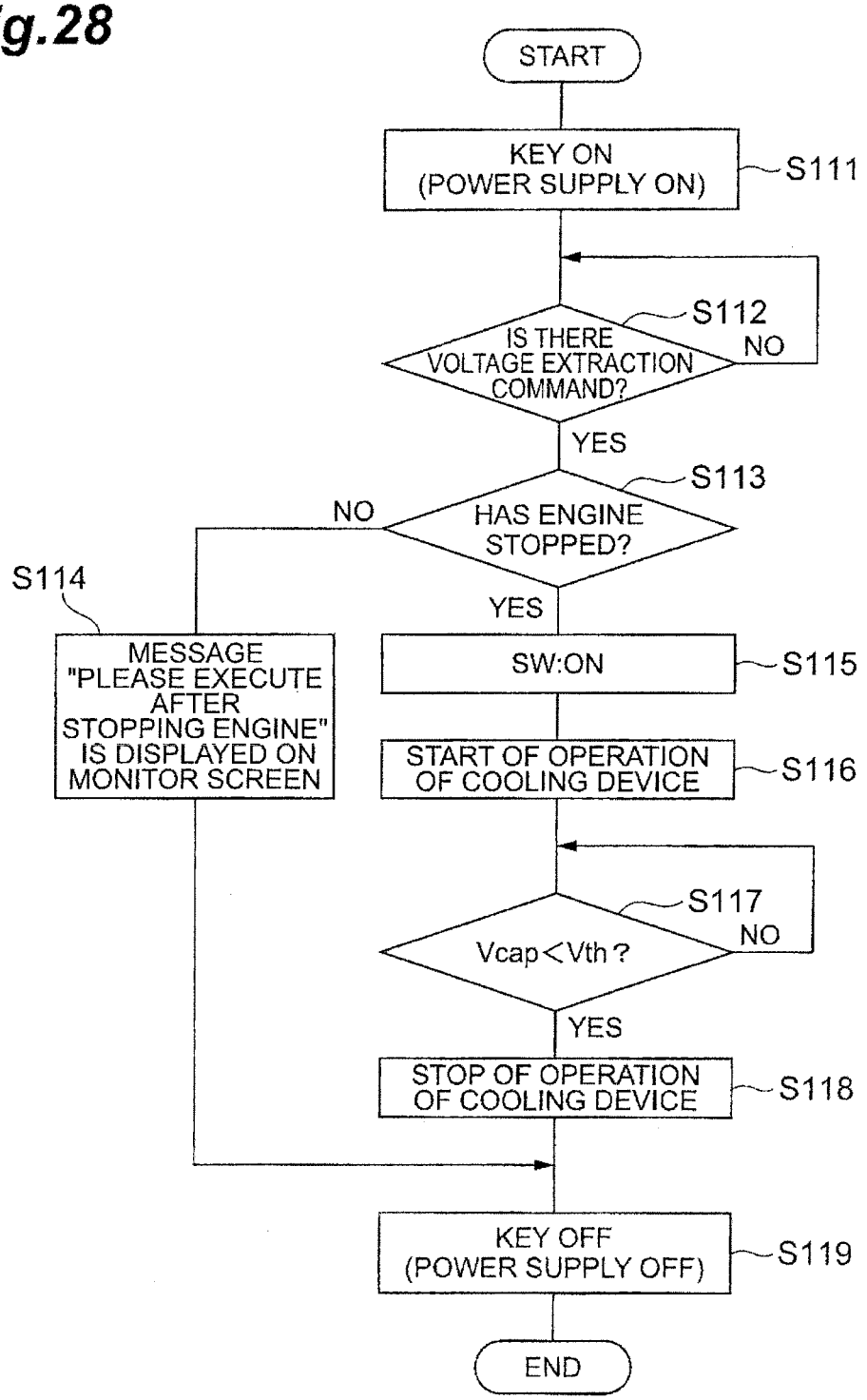
FIG. 28 is a flow chart showing the operation of a hybrid type construction machine in a discharge mode.

FIG. 28 is a flow chart showing the operation of the hybrid type construction machine 1001 in the discharge mode. First, an ignition key is operated by an operator so that the hybrid type construction machine 1001 is turned on (step S111). When the input of a discharge mode by the operator is made on the operation panel in this state (step S112: Yes), the controller 1030 checks whether or not the engine 1011 has stopped (step S113). When the engine 1011 has not stopped (step S113: No), it is displayed on the monitor screen in the operator's cabin 1004a (see FIG. 14) to execute a discharge mode after the engine is stopped (step S114). On the other hand, when the engine 1011 has stopped (step S113: Yes), the controller 1030 sets the switch 1100E (see FIG. 16) between the step-up and step-down converter 1100 and the battery 1019 to an electrically conductive state (step S115) and drives the inverter circuit 1020 to operate the pump motor 1071 (step S116). As a result, electric power stored in the battery 1019 is supplied to the pump motor 1071 through the DC bus 1110 and is consumed in the pump motor 1071. In this case, the controller 1030 does not drive the inverter circuits 1018A, 1020A, and 1020B. Accordingly, electric power is not supplied to the motor generator 1012, the electric motor 1021 for rotation, and the lifting magnet 1007. This discharging operation is continued until a voltage Vcap between both ends of the battery 1019 becomes less than a predetermined threshold value Vth (step S117). In this case, the value of the voltage Vcap between both ends of the battery 1019 is detected by the voltage sensor 1100F (see FIG. 16).

Figure 29:
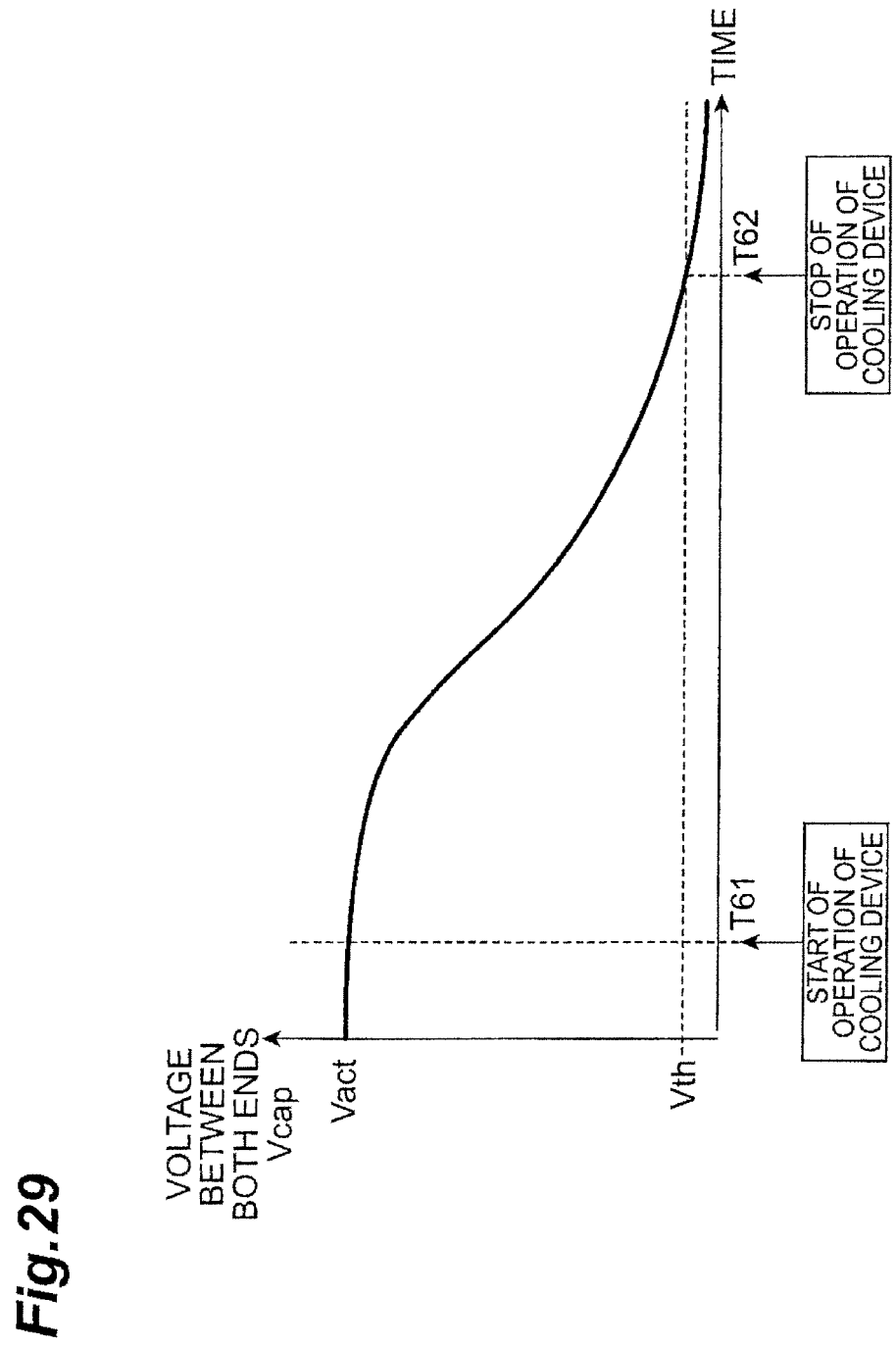
FIG. 29 is a graph showing an example of transition of the voltage between both ends of a battery in a discharge mode.

FIG. 29 is a graph showing an example of transition of the voltage between both ends of the battery 1019 in the discharge mode. If driving of the pump motor 1071 starts (time T61 in FIG. 29), the voltage Vcap between both ends of the battery 1019 is gradually decreased from the last voltage Vact. The decrease rate depends on the power consumption of a pump motor. For example, when the rated power of the pump motor 1071 is 0.6 kW and the state of charge (SOC) is 85%, the time taken for discharge (that is, the time from time T61 to time T62 at which the voltage Vcap between both ends of the battery 1019 becomes less than the threshold value Vth) is about 30 minutes.

FIG. 28 is referred to again. If the voltage Vcap between both ends of the battery 1019 becomes less than the threshold value Vth (step S117: Yes), the controller 1030 ends the operation of the pump motor 1071 by stopping the driving of the inverter circuit 1020C (step S118). Then, the ignition key is operated again by the operator so that the hybrid type construction machine 1001 is turned off (step S119).

The effects obtained by the hybrid type construction machine 1001 of the present example will be described. As described above, the hybrid type construction machine 1001 includes the coolant circulation system 1070 for cooling the inverter units 1062 to 1065 and the step-up and step-down converter unit 1066, and the pump motor 1071 for driving the coolant circulation system 1070 is driven by discharged electric power from the battery 1019 in the discharge mode in the maintenance or the like. Unlike electric motors for operation, such as the motor generator 1012 for driving a hydraulic pump or the electric motor 1021 for rotation which drives an operating element called the revolving body 1004, the pump motor 1071 does not give a driving force to a movable section, an operating element, and the like. Even if the pump motor 1071 is driven, the coolant only circulates through the pipe. Therefore, according to the hybrid type construction machine 1001 of the present example, the voltage Vcap between both ends of the battery 1019 can be reduced without giving a driving force to an operating element and the like. Eventually, if only the battery 1019, the inverter circuit 1020C, and the pump motor 1071 can be operated, the voltage Vcap between both ends of the battery 1019 can be safely reduced even if other inverter circuits or operating elements break down.

In addition, when the step-up and step-down converter 1100 uses a step-up and step-down type switching control method in the hybrid type construction machine 1001 of the present example, the controller 1030 can discharge the battery 1019 even if the transistors 1100B and 1100C of the step-up and step-down converter 1100 are not driven in the discharge mode. Usually, in such a step-up and step-down converter 1100, a step-up operation is performed when charging the battery 1019 and a step-down operation is performed when discharging the battery 1019. However, the step-up and step-down converter 1100 may be out of order in the maintenance. Therefore, by applying the voltage Vcap almost as it is between both ends of the battery 1019 to the pump motor 1071 through the diodes 1100b and 1100c connected in parallel to the transistors 1100B and 1100C without driving the transistors 1100B and 1100C like the present example, the voltage Vcap between both ends of the battery 1019 can be safely reduced without operating the step-up and step-down converter 1100.

In addition, the hybrid type construction machine 1001 of the present example includes the engine 1011, the motor generator 1012 which assists the engine 1011, and the inverter circuit 1018A. In such a case, it is preferable that the controller 1030 stops the inverter circuit 1018A in the discharge mode like the present example. Then, the voltage Vcap between both ends of the battery 1019 can be safely reduced without giving oil pressure to movable sections, such as the boom 1005 and the arm 1006.

Figure 30:
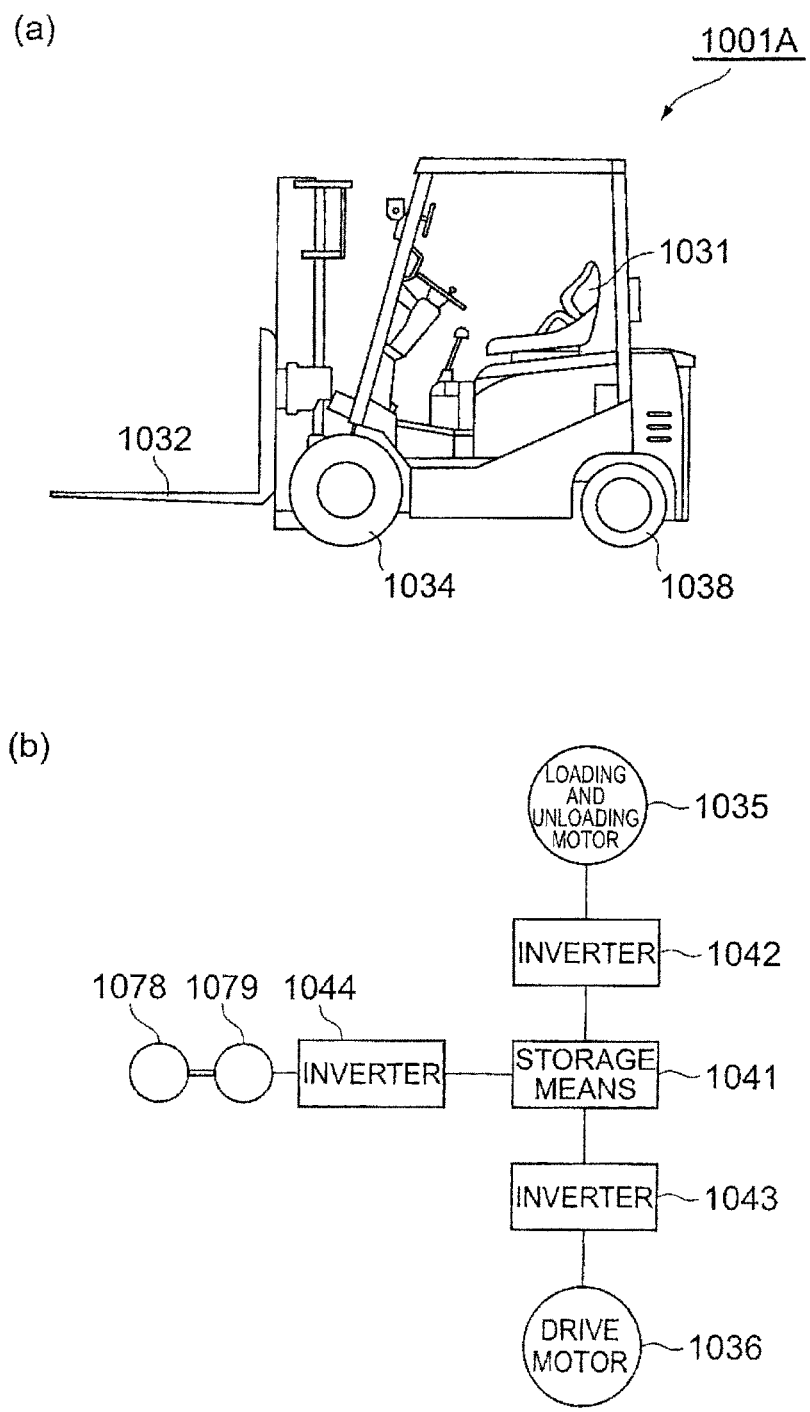
FIG. 30A is a view showing the appearance of a forklift as a working machine.
FIG. 30B is a view showing the schematic configuration of an electrical system provided in the forklift.

Next, an example will be described in which the present invention is applied to other working machines. FIG. 30A is a view showing the appearance of a forklift 1001A as a working machine. As shown in FIG. 30A, the forklift 1001A is a so-called counter-type forklift configured such that the vehicle body is balanced by attaching a weight to the rear part of the vehicle body.

The forklift 1001A includes a driver's seat 1031 for a driver to sit down, a fork 1032, wheels 1034 and 1038, and the like. The fork 1032 is for lifting goods up and down, and the fork 1032 is provided in front of the driver's seat 1031. Two wheels 1034 are disposed in front of the driver's seat 1031 and two wheels 1038 are disposed behind the driver's seat 1031. The wheels 1038 disposed behind the driver's seat 1031 are wheels for steering. On the other hand, the wheels 1034 disposed in front of the driver's seat 1031 are driving wheels.

FIG. 30B is a view showing the schematic configuration of an electrical system provided in the forklift 1001A. The forklift 1001A has inverter circuits 1042 and 1043, and the inverter circuits 1042 and 1043 are driven by DC power from a storage section 1041. The inverter circuit 1042 converts the DC power into AC power to drive a loading and unloading motor 1035. On the other hand, the inverter circuit 1043 drives a drive motor 1036. The loading and unloading motor 1035 is an electric motor for operation for moving the fork 1032 up and down, and the drive motor 1036 is an electric motor for operation for driving the wheels 1034. The inverter circuits 1042 and 1043 are driven by a controller (not shown). In addition, the configurations of the storage section 1041, an inverter unit in which the inverter circuits 1042 and 1043 are provided, and a control unit in which a controller is provided may be the same as those of the storage section 1120, the inverter units 1062 to 1065, and the control unit 1600.

In addition, the forklift 1001A has a coolant circulation system for cooling the inverter circuits 1042 and 1043 and a step-up and step-down converter of the storage section 1041. That is, the forklift 1001A includes a pump 1078 which circulates the coolant, a pump motor (electric motor for cooling) 1079 which drives the pump 1078, and an inverter circuit 1044 connected between the pump motor 1079 and the storage section 1041. The inverter circuit 1044 is driven by a controller (not shown) like the inverter circuits 1042 and 1043.

In addition, the controller has a discharge mode for discharging electric power stored in the battery of the storage section 1041. In this discharge mode, the controller discharges the battery by stopping the inverter circuits 1042 and 1043 while making the pump motor 1079 consume electric power by driving the inverter circuit 1044.

As described above, in the sixth example, the state of charge of a battery can be reduced by a mechanism including an electric motor used in the normal operation. Accordingly, the life of a battery can be increased without adding a new mechanism for reducing the state of charge.

While the working machines of the illustrative examples of the present invention have been described, the present invention is not limited to the examples specifically described but various modifications and changes may also be made without departing from the scope of the appended claims. For example, although the lifting magnet vehicle and the forklift are exemplified as working machines in the above examples, the present invention may also be applied to other working machines (for example, a shovel, a wheel loader, and a crane).

It is also possible to adopt a working machine including a cooling device that has a fan for cooling a battery, a fan motor for driving the fan, and an inverter circuit connected to the fan motor. In this case, the battery may be discharged by driving the inverter circuit connected to the fan motor so that the fan motor can perform electric operation in a discharge mode.

INDUSTRIAL APPLICABILITY

The present invention may be applied to working machines, such as a hybrid type construction machine.

REFERENCE SIGNS LIST

1: base carrier
1A, 1B: hydraulic motor
2: revolving mechanism
3: upper revolving body 4: boom
5: arm
6: lifting magnet
7: boom cylinder
8: arm cylinder
9: bucket cylinder
10: cabin
11: engine
12: motor generator
13: decelerator
14: main pump
15: pilot pump
16: high-pressure hydraulic line
17: control valve
18: inverter
19: capacitor
20: inverter
21: electric motor for rotation
22: resolver
23: mechanical brake
24: rotation speed reduction mechanism
25: pilot line
26: operating device
27, 28: hydraulic line
29: pressure sensor
30: step-up and step-down converter
31: capacitor voltage detecting section
32: capacitor current detecting section
40: DC bus
41: DC bus voltage detecting section
50: controller
60: gate lock operating section
10A: driver's seat
10B: console
60A: gate lock lever
60B: gate
60C: limit switch
1001: hybrid type construction machine
1002: traveling mechanism
1003: rotary mechanism
1004: revolving body
1004a: operator's cabin
1005: boom
1006: arm
1007: lifting magnet
1011: engine
1012: motor generator
1014: main pump
1018A, 1020A~1020C: inverter circuit
1019: battery
1021: electric motor for rotation
1024: rotation speed reduction mechanism
1026: operating device
1027, 1028: hydraulic line
1029: pressure sensor
1030: controller
1060: servo control unit
1062~1065: inverter unit
1062a~1066a: cooling pipe
1066: step-up and step-down converter unit
1068: heat sink
1070: coolant circulation system
1071: pump motor
1072: pump
1073: radiator
1075: auxiliary tank
1077: temperature sensor
1100: step-up and step-down converter
1100B, 1100C: transistor
1100E: switch
1100F: voltage sensor
1101: reactor
1110: DC bus
1120: storage section
600: control unit
601: housing
602: card plate
1603: heat sink
1604: control card
1608: cooling pipe

The invention claimed is:

1. A working machine comprising:
an operating element;
a first electric motor used for work;
a second electric motor used for applications other than work;
a first inverter circuit connected to the first electric motor;
a second inverter circuit connected to the second electric motor;
an electrical energy storage device connected to the first and second inverter circuits; and
a control unit that drives the first and second inverter circuits so as to control a state of charge of the electrical energy storage device,
wherein the control unit is configured to set a predetermined first state of charge for driving the operating element and a predetermined second state of charge lower than the first state of charge as targets for controlling the state of charge of the electrical energy storage device,
wherein the control unit has a discharge mode to discharge electric power stored in the electrical energy storage device, and
wherein the control unit discharges the electrical energy storage device so as to reduce to the predetermined second state of charge by stopping the first inverter circuit while driving the second inverter circuit in order to make the second electric motor perform electric operation in the discharge mode when the operating element is not driven.

2. The working machine according to claim 1, wherein
the first electric motor is an electric motor for operation driven by operation of an operator,
one end of the first inverter circuit is connected to a terminal of the electric motor for operation,
the electrical energy storage device is connected to the other end of the first inverter circuit through a DC voltage converter,
a coolant circulation system, which is provided to cool the first inverter circuit and the DC voltage converter and which includes a pump to circulate coolant and an electric motor to cool as the second electric motor that drives the pump, is further provided,
the second inverter circuit is connected between the electric motor to cool and the DC voltage converter,
the control unit drives the first and second inverter circuits and the DC voltage converter, and
the control unit discharges the electrical energy storage device by stopping the first inverter circuit while driving the second inverter circuit in order to make the electric motor to cool consume electric power in the discharge mode.

3. The working machine according to claim 2, wherein
the DC voltage converter has a step-up and step-down type switching control system including switching elements for step-up and step-down and a diode connected in parallel to each of the switching elements, and the control unit does not drive the switching elements in the discharge mode.

4. The working machine according to claim 2, further comprising:

an internal combustion engine;

a motor generator which is connected to the internal combustion engine and which generates electric power with a driving force of the internal combustion engine and assists a driving force of the internal combustion engine with its own driving force; and a third inverter circuit connected between the motor generator and the DC voltage converter, wherein the control unit stops the third inverter circuit in the discharge mode.

5. The working machine according to claim 2, wherein the coolant circulation system further cools the electric motor for operation.

6. The working machine according to claim 1, wherein the second electric motor is a motor generator to assist an engine, the electrical energy storage device performs supplying of electric power to the motor generator or charging of regenerative power, the second inverter circuit performs driving control of the motor generator, the control unit includes a driving level determining section that determines a driving level of the engine or the operating element, and the second inverter circuit performs electric operation of the motor generator when the driving level determining section determines that the driving level of the engine or the operating element is equal to or lower than a predetermined level.

7. The working machine according to claim 6, wherein the second inverter circuit performs electric driving of the motor generator so that a state of charge of the electrical energy storage device is maintained at a predetermined level or higher.

8. The working machine according to claim 6, wherein the driving level determining section is configured to determine the driving level of the engine on the basis of an operating state of the operating element, determine the driving level of the engine according to the number of revolutions of the engine, determine the driving level of the operating element according to the amount of operation input to an operating device of the operating element, determine the driving level of the engine or the operating element according to an operating state of a gate lock lever to prohibit a driver from leaving a driver's seat, or determine the driving level of the engine or the operating element according to an operation position of an ignition switch.

9. The working machine according to claim 1, wherein a plurality of operating elements including a motor generator to assist an engine and a capacitor, which performs supplying of electric power to the motor generator or charging of regenerative power, is driven by an electromotive force or a hydraulic force, a driving control section, which performs driving control of the motor generator, and a driving level determining section, which determines a driving level of the engine or the operating element, are provided, and the driving control section performs electric operation of the motor generator when the driving level determining section determines that the driving level of the engine or the operating element is equal to or lower than a predetermined level.

10. The working machine according to claim 9, wherein the driving control section performs electric driving of the motor generator using electric power stored in the capacitor.

11. The working machine according to claim 10, wherein the driving control section performs electric driving of the motor generator so that a state of charge of the capacitor is maintained at a predetermined level or higher.

12. The working machine according to claim 9, wherein the driving level determining section is configured to determine the driving level of the engine on the basis of an operating state of the operating element, and the driving control section performs electric operation of the motor generator when the driving level determining section determines that the driving level of the engine is equal to or lower than a predetermined level on the basis of the operating state of the operating element.

13. The working machine according to claim 9, wherein the driving level determining section is configured to determine the driving level of the engine according to the number of revolutions of the engine, and the driving control section performs electric operation of the motor generator when the driving level determining section determines that the driving level of the engine is equal to or lower than a predetermined level on the basis of the number of revolutions of the engine.

14. The working machine according to claim 9, wherein the driving level determining section is configured to determine the driving level of the operating element according to the amount of operation input to an operating device of the operating element, and the driving control section performs electric operation of the motor generator when the driving level determining section determines that the driving level of the operating element is equal to or lower than a predetermined level on the basis of the amount of operation input to the operating device of the operating element.

15. The working machine according to claim 9, wherein the driving level determining section is configured to determine the driving level of the engine or the operating element according to an operating state of a gate lock lever to prohibit a driver from leaving a driver's seat, and the driving control section performs electric operation of the motor generator when the driving level determining section determines that the driving level of the engine or the operating element is equal to or lower than a predetermined level on the basis of the operating state of the gate lock lever.

16. The working machine according to claim 9, wherein the driving level determining section is configured to determine the driving level of the engine or the operating element according to an operation position of an ignition switch, and the driving control section performs electric operation of the motor generator when the driving level determining section determines that the driving level of the engine or the operating element is equal to or lower than a predetermined level on the basis of the operation position of the ignition switch.

17. A working machine comprising:

an operating element:

an electric motor used for applications other than work;

an inverter circuit connected to the electric motor;

an electrical energy storage device connected to the inverter circuit; and a control unit that drives the inverter circuit so as to control a state of charge of the electrical energy storage device, wherein the control unit is configured to set a predetermined first state of charge for driving the operating element and a predetermined second state of charge lower than the first state of charge as targets for controlling the state of charge of the electrical energy storage device, wherein the control unit has a discharge mode to discharge electric power stored in the electrical energy storage device, and wherein the control unit discharges the electrical energy storage device so to reduce to the predetermined second state of charge by driving the inverter circuit in order to make the electric motor perform electric operation in the discharge mode when the operating element is not driven.

18. The working machine according to claim 17, further comprising:

a pump connected to the electric motor.

19. The working machine according to claim 18, wherein the electric motor is a motor generator to assist an engine, and wherein the control unit determines the discharge mode when a driving level of the engine is equal to or lower than a predetermined level and performs electric operation of the motor generator when the discharge mode is determined.

20. The working machine according to claim 18, wherein the pump is a pump for circulating a coolant, and wherein the control unit performs electric operation of the electric motor in the discharge mode.

* * * * *